(12) United States Patent
Ogawa et al.

(10) Patent No.: US 10,795,260 B2
(45) Date of Patent: Oct. 6, 2020

(54) CURABLE COMPOSITION, METHOD FOR PRODUCING CURED FILM, COLOR FILTER, LIGHT-SHIELDING FILM, SOLID-STATE IMAGING ELEMENT, AND IMAGE DISPLAY DEVICE

(71) Applicant: FUJIFILM Corporation, Tokyo (JP)

(72) Inventors: Michihiro Ogawa, Haibara-gun (JP); Hideki Takakuwa, Haibara-gun (JP); Hisamitsu Tomeba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 317 days.

(21) Appl. No.: 15/906,778

(22) Filed: Feb. 27, 2018

(65) Prior Publication Data

US 2018/0188650 A1 Jul. 5, 2018

Related U.S. Application Data

(63) Continuation of application No. PCT/JP2016/074682, filed on Aug. 24, 2016.

(30) Foreign Application Priority Data

Aug. 31, 2015 (JP) .................................. 2015-171593

(51) Int. Cl.
*H01L 27/14* (2006.01)
*H04N 5/335* (2011.01)
(Continued)

(52) U.S. Cl.
CPC ................ *G03F 7/033* (2013.01); *C08F 2/44* (2013.01); *C08F 8/30* (2013.01); *C08F 220/22* (2013.01); *C08F 220/28* (2013.01); *C08F 290/061* (2013.01); *C08L 51/08* (2013.01); *C09D 4/06* (2013.01); *C09D 133/16* (2013.01); *G02B 1/04* (2013.01); *G02B 5/003* (2013.01); *G02B 5/223* (2013.01); *G03F 7/0007* (2013.01); *G03F 7/0046* (2013.01); *G03F 7/031* (2013.01); *G03F 7/0388* (2013.01); *G03F 7/105* (2013.01); *G03F 7/162* (2013.01); *G03F 7/20* (2013.01);
(Continued)

(58) Field of Classification Search
CPC ...... G03F 7/0007; G03F 7/033; G03F 7/0388; G03F 7/046; G03F 7/105; H01L 27/14; H01L 27/14645; H01L 27/14818; H01L 27/14623; H01L 27/14625; C08F 220/22; C08F 220/24; C08F 265/06; C08D 133/16; C08D 4/06; G02B 5/003; G02B 5/20; G02B 5/233; G02B 5/223; C09D 133/16; C09D 4/06
USPC ................ 430/7, 281.1, 287.1; 257/435, 440
See application file for complete search history.

(56) References Cited

U.S. PATENT DOCUMENTS

2010/0035166 A1* 2/2010 Ishizeki ................ G03F 7/0007
430/7

FOREIGN PATENT DOCUMENTS

JP 08-120597 A 5/1996
JP 2009-093153 A 4/2009
(Continued)

OTHER PUBLICATIONS

Computer-generated translation of JP 2009-244729 (Oct. 2009) (Year: 2009).*

(Continued)

*Primary Examiner* — John A McPherson
(74) *Attorney, Agent, or Firm* — Sughrue Mion, PLLC

(57) ABSTRACT

An object of the present invention is to provide a curable composition satisfying both of excellent low reflectivity and excellent developability, a method for producing a cured film, an infrared color filter provided with a light-shielding film, and a solid-state imaging device.

The curable composition of the present invention includes a fluorine-containing polymer including a repeating unit represented by Formula (A) and a repeating unit represented by Formula (B), a polymerizable compound, and a coloring agent.

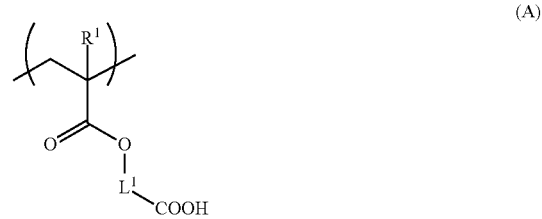

(A)

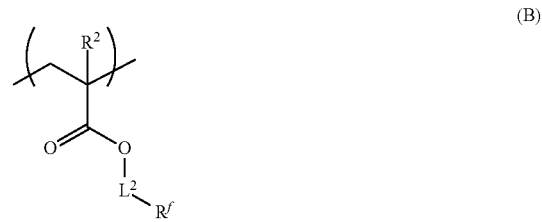

(B)

In Formula (A), $R^1$ represents a hydrogen atom or an alkyl group, and $L^1$ represents a divalent chained linking group having 3 or more carbon atoms in total, which may include an ester bond.
In Formula (B), $R^2$ represents a hydrogen atom or an alkyl group, $L^2$ represents a single bond or a divalent linking group, and $R^f$ represents a monovalent organic group including an fluorine atom.

23 Claims, 6 Drawing Sheets

(51) Int. Cl.
| | |
|---|---|
| *C07C 21/18* | (2006.01) |
| *G03F 7/033* | (2006.01) |
| *H01L 27/146* | (2006.01) |
| *C09D 4/06* | (2006.01) |
| *C08F 8/30* | (2006.01) |
| *G03F 7/105* | (2006.01) |
| *G02B 5/00* | (2006.01) |
| *G03F 7/004* | (2006.01) |
| *C08F 2/44* | (2006.01) |
| *C08L 51/08* | (2006.01) |
| *C08F 290/06* | (2006.01) |
| *G02B 5/22* | (2006.01) |
| *G03F 7/038* | (2006.01) |
| *C08F 220/22* | (2006.01) |
| *C08F 220/28* | (2006.01) |
| *C09D 133/16* | (2006.01) |
| *G02B 1/04* | (2006.01) |
| *G03F 7/00* | (2006.01) |
| *G03F 7/031* | (2006.01) |
| *G03F 7/16* | (2006.01) |
| *G03F 7/20* | (2006.01) |
| *G03F 7/32* | (2006.01) |
| *H01L 27/148* | (2006.01) |
| *C08F 2/06* | (2006.01) |

(52) U.S. Cl.
CPC .............. *G03F 7/322* (2013.01); *H01L 27/14* (2013.01); *H01L 27/14623* (2013.01); *H01L 27/14625* (2013.01); *H01L 27/14645* (2013.01); *H01L 27/14818* (2013.01); *C08F 2/06* (2013.01); *C08F 220/283* (2020.02)

(56) References Cited

FOREIGN PATENT DOCUMENTS

| | | |
|---|---|---|
| JP | 2009-244729 A | 10/2009 |
| JP | 2009-271444 A | 11/2009 |
| JP | 2010-018653 A | 1/2010 |
| KR | 10-2008-0070809 A | 7/2008 |
| TW | 200922949 A | 6/2009 |
| TW | 201341961 A | 10/2013 |
| WO | 2007/058355 A1 | 5/2007 |
| WO | 2016/121194 A1 | 8/2016 |

OTHER PUBLICATIONS

Computer-generated translation of JP 2009-093153 (Apr. 2009) (Year: 2009).*
International Search Report for PCT/JP2016/074682 dated Nov. 22, 2016 [PCT/ISA/210].
Written Opinion dated Nov. 22, 2016, issued by the International Bureau in counterpart Application No. PCT/JP2016/074682.
International Preliminary Report on Patentability issued from the International Bureau in counterpart International Application No. PCT/JP2016/074682, dated on Mar. 6, 2018.
Communication of Reason for Refusal dated May 7, 2019, from the Japanese Patent Office in counterpart Application No. 2017-537784.
Communication dated Jul. 1, 2019, issued by the Korean Intellectual Property Office in corresponding Korean Application No. 10-2018-7005706.
Communication dated Jan. 17, 2019 from the Korean Intellectual Property Office in counterpart Application No. 10-2018-7005706.
Office Action dated Jan. 7, 2020 in Taiwanese Application No. 105127756.

\* cited by examiner

CURABLE COMPOSITION, METHOD FOR PRODUCING CURED FILM, COLOR FILTER, LIGHT-SHIELDING FILM, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2016/074682 filed on Aug. 24, 2016, which claims priority under 35 U.S.C. § 119(a) to Japanese Patent Application No. 2015-171593 filed on Aug. 31, 2015. The above application is hereby expressly incorporated by reference, in its entirety, into the present application.

BACKGROUND OF THE INVENTION

1. Field of the Invention

The present invention relates to a curable composition, a method for producing a cured film, a color filter, a light-shielding film, a solid-state imaging element, and an image display device.

2. Description of the Related Art

A solid-state imaging device includes a taking lens, a solid-state imaging element such as a charge coupled device (CCD) and a complementary metal oxide film semiconductor (CMOS), disposed behind the taking lens, and a circuit board on which the solid-state imaging element is mounted. This solid-state imaging device is loaded in, for example, a digital camera, a mobile phone with a camera, and a smartphone.

In the solid-state imaging device, noise by reflection of visible light may be generated in some cases. Accordingly, in JP2009-244729A, it has been facilitated to inhibit the generation of noise by providing a predetermined light-shielding film in the solid-state imaging device. As a composition for forming a light-shielding film, a photosensitive resin composition including a black pigment such as titanium black is used.

SUMMARY OF THE INVENTION

On the other hand, the light-shielding film has recently been required to satisfy various demands.

For example, as the solid-state imaging device becomes smaller, thinner, and more sensitive, the light-shielding film is required to have even lower reflectivity. In particular, in a case where a light-shielding film with low reflectivity as described above can be formed by a coating method such as a spin coating method, which is excellent in productivity, it is preferable from an industrial viewpoint.

The present inventors have produced and have studied a light-shielding film using the photosensitive resin composition which is specifically disclosed in JP2009-244729A, and as a result, they have discovered that the photosensitive resin composition has excellent low reflectivity, but were required to be further improved in terms of developability.

With regard to the reasons therefor, a layer structure of a coating film formed on a substrate by spin coating using the photosensitive resin composition of JP2009-244729A is considered as one of the reason. A fluorine-containing polymer contained in the composition has low surface free energy, and as a result, it is thought that the fluorine-containing polymer is unevenly distributed on the surface on the side opposite to the substrate in the coating film. That is, it is thought that the coating film has a high-refractive-index layer having a high concentration of a black pigment on the side of the substrate, and takes a structure having a low-refractive-index layer due to the fluorine-containing polymer on the upper layer. That is, the low reflectivity is excellent due to such the configuration, but it is presumed that a developer is repelled on the low-refractive-index layer including a hydrophobic fluorine atom during alkali development, and as a result, development does not proceed well.

Taking the circumstances into consideration, an object of the present invention is to provide a curable composition capable of forming a cured film exhibiting excellent developability as well as excellent low reflectivity.

In addition, another object of the present invention is to provide a method for producing a cured film, using the curable composition, a color filter and a light-shielding film, each formed by curing the curable composition, and a solid-state imaging element and an image display device, each having a cured film formed by curing the curable composition.

The present inventors have conducted extensive studies in order to achieve the objects, and have thus found that the objects can be achieved by using a curable composition including a fluorine-containing polymer with a specific structure, thereby completing the present invention.

That is, the present inventors have found that the objects can be achieved by the following configuration.

(1) A curable composition comprising:
a fluorine-containing polymer including a repeating unit represented by Formula (A) which will be described later and a repeating unit represented by Formula (B) which will be described later;
a polymerizable compound; and
a coloring agent.

(2) A curable composition comprising:
a fluorine-containing polymer including a repeating unit represented by Formula (A) which will be described later, a repeating unit represented by Formula (B) which will be described later, and a repeating unit having a polymerizable group on a side chain; and
a coloring agent.

(3) The curable composition as described in (2), comprising:
a fluorine-containing polymer including a repeating unit represented by Formula (A) which will be described later, a repeating unit represented by Formula (B) which will be described later, and a repeating unit represented by Formula (C) which will be described later; and
a coloring agent.

(4) The curable composition as described in any one of (1) to (3), in which the acid value of the fluorine-containing polymer is 70 to 150 mgKOH/g.

(5) The curable composition as described in any one of (1) to (4), in which the content of the fluorine-containing polymer is 1% to 20% by mass with respect to the total solid content of the curable composition.

(6) The curable composition as described in any one of (1) to (5), in which in the fluorine-containing polymer, $R^f$ is a monovalent organic group having 1 to 3 carbon atoms in total, substituted with a fluorine atom.

(7) The curable composition as described in any one of (1) to (6), in which the weight-average molecular weight of the fluorine-containing polymer is 5,000 to 50,000.

(8) The curable composition as described in any one of (1) to (7), in which the coloring agent includes a black pigment.

(9) A method for producing a cured film, comprising:
a step of forming a composition layer of the curable composition as described in any one of (1) to (8) on a substrate by spin coating;
a step of exposing the composition layer by irradiation with actinic rays or radiation; and
a step of subjecting the exposed composition layer to alkali development to form a cured film.

(10) A color filter formed by curing the curable composition as described in any one of (1) to (8).

(11) A light-shielding film formed by curing the curable composition as described in any one of (1) to (8).

(12) A solid-state imaging element having a cured film formed by curing the curable composition as described in any one of (1) to (8).

(13) An image display device having a cured film formed by curing the curable composition as described in any one of (1) to (8).

According to the present invention, it is possible to provide a curable composition capable of forming a cured film exhibiting excellent developability as well as excellent low reflectivity.

In addition, according to the present invention, it is possible to provide a color filter and a light-shielding film, each formed by curing the curable composition, and a solid-state imaging element and an image display device, each having a cured film formed by curing the curable composition.

DESCRIPTION OF THE PREFERRED EMBODIMENTS

Hereinafter, suitable aspects of the curable composition (hereinafter also simply referred to as the "composition" or "the composition of the present invention"), a method for producing a cured film, using the curable composition, a color filter and a light-shielding film, each formed by curing the curable composition, and a solid-state imaging element and an image display device, each having a cured film formed by curing the curable composition will be described in detail.

Incidentally, in citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification encompasses visible light, ultraviolet rays, far ultraviolet rays, electron beams, X-rays, and the like.

The explanation of constituents which will be described hereinafter may be made based on typical embodiments of the present invention in some cases, but the present invention is not limited to such embodiments. Further, in the present specification, "(a value) to (a value)" is used to mean a range including the numeric values described before and after "to" as a lower limit value and an upper limit value, respectively.

In the present specification, "(meth)acrylate" represents acrylate and methacrylate, "(meth)acryl" represents acryl and methacryl, "(meth)acryloyl" represents acryloyl and methacryloyl, and "(meth)acrylamide" represents acrylamide and methacrylamide. In addition, in the present specification, a "monomeric material" and a "monomer" have the same definition. The monomer in the present invention refers to a compound which is distinguished from an oligomer or a polymer and has a weight-average molecular weight of 2,000 or less. In the present specification, a polymerizable compound refers to a compound having a polymerizable group, and may be either a monomer or a polymer. The polymerizable group refers to a group involved in a polymerization reaction.

The present invention may be characterized, for example, in that it uses a fluorine-containing polymer having a repeating unit represented by a predetermined formula. Hereinafter, presumptions on the reasons why the effects of the present invention are obtained will be described.

Figure 1:
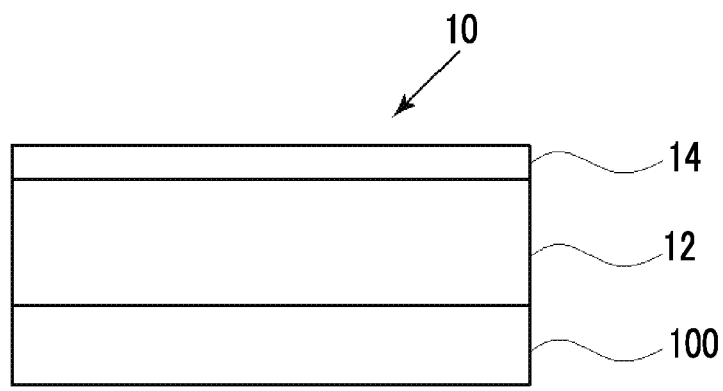
FIG. 1 shows a cross-sectional view of a suitable embodiment of a cured film of the present invention.

First, the curable composition of the present invention includes a fluorine-containing polymer (hereinafter simply also referred to as a "specific polymer") including a repeating unit represented by Formula (A) which will be described later and a repeating unit represented by Formula (B) which will be described later, and the polymer exhibits low surface free energy. Therefore, for example, it a coating film formed by applying the curable composition onto a substrate, specific polymers are highly likely to be present at a high concentration near the surface of the coating film on the side opposite to the substrate. As a result, as shown in FIG. 1, a cured film 10 on a substrate 100 obtained by curing a coating film has a bilayer structure with a coloring agent layer (under layer) 12 including a coloring agent (particularly preferably black pigment) and a coating layer (upper layer) 14 formed of the specific polymer. In a case where such a bilayer structure is formed, the light reflected on the surface of the coating layer and the light reflected on the interface between the coating layer and the coloring agent layer are canceled by interference, thus realizing low reflectivity.

In addition, the specific polymer is characterized in that a carboxyl group as an acid group is bonded to the main chain via a long-chain linking group having a predetermined number or more of carbon atoms in a repeating unit represented by Formula (A) which will be described later. It is thought that by this structure, the carboxyl group is likely to move out from the fluorine atom-containing group aggregated on the surface of the coating film, and be in contact with a developer, and further, the carboxyl group forms a penetration path of the developer in the coating layer, and the developability is excellent.

Furthermore, it is confirmed that in a case where the specific polymer has a repeating unit (preferably a repeating unit represented by Formula (C)) having a polymerizable group on the side chain, the chemical resistance is also excellent.

Hereinafter, first of all, the compositions of the curable composition (composition for forming a light-shielding film) of the present invention will be described in detail.

<Curable Composition>

Examples of aspects of the curable composition of the present invention include the following two aspects.

Curable composition X: A curable composition including a fluorine-containing polymer X including a repeating unit represented by Formula (A) which will be described later and a repeating unit represented by Formula (B) which will be described later, a coloring agent, and a polymerizable compound.

Curable composition Y: A curable composition including a fluorine-containing polymer Y including a repeating unit represented by Formula (A) which will be described later, a repeating unit represented by Formula (B) which will be described later, and a repeating unit having a polymerizable group on a side chain, and a coloring agent.

Hereinafter, the respective components included in the curable compositions X and Y will be described in detail.

<Curable Composition X>

Hereinafter, the respective components included in the curable composition X will first be described in detail.

(a) Fluorine-Containing Polymer X

The fluorine-containing polymer X includes a repeating unit represented by Formula (A) and a repeating unit represented by Formula (B).

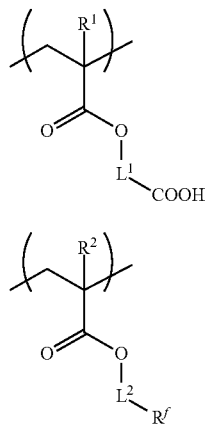

In Formula (A), $R^1$ represents a hydrogen atom or an alkyl group, and $L^1$ represents a divalent chained linking group having 3 or more carbon atoms in total, which may include an ester bond.

In Formula (B), $R^2$ represents a hydrogen atom or an alkyl group, $L^2$ represents a single bond or a divalent linking group, and $R^f$ represents a monovalent organic group including an fluorine atom.

Hereinafter, the repeating unit represented by Formula (A) will be described.

In the repeating unit represented by Formula (A), $R^1$ represents a hydrogen atom or an alkyl group. $R^1$ is preferably a hydrogen atom or an alkyl group having 1 to 5 carbon atoms, more preferably a hydrogen atom or an alkyl group having 1 to 3 carbon atoms, and particularly preferably a hydrogen atom or a methyl group.

Furthermore, $L^1$ represents a divalent chained linking group having 3 or more carbon atoms in total, which may include an ester bond. The total number of carbon atoms included in the linking group only needs to be 3 or more, but in a view of superior developability, the total number of carbon atoms is preferably 5 or more, and more preferably 10 or more. The upper limit is not particularly limited, but the total number of carbon atoms is 60 or less in many cases, preferably 30 or less, and more preferably 15 or less.

Furthermore, the chain may be linear or branched.

Examples of the divalent linking group include a chained alkylene group having 3 or more carbon atoms in total, which may include an ester bond. Further, the alkylene group may include a heteroatom. By incorporation of these linking groups, the carboxyl group is likely to move out from the fluorine atom-containing group aggregated on the surface of the coating film, and be in contact with a developer, and further, the carboxyl group easily forms a penetration path of the developer, and the developability is thus improved.

Suitable aspects of the repeating unit represented by Formula (A) include a repeating unit represented by Formula (A2) in a view of superior developability.

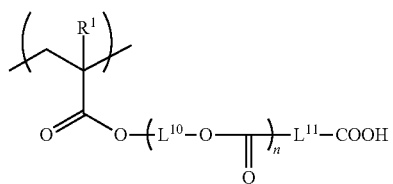

In Formula (A2), the definition of $R^1$ is the same as described above.

$L^{10}$ and $L^{11}$ each represent a chained alkylene group. Further, the total number of carbon atoms in $L^{10}$ and $L^{11}$ is 3 or more. Further, in a case where n is 0, the number of carbon atoms in $L^{11}$ only needs to be 3 or more. In addition, in a case where n is 2 or more, the total number of carbon atoms in a plurality of $L^{10}$'s and the total number of carbon atoms in a plurality of $L^{11}$'s only need to be 3 or more. For example, in a case where n is 2, the number of carbon atoms in $L^{10}$ is 2, and the number of carbon atoms in $L^{11}$ is 1, the number of carbon atoms in $L^{10}$ and $L^{11}$ is calculated as follows: 2×2+1=5.

The number of carbon atoms in the alkylene group represented by each of $L^{10}$ and $L^{11}$ is not particularly limited, but is preferably 2 or more, and more preferably 3 or more. The upper limit is not particularly limited, but is 15 or less in many cases, and in a view of handleability, is preferably 10 or less, and more preferably 6 or less.

n represents an integer of 0 or 1 or more. In a case where n is 0, an oxygen atom and $L^{11}$ are directly bonded to each other. n is preferably 1 or more, more preferably 1 to 3, and still more preferably 1 or 2.

Examples of a commercially available product of the monomer which can serve as the repeating unit represented by Formula (A) include ARONIX M-5300 manufactured by Toagosei Co., Ltd., and HO-MS or HOA-MS manufactured by Kyoeisha Chemical Co., Ltd. Among these, in views of excellent developability and low cost, ARONIX M-5300 manufactured by Toagosei Co., Ltd., or the like is preferable.

Specific examples of the repeating unit represented by Formula (A) include structural units having the following structures. However, the present invention is not limited thereto. Further, among the following structural units, R represents a hydrogen atom or an alkyl group, and is preferably a hydrogen atom or an alkyl group having 1 to 5 carbon atoms, more preferably a hydrogen atom or an alkyl group having 1 to 3 carbon atoms, and still more preferably a hydrogen atom or a methyl group.

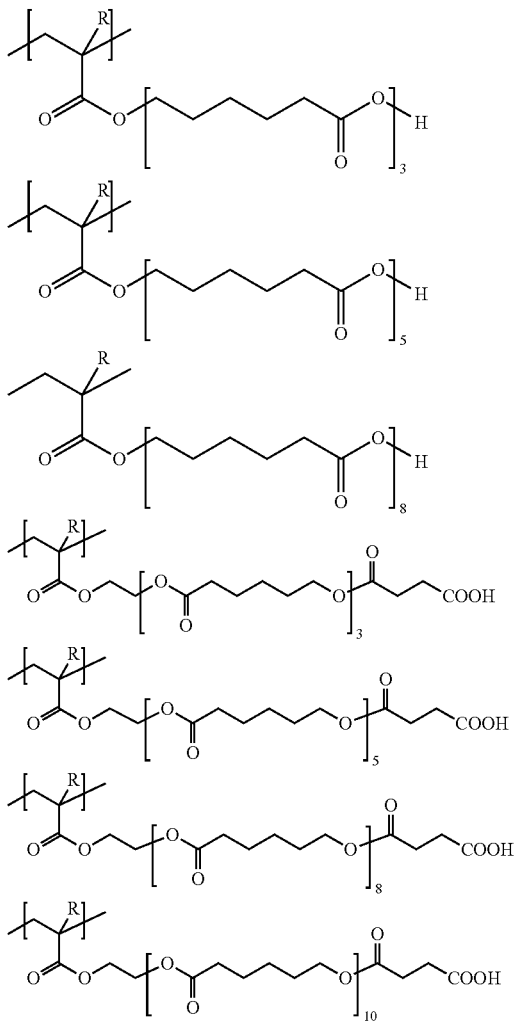

The proportion of the repeating unit represented by Formula (A) in the fluorine-containing polymer X is preferably 5% to 80% by mole, more preferably 10% to 50% by mole, and still more preferably 15% to 40% by mole, with respect to all the repeating units in the fluorine-containing polymer X. If the proportion of the repeating unit represented by Formula (A) is within the range, the solubility in an organic solvent is good and the amount of the residual monomers is reduced, which is thus effective.

In the repeating unit represented by Formula (B), $R^2$ represents a hydrogen atom or an alkyl group. $R^2$ is preferably a hydrogen atom or an alkyl group having 1 to 5 carbon atoms, more preferably a hydrogen atom or an alkyl group having 1 to 3 carbon atoms, and still more preferably a hydrogen atom or a methyl group.

Moreover, $L^2$ represents a single bond or a divalent linking group, provided that in a case where $L^2$ represents a divalent linking group, it is preferable that a fluorine atom is not included in $L^2$.

Examples of the divalent linking group include a group formed by one or a combination of two or more selected from the group consisting of an alkylene group, an arylene group, $-NR^{12}-$, $-CONR^{12}-$, $-CO-$, $-CO_2-$, $SO_2NR^{12}-$, $-O-$, $-S-$, and $-SO_2-$. $R^{12}$ represents a hydrogen atom or a methyl group.

Examples of the alkylene group include an alkylene group having 1 to 20 carbon atoms, and the alkylene group is preferably an alkylene group having 1 to 10 carbon atoms, more preferably an alkylene group having 1 to 6 carbon atoms, and still more preferably an alkylene group having 1 to 3 carbon atoms. The alkylene group may be any one of a linear, branched, and cyclic forms, and may include a heteroatom.

Examples of the arylene group include an arylene group having 6 to 20 carbon atoms, and the arylene group is preferably an arylene group having 6 to 10 carbon atoms, and particularly preferably a phenylene group.

Among these, from the viewpoints of excellent developability and suppressed residues after development, $L^2$ is preferably a single bond or an alkylene group, and further, from the viewpoint of having a merit of a wide choice in designs for reducing reflectivity, $L^2$ is preferably a single bond or an alkylene group having 1 to 3 carbon atoms.

Furthermore, $R^f$ represents a monovalent organic group including a fluorine atom.

Example of the monovalent organic group including a fluorine atom include an alkyl group substituted with a fluorine atom, and an aryl group substituted with a fluorine atom.

The alkyl group substituted with a fluorine atom is preferably a linear, branched, or cyclic alkyl group in which at least one hydrogen atom substituted with a fluorine atom. The number of carbon atoms in the alkyl group substituted with a fluorine atom is preferably 1 to 20, more preferably 1 to 10, and still more preferably 1 to 5.

In the aryl group substituted with a fluorine atom, the aryl group is preferably directly substituted with a fluorine atom. The number of carbon atoms in the aryl group substituted with a fluorine atom is preferably 6 to 20, and more preferably a phenyl group.

The alkyl group substituted with a fluorine atom, and the aryl group substituted with a fluorine atom may further have other substituents, in addition to the fluorine atom.

With regard to the alkyl group substituted with a fluorine atom and the aryl group substituted with a fluorine atom, reference can be made to paragraphs 0266 to 0272 of JP2011-100089A, the contents of which are incorporated herein by reference.

Among those, from the viewpoint of satisfying both of developability and low reflectivity, the alkyl group substituted with a fluorine atom is preferably a linear, branched, or cyclic alkyl group in which at least one hydrogen atom is substituted with a fluorine atom, and further, from the viewpoint of having a merit of a wide choice in designs for reducing reflectivity, the alkyl group substituted with a fluorine atom is particularly preferably a linear or branched alkyl group in which at least one hydrogen atom is substituted with a fluorine atom, among others.

Specific examples of the repeating unit represented by Formula (B) include the following ones, but the present invention is not limited thereto. Among the specific examples, $X^1$ represents a hydrogen atom or an alkyl group, and is preferably a hydrogen atom or an alkyl group having 1 to 5 carbon atoms, more preferably a hydrogen atom or an alkyl group having 1 to 3 carbon atoms, and still more preferably a hydrogen atom or a methyl group.

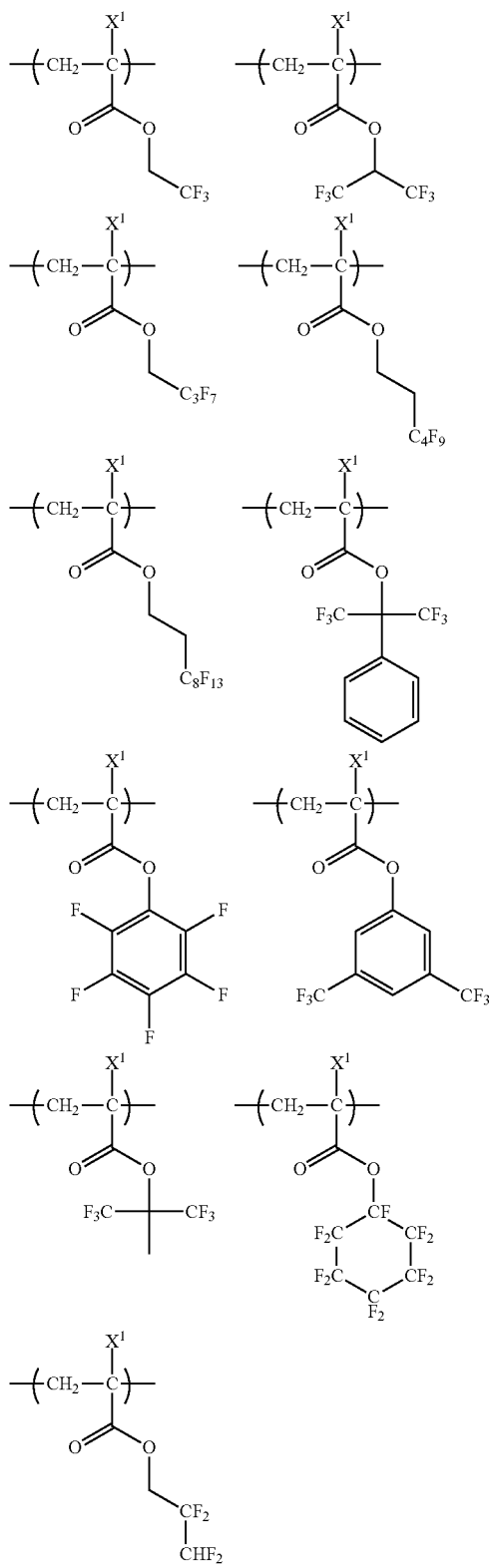

Moreover, from the viewpoint of satisfying both of superior developability and superior low reflectivity, $R^f$ is preferably a monovalent organic group having 1 to 3 carbon atoms, which is substituted with a fluorine atom, more preferably a linear or branched alkyl group having 1 to 3 carbon atoms, in which at least one hydrogen atom is substituted with a fluorine atom, and still more preferably —$C(CF_3)_2$—.

Examples of commercially available products of a monomer which can serve as the repeating unit represented by Formula (B) include HFIP-M and HFIP-A, manufactured by Central Glass Co., Ltd., and VISCOAT 13F and VISCOAT 8FM, manufactured by Osaka Organic Chemical Industry Ltd.

The proportion of the repeating unit represented by Formula (B) in the fluorine-containing polymer X is preferably 20% to 95% by mole, more preferably 50% to 90% by mole, and still more preferably 60% to 85% by mole, with respect to all the repeating units in the fluorine-containing polymer X. If the proportion of the repeating unit represented by Formula (B) is within the range, the low reflectivity is superior, which is thus effective.

The fluorine-containing polymer X may include repeating units other than the repeating unit represented by Formula (A) and the repeating unit represented by Formula (B).

The acid value of the fluorine-containing polymer X is not particularly limited, but is in a range of 10 to 200 mgKOH/g in many cases.

Above all, it is preferably in a range of 70 to 150 mgKOH/g, more preferably in a range of 70 to 120 mgKOH/g, and still more preferably in a range of 70 to 100 mgKOH/g. If the acid value of the fluorine-containing polymer X in the range, enhanced low reflectivity and developability can both be satisfied. That is, if the acid value of the fluorine-containing polymer X is 150 mgKOH/g or less, good low reflectivity can be obtained, whereas if the acid value is 70 mgKOH/g or more, the alkali developability is improved. Further, by setting the acid value in the range, the linearity of a pattern is also excellent.

In the present invention, the acid value of the fluorine-containing polymer X can be calculated from, for example, the average content of the acid groups in the polymer. In addition, a polymer having a desired acid value can be obtained by changing the content of the structural unit containing the acid group which is the constituent of the fluorine-containing polymer X.

The weight-average molecular weight (Mw: in terms of polystyrene) of the fluorine-containing polymer X is preferably 5,000 to 50,000, and more preferably 5,000 to 15,000. By setting the weight-average molecular weight within the range, the linearity of a pattern is also superior, in addition to obtaining superior developability.

Incidentally, the dispersity (weight-average molecular weight/number-average molecular weight) is preferably 1.80 to 3.00, and more preferably 1.80 to 2.00.

A gel permeation chromatography (GPC) method is based on the method which will be described later in the section of EXAMPLES.

The content of the fluorine-containing polymer X in the curable composition X is preferably 1% to 50% by mass, more preferably 1% to 30% by mass, and still more preferably 1% to 20% by mass, with respect to the total solid content of the curable composition.

The curable composition may include one kind or two or more kinds of the fluorine-containing polymer X. In a case where the composition include two or more kinds of the fluorine-containing polymer X, a total thereof only needs to be in the range.

Moreover, other aspects of the curable composition of the present invention may include an aspect including a polymer (I) having the repeating unit represented by Formula (A) and a polymer (II) having the repeating unit represented by Formula (B). In this case, from the viewpoint of improving low reflectivity, curability, and sensitivity, the polymer (II) I preferably a polymer further including a repeating unit having a polymerizable group on a side chain. Further, in a case where the repeating unit having a polymerizable group on the side chain is the Formula (C), low reflectivity, curability, and sensitivity are improved, and developability is also superior, which is thus particularly preferable. By incorporation of the polymer (I) having the repeating unit represented by Formula (A), developability can be imparted, and a development speed can further be increased.

(b) Polymerizable Compound

The polymerizable compound is preferably a compound which has at least one addition-polymerizable, ethylenically unsaturated group, and has a boiling point of 100° C. or higher at normal pressure. In particular, among the polymerizable compounds, the polymerizable compound having 2 to 10 ethylenically unsaturated groups is preferable, and a so-called polyfunctional polymerizable compound is preferable.

Examples of the compound which has at least one addition-polymerizable, ethylenically unsaturated group and a boiling point of 100° C. or higher at normal pressure include monofunctional acrylates or methacrylates such as polyethylene glycol mono(meth)acrylate, polypropylene glycol mono(meth)acrylate, and phenoxyethyl (meth)acrylate; polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol hexa(meth)acrylate, hexanediol (meth)acrylate, trimethylolpropane tri(acryloyloxypropyl) ether, tri(acryloyloxyethyl) isocyanurate, and a compound obtained by (meth)acrylation after the addition of ethylene oxide or propylene oxide to polyfunctional alcohol such as glycerin or trimethylol ethane, poly(meth)acrylates of pentaerythritol or dipentaerythritol, the urethane acrylates described in each publication of JP1973-41708B (JP-S48-41708B), JP1975-6034B (JP-S50-6034B), and JP1976-37193A (JP-S51-37193A), the polyester acrylates described in each publication of JP1973-64183A (JP-S48-64183A), JP1974-43191B (JP-S49-43191B), and JP1977-30490B (JP-S52-30490B), and polyfunctional acrylates or methacrylates such as epoxy acrylates which are reaction products obtained from an epoxy resin and a (meth)acrylic acid. In addition, those introduced as the photocurable monomers and oligomers in pages 300 to 308 in Journal of the Adhesion Society of Japan, Vol. 20, No. 7 can also be used.

Furthermore, a compound obtained by (meth)acrylation after the addition of ethylene oxide or propylene oxide to the polyfunctional alcohol represented by General Formulae (1) and (2) described together with the specific examples thereof in JP1998-62986A (JP-H10-62986A) can also be used.

Among those, dipentaerythritol penta(meth)acrylate, dipentaerythritol hexa(meth)acrylate, and structures in which the acryloyl groups thereof are linked to dipentaerythritol via an ethylene glycol or propylene glycol residue are preferable. These oligomer types thereof can also be used.

Furthermore, the urethane acrylates described in each publication of JP1973-41708B (JP-S48-41708B), JP1976-37193A (JP-S51-37193A), JP1990-32293B (JP-H02-32293B), and JP1990-16765B (JP-H02-16765B), and the urethane compounds having an ethylene oxide-based skeleton described in each publication of JP1983-49860B (JP-S58-49860B), JP1981-17654B (JP-S56-17654B), JP1987-39417B (JP-S62-39417B), and JP1987-39418B (JP-S62-39418B) are also suitable. A photopolymerizable composition having a highly excellent photosensitive speed can be obtained in a case of using an addition polymerizable compound having an amino structure or a sulfide structure in a molecule as described in each publication of JP1988-277653A (JP-S63-277653A), JP1988-260909A (JP-S63-260909A), and JP1989-105238A (JP-H01-105238A). Examples of the commercially available products thereof include Urethane Oligomers UAS-10 and UAB-140 (trade names, manufactured by Nippon Paper Chemicals Ltd.), UA-7200 (manufactured by Shin-Nakamura Chemical Industry Co., Ltd.), DPHA-40H (trade name, manufactured by Nippon Kayaku Co., Ltd.), and UA-306H, UA-306T, UA-306I, AH-600, T-600, and AI-600 (trade names, manufactured by Kyoeisha Chemical Co., Ltd.).

In addition, ethylenically unsaturated compounds having an acid group are also suitable. Examples of the commercially available products thereof include TO-756 which is a carboxyl group-containing trifunctional acrylate and TO-1382 which is a carboxyl group-containing pentafunctional acrylate, both manufactured by TOAGOSEI Co., Ltd. As for the polymerizable compound used in the present invention, tetrafunctional or higher acrylate compounds are more preferable. Examples of the tetrafunctional or higher acrylate compounds include KAYARAD DPHA (trade name, manufactured by Nippon Kayaku Co., Ltd.).

The polymerizable compounds may be used singly or in combination of two or more kinds thereof.

In a case where a combination of two or more polymerizable compounds is used, a combination aspect thereof can be determined as appropriate in accordance with the physical properties or the like required for the composition. Examples of the suitable combination aspects of the polymerizable compounds may be a combination aspect of two or more kinds of polymerizable compounds selected from the above-mentioned polyfunctional acrylate compounds, and for example, it may be a combination of dipentaerythritol hexaacrylate and pentaerythritol triacrylate.

The content of the polymerizable compound is preferably 3% to 55% by mass, and more preferably 10% to 50% by mass, with respect to the total solid content of the curable composition of the present invention.

Furthermore, the weight ratio of the polymerizable compound to the above-mentioned fluorine-containing polymer X or the fluorine-containing polymer Y which will be described later (polymerizable compound/(fluorine-containing polymer X or fluorine-containing polymer Y)) in the composition of the present invention is preferably 0.1 to 20.

In a case where the fluorine-containing polymer contained in the composition of the present invention is unevenly distributed on the surface, the under layer side in the coating film by the composition of the present invention has higher concentrations of the polymerizable compound, the coloring material, and the initiator, partial curing failure occurs in some cases. However, even in this case, if the ratio is particularly 0.5 to 15, the sensitivity of the composition is high, and the composition can be uniformly cured, which is thus more preferable. Further, from the viewpoint of satisfying both of low reflectivity and linearity, the ratio is more preferably 1 to 10.

(c) Coloring Agent

As the coloring agent, various known coloring pigments and coloring dyes can be used.

As the coloring dye, for example, in a case of using the coloring dye in production of a color filter, R (red), G (green), and B (blue), each of which forms a color pixel of a color filter. In addition, a black color-based dye (black dye) which is generally used for forming a black matrix or a light-shielding film system can be used.

From the viewpoint of constituting a bilayer structure shown in FIG. 1, it is preferable to use a coloring pigment.

As the coloring pigment, for example, in a case of using the coloring pigment in production of a color filter, the coloring agents described in paragraphs 0027 to 0200 of JP2014-42375A can also be used, in addition to the chromatic color-based pigments such as (chromatic color pigments) such as R (red), G (green), and B (blue), each of which forms a color pixel of a color filter, and a black color-based pigment (black pigment) which is generally used for forming a black matrix or for forming a light-shielding film system can be used.

As the chromatic color-based pigment, various inorganic pigments or organic pigments known in the related art can be used. Further, whether the pigments are inorganic or organic, taking into consideration the view that high transmittance is preferable, the pigments which are as fine as possible are preferably used, and taking handleability into consideration, the average primary particle diameter of the pigment is preferably 0.01 μm to 0.1 μm, and more preferably 0.01 μm to 0.05 μm.

Moreover, the average primary particle diameter of the pigments can be measured using a transmission electron microscope (TEM). As the transmission electron microscope, for example, a transmission microscope HT7700 manufactured by Hitachi High-Technologies Corporation can be used.

A maximum length (Dmax: a maximum length between two points on a contour of a particle image) and a maximum perpendicular length (DV-max: a shortest length connecting perpendicularly between two straight lines when the image is interposed between the two straight lines parallel with the maximum length) of a particle image acquired by using a transmission electron microscope are measured, and a geometric mean value $(Dmax \times DV\text{-}max)^{1/2}$ is defined as a particle diameter. The particle diameters of 100 particles are measured by this method, an arithmetic average value thereof is taken as the average particle diameter, which is defined as an average primary particle diameter of the pigments. The "average primary particle diameter" in EXAMPLES of the present specification is also the same as the above-mentioned arithmetic average value.

Examples of the inorganic pigment include metal compounds such as metal oxides and metal complex salts, and specific examples thereof include metal oxides of iron, cobalt, aluminum, cadmium, lead, copper, titan, magnesium, chromium, zinc, antimony, or the like, and composite oxides of the metals.

[Pigments]

Examples of the pigment include various inorganic pigments or organic pigments known in the related art.

Examples of the inorganic pigment include, in addition to the oxides of metals such as iron, cobalt, aluminum, cadmium, lead, copper, titanium, magnesium, chromium, zinc, and antimony, composite oxides of the metals.

Examples of the organic pigments include the following ones, but the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like C. I. Pigment Orange 2, 5, 13, 16, 17:1, 31, 34, 36, 38, 43, 46, 48, 49, 51, 52, 55, 59, 60, 61, 62, 64, 71, 73, and the like C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like, C. I. Pigment Green 7, 10, 36, 37, 58, 59, and the like, C. I. Pigment Violet 1, 19, 23, 27, 32, 37, 42, and the like, and C. I. Pigment Blue 1, 2, 15, 15:1, 15:2, 15:3, 15:4, 15:6, 16, 22, 60, 64, 66, 79, 80, and the like.

These organic pigments may be used singly or in various combinations thereof in order to increase the color purity.

(Black Pigment)

In the present invention, black pigments can also be used as a black pigment. Hereinafter, the black pigment will be described in more detail.

As the black pigment, various known black pigments can be used. In particular, from the viewpoint of achieving a high optical density with a small amount of the pigment, carbon black, titanium black, titanium oxide, iron oxide, manganese oxide, graphite, and the like are preferable. Among these, at least one of carbon black or titanium black is more preferably included, and particularly from the viewpoint of small absorption in the light absorption wavelength range of an initiator with respect to the curing efficiency due to exposure, titanium black is more preferable. Specific examples of the carbon black include, but are not limited to, organic pigments such as C. L Pigment Black 1 and inorganic pigments such as Pigment Black 7, which are commercially available products.

(Other Pigments)

In the present invention, a pigment having infrared light absorptivity can also be used as the pigment, in addition to the pigments described above as the black pigment.

As the pigment having infrared light absorptivity, a tungsten compound, a metal boride, or the like is preferable, and among those, the tungsten compound is more preferable in a view that the light-shielding properties at a wavelength in the infrared region are excellent. In particular, the tungsten compound is preferable from the viewpoint that the light transmittances in a light absorption wavelength range and a visible light region of an initiator with respect to the curing efficiency due to exposure is excellent.

These pigments may be used in combination of two or more kinds thereof, and may also be used in combination with a dye which will be described later. For the purpose of enhancing the light-shielding properties of a desired wavelength range, in addition to adjusting the tint, for example, an aspect in which the above-mentioned chromatic color pigment in red, green, yellow, orange, purple, blue, or the like, or a dye which will be described later is mixed with a black pigment or a pigment having infrared-ray-shielding properties may be exemplified. It is preferable to incorporate a red pigment or dye, or a purple pigment or dye into a black pigment or a pigment having infrared-ray-shielding properties, and it is particularly preferable to incorporate a red pigment into a black pigment or a pigment having infrared-ray-shielding properties.

The black pigment preferably includes titanium black.

The titanium black is a black particle containing a titanium atom. Preferably, it is substoichiometric titanium oxide, titanium oxynitride, or the like. The titanium black particle can modify the surface, if desired, for the purpose of improving the dispersibility, suppressing aggregating properties, and the like. For example, it is possible to coat the titanium black particle with silicon oxide, titanium oxide, germanium oxynitride, aluminum oxide, magnesium oxide, or zirconium oxide, and it is also possible to perform a treatment with a water-repellent material as shown in JP2007-302836A.

The titanium black is typically a titanium black particle, and it is preferable that the primary particle diameter and the average primary particle diameter of the individual particles are both small.

Specifically, the average primary particle diameter is preferably in a range of 10 nm to 45 nm. Further, the particle diameter, that is, the particle diameter of the black pigment in the present invention refers to the diameter of a circle having an area equal to the projected area of the outer surface of the particle. The projected area of the particle is obtained by measuring the area of the particle taken in an electron micrograph and correcting the imaging magnification.

The specific surface area of the titanium black is not particularly limited, and the value measured by a Brunauer, Emmett, Teller (BET) method is preferably in the order of from 5 $m^2/g$ to 150 $m^2/g$, and more preferably from 20 $m^2/g$ to 120 $m^2/g$ so that the water repellency of the titanium black after the surface treatment using a water-repellent agent exhibits a predetermined performance.

Examples of a commercially available product of the titanium black include Titanium Black 10S, 12S, 13R, 13M, 13M-C, 13R, 13R-N, and 13M-T (trade names, manufactured by Mitsubishi Materials Corporation), and Tilack D (trade name, manufactured by Akokasei Co., Ltd.).

Furthermore, it is preferable that the titanium black is contained as a dispersoid including the titanium black and Si atoms.

In this form, the titanium black is contained as a dispersoid in a composition, and the content ratio (Si/Ti) in the Si atoms to the Ti atoms in the dispersoid is preferably 0.05 or more, more preferably 0.05 to 0.5, and still more preferably 0.07 to 0.4 in terms of mass.

Here, the dispersoid includes both the titanium black in a state of primary particles and the titanium black in a state of aggregates (secondary particles).

To change the Si/Ti of the dispersoid (for example, to 0.05 or more), it is possible to use the following means.

First, a dispersion is obtained by dispersing titanium oxide and silica particles with a dispersing machine, and then the dispersion is subjected to a reducing treatment at a high temperature (for example, 850° C. to 1,000° C.). Thus, the dispersoid having the titanium black particles as a main component and containing Si and Ti can be obtained. The reduction treatment can also be carried out in an atmosphere of a reductive gas such as ammonia.

Examples of the titanium oxide include TTO-51N (trade name: manufactured by Ishihara Sangyo Kaisha, Ltd.).

Examples of the commercially available products of the silica particles include AEROSIL (trademark) 90, 130, 150, 200, 255, 300, and 380 (trade name: manufactured by Evonik).

Dispersion of the titanium oxide and the silica particles may be carried out using a dispersant. Examples of the dispersant include those described in the section of the dispersant which will be described later.

The dispersion can also be carried out in a solvent. Examples of the solvent include water and organic solvents. Examples of the solvents include those described in the section of the organic solvent which will be described later.

The titanium black with the Si/Ti adjusted to, for example, 0.05 or more can be manufactured by the methods described in, for example, paragraph No. [0005], and paragraph Nos. [0016] to [0021] of JP2008-266045A.

By adjusting the content ratio (Si/Ti) of the Si atoms to the Ti atoms in the dispersoid including the titanium black and the Si atoms to a suitable range (for example, 0.05 or more), the amount of the residue derived from the composition, remaining on the outside of a region where the light-shielding film is formed is reduced in a case where the light-shielding film is formed by using the composition including the dispersoid. Further, the residue includes a component derived from the titanium black particles or a composition such as a resin component.

The reason why the amount of the residue is reduced has not been clarified yet, but the above-mentioned dispersoid tends to have a small particle diameter (for example, a particle diameter of 30 nm or less), and the absorptivity to the underlying substrate of the whole film decreases as the component containing the Si atoms increases in the dispersoid. This is assumed to contribute to improvement of the development removability of uncured composition (in particular, titanium black) in the formation of the light-shielding film.

Furthermore, from the viewpoint that the titanium black has excellent light-shielding properties to light in wavelength ranges widely ranging from ultraviolet rays to infrared light, the light-shielding film formed using the dispersoid (preferably with the Si/Ti of 0.05 or more in terms of mass) including the titanium black and Si atoms exerts excellent light-shielding properties.

Incidentally, the content ratio (Si/Ti) of the Si atoms to the Ti atoms in the dispersoid can be measured using, for example, the method (1-1) or the method (1-2) described in paragraph 0033 of JP2013-249417A.

In addition, for the dispersoid contained in the light-shielding film obtained by curing the composition, it is determined whether the content ratio (Si/Ti) of the Si atoms to the Ti atoms in the dispersoid is 0.05 or more, using the method (2) described in paragraph 0035 of JP2013-249417A.

In the dispersoid including the titanium black and the Si atom, the titanium black as described above can be used.

Furthermore, in this dispersoid, one kind or two or more kinds of composite oxides such as Cu, Fe, Mn, V, and Ni, cobalt oxide, iron oxide, a black pigment formed of carbon black, aniline black, or the like may be combined as the dispersoid with the titanium black, for the purpose of adjusting dispersibility, colorability, and the like.

In this case, it is preferable that the dispersoid formed of the titanium black occupies 50% by mass or more of the whole dispersoid.

Incidentally, in the dispersoid, another coloring agent (such as an organic pigment and a dye) may be used together with the titanium black as desired as long as the coloring agent does not impair the effects of the present invention, for the purpose of adjusting light-shielding properties or the like.

Hereinafter, the materials used in introducing the Si atoms into the dispersoid will be described. In a case where the Si atoms are introduced into the dispersoid, a Si-containing material such as silica may be used.

Examples of the silica used herein include precipitated silica, fumed silica, colloidal silica, and synthetic silica, and may be selected as appropriate.

In addition, since the light-shielding properties are superior if the particle diameter of the silica particle is smaller than the thickness of the film in the formation of a light-shielding film, it is preferable to use fine particle-type silica as the silica particle. Further, examples of the fine particle-type silica include the silica described in paragraph 0039 of JP2013-249417A, the contents of which are incorporated herein by reference.

Furthermore, a tungsten compound and a metal boride can also be used as the pigment.

Hereinafter, the tungsten compound and the metal boride will be described in detail.

For the curable composition of the present invention, a tungsten compound and/or a metal boride can be used.

The tungsten compound and the metal boride are each an infrared-ray-shielding material having high absorption of infrared light (light at a wavelength of about 800 to 1,200 nm) (that is, high light-shielding properties (light-blocking property) for infrared ray) and low absorption of visible light. Accordingly, the curable composition of the present invention can form a pattern having high light-shielding properties in the infrared ray region and a high transmittance in the visible light region by incorporation of the tungsten compound and/or the metal boride.

Furthermore, the tungsten compound and the metal boride are used for exposure in the image formation. For example, the tungsten compound and the metal boride exhibit a small absorption for light at a wavelength shorter than that in the visible region, such as a high-pressure mercury lamp, KrF, and ArF. Therefore, by combining the polymerizable compound which will be described later with an alkali-soluble resin and a photopolymerization initiator, an excellent pattern is obtained, and at the same time, development scum can further be suppressed in the pattern formation.

Examples of the tungsten compound include a tungsten oxide-based compound, a tungsten boride-based compound, and a tungsten sulfide-based compound, and the tungsten compound is preferably a tungsten oxide-based compound represented by General Formula (compositional formula) (I):

$$M_xW_yO_z \qquad (I)$$

M represents a metal, W represents tungsten, and O represents oxygen, 0.001≤x/y≤1.1, and 2.2≤z/y≤3.0.

Examples of the metal of M include an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, and the metal is preferably an alkali metal. The metal of M may be one kind or two or more kinds of metals.

M is preferably an alkali metal, more preferably Rb or Cs, and still more preferably Cs.

In a case where x/y is 0.001 or more, the infrared rays can be sufficiently blocked, and in a case where x/y is 1.1 or less, production of an impurity phase in the tungsten compound can be more reliably avoided.

In a case where z/y is 2.2 or more, chemical stability as the material can be more enhanced, and in a case where it is 3.0 or less, the infrared rays can be sufficiently blocked.

Specific examples of the tungsten oxide-based compound represented by General Formula (I) include $Cs_{0.33}WO_3$, $Rb_{0.33}WO_3$, $K_{0.33}WO_3$, and $Ba_{0.33}WO_3$, and the compound is preferably $Cs_{0.33}WO_3$ or $Rb_{0.33}WO_3$, and more preferably $Cs_{0.33}WO_3$.

The tungsten compound is preferably a fine particle. The average particle diameter of the tungsten fine particles is preferably 800 nm or less, more preferably 400 nm or less, and still more preferably 200 nm or less. In a case where the average particle diameter is in such the range, the tungsten fine particle is scarcely allowed to block the visible light because of light scattering, so that light transparency in the visible region can be more successfully ensured. In a view of avoiding light scattering, the average particle diameter is preferably smaller, but for the reason of easy handling or the like at the production, the average particle diameter of the tungsten fine particles is usually 1 nm or more.

Moreover, it is possible to use two or more kinds of the tungsten compounds.

The tungsten compound is available as a commercial product, but in a case where the tungsten compound is, for example, a tungsten oxide-based compound, the tungsten oxide-based compound can be obtained by a method of heat-treating a tungsten compound in an inert gas atmosphere or a reducing gas atmosphere (refer to JP4096205B).

Furthermore, the tungsten oxide-based compound is also available, for example, as a dispersion of tungsten fine particle, such as YMF-02 manufactured by Sumitomo Metal Industries, Ltd.

Examples of the metal boride include one kind or two or more kinds of, for example, lanthanum boride ($LaB_6$), praseodymium boride ($PrB_6$), neodymium boride ($NdB_6$), cerium boride (CeB), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride (CrB, $CrB_2$), molybdenum boride ($MoB_2$, $MO_2B_5$, MoB), and tungsten boride ($W_2B_5$), and the metal boride is preferably lanthanum boride ($LaB_6$).

The metal boride is preferably a fine particle. The average particle diameter of the metal boride fine particle is preferably 800 nm or less, more preferably 300 nm or less, still more preferably 100 nm or less. In a case where the average particle diameter is in such the range, the metal boride fine particle is less likely to block visible light by light scattering, so that light transmittance in the visible region can be more reliably ensured. In a view of avoiding light scattering, the average particle diameter is preferably smaller, but for a reason of easy handling or the like during the production, the average particle diameter of the metal boride fine particles is usually 1 nm or more.

Furthermore, it is possible to use two or more kinds of the metal boride.

The metal boride is available as a commercial product, and is also available as a dispersion of metal boride fine particles, such as KHF-7 produced by Sumitomo Metal Industries, Ltd.

[Dye]

As the dye, the coloring agents disclosed in, for example, JP1989-90403A (JP-S64-90403A) JP1989-91102A (JP-S64-91102A), JP1989-94301A (JP-H01-94301A), JP1994-11614A (JP-H06-11614A), JP2592207B, U.S. Pat. Nos. 4,808,501A, 5,667,920A, US505950A, JP1993-333207A (JP-H05-333207A), JP1994-35183A (JP-H06-35183A), JP1994-51115A (JP-H06-51115A), and JP1994-194828A (JP-H06-194828A) can be used. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothiazine compound, a pyrrolopyrazoleazomethine compound, or the like can be used. In addition, as the dye, a coloring agent multimer may be used. Examples of the coloring agent multimer include the compounds described in JP2011-213925A and JP2013-041097A.

Furthermore, in the present invention, a coloring agent having a maximum absorption in a wavelength range of 800 to 900 nm can be used as the coloring agent.

Examples of the coloring agent having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterylene compound, a dithiol metal complex-based compound, and a croconium compound.

As the phthalocyanine compound, the naphthalocyanine compound, the iminium compound, the cyanine compound, the squarylium compound, and the croconium compound, the compounds disclosed in paragraphs 0010 to 0081 of JP2010-111750A may be used, the contents of which are incorporated herein by reference. With regard to the cyanine compound, reference can be made to, for example, "Functional Coloring Agent, written by Okawara Shin, Matsuoka Ken, Kitao Teijirou, and Hirashima Kousuke, published by Kodansha Scientific Ltd.", the contents of which are incorporated to the present specification.

As the coloring agent having the spectral characteristics, the compounds disclosed in paragraphs 0004 to 0016 of JP1995-164729A (JP-H07-164729A), the compounds disclosed in paragraphs 0027 to 0062 of JP2002-146254A, and the near-infrared absorption particles disclosed in paragraphs 0034 to 0067 of JP2011-164583A, which are formed of crystallites of oxide including Cu and/or P, and that have a number-average aggregate particle diameter of 5 to 200 nm can also be used.

In the present invention, the coloring agent having maximum absorption in a wavelength range of 800 to 900 nm is preferably a pyrrolopyrrole compound. The pyrrolopyrrole compound may be a pigment or a dye, but the pigment is preferable for a reason that a curable composition capable of forming a film having excellent heat resistance is easily obtained.

With regard to the details of the pyrrolopyrrole compound, reference can be made to the description in paragraph Nos. 0017 to 0047 of JP2009-263614A, the contents of which are incorporated herein by reference. Incidentally, specific examples of the compound represented by General Formula (1) include the compounds described in paragraph Nos. 0049 to 0058 of JP2009-263614A, the contents of which are incorporated herein by reference.

Furthermore, the dye multimers described in paragraphs 0027 to 0200 of JP2014-199436A can also be suitably used.

Moreover, the curable composition of the present invention may also include an extender pigment, as desired. Examples of the extender pigments include barium sulfate, barium carbonate, calcium carbonate, silica, basic magnesium carbonate, alumina white, gloss white, titanium white, and hydrotalcite. These extender pigments can be used singly or in combination of two or more kinds thereof. The amount of the extender pigment to be used is usually 0 to 100 parts by mass, preferably 5 to 50 parts by mass, and more preferably 10 to 40 parts by mass, with respect to 100 parts by mass of the coloring agent. In the present invention, the surfaces of the coloring agent and the extender pigments can be used, optionally after being modified with a polymer.

Furthermore, in addition to a black pigment or a pigment having excellent light transmittance at the wavelength of a visible light region and an excellent function of shielding light at the wavelength of an infrared region, an organic coloring pigment or dyes such as red, blue, yellow, green, and purple pigments or dyes may also be included, as desired. In a case of using a combination of an organic coloring pigment or dye with a black pigment or a pigment having excellent light transmittance at the wavelength of a visible light region and an excellent function of shielding light at the wavelength of an infrared region, it is preferable to use 1% to 40% by mass of a red pigment or dye with respect to the black pigment or the pigment having excellent light transmittance at the wavelength of a visible light region and an excellent function of shielding light at the wavelength of an infrared region, and it is preferable the red pigment or dye is Pigment Red 254.

The content of the coloring agent (particularly preferably the black pigment) in the composition is preferably 20% to 80% by mass, more preferably 30% to 70% by mass, and still more preferably 35% to 60% by mass, with respect to the total solid content of the composition.

[Dispersant]

The composition of the present invention preferably contains a dispersant. The dispersant contributes to improvement of the dispersibility of the above-mentioned coloring pigments such as titanium black.

As the dispersant, for example, a known pigment dispersant can be appropriately selected and used. Above all, a polymer compound is preferable.

Examples of the dispersant include polymer dispersants [for example, a polyamidoamine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalenesulfonic acid/formalin condensate], a polyoxyethylene alkyl phosphate ester, a polyoxyethylene alkylamine, and a pigment derivative].

The polymer dispersant can further be classified into a linear polymer, a terminal-modified polymer, a graft-type polymer, and a block-type polymer, depending on its structure.

The polymer compound is adsorbed on a surface of the dispersoid such as a coloring agent such as a black pigment and a pigment which is used in combination according to purposes, and acts so as to prevent re-aggregation. For this reason, examples of a preferable structure thereof include a terminal-modified polymer, a graft-type polymer, and a block-type polymer, which have an anchoring site for a pigment surface.

On the other hand, the absorptivity of the polymer compound onto the dispersoid can also be enhanced by modifying the surface of the titanium black or the above-described dispersoid including the titanium black and Si atoms.

The polymer compound preferably has a structural unit with a graft chain. Further, in the present specification, the "structural unit" has the same definition as the "repeating unit".

Such a polymer compound having a structural unit with a graft chain has an affinity for a solvent due to the graft chain, so that the polymer compound is excellent in the dispersibility of a coloring pigment such as a black pigment and the dispersion stability over time. Further, due to the presence of a graft chain, the composition has an affinity for a polymerizable compound, other resins which can be possibly combined, or the like, so that it is less likely that the alkali development generates a residue.

If the graft chain is long, a steric repulsion effect is high and the dispersibility is improved. However, if the graft chain is too long, the adsorption force to a coloring pigment such as a black pigment is reduced, so that the dispersibility tends to be lowered. As a result, the number of atoms other than hydrogen atoms in the graft chain is preferably in a range of 40 to 10,000, the number of atoms other than hydrogen atoms is more preferably in a range of 50 to 2,000, and the number of atoms other than hydrogen atoms is still more preferably in a range of 60 to 500.

Here, the graft chain refers to a portion from the base (an atom which is in a group which is branched from the main chain and bonded to the main chain) of the main chain of a copolymer to the end of the group which is branched from the main chain.

The graft chain preferably has a polymer structure, and examples of such the polymer structure include a poly(meth) acrylate structure (for example, a poly(meth)acrylic structure), a polyester structure, a polyurethane structure, a polyurea structure, a polyamide structure, and a polyether structure.

In order to improve the interaction between the graft chain and a solvent, thereby increasing the dispersibility, it is preferable that the graft chain is a graft chain having at least one selected from the group consisting of the polyester structure, the polyether structure, and the poly(meth)acrylate structure. It is more preferable that the graft chain has at least one of the polyester structure or the polyether structure.

The structure of a macromonomer having such a polymer structure as a graft chain is not particularly limited, but preferably, a macromonomer with a reactive double-bond forming group can be suitably used.

As a commercially available product which is suitably used in the synthesis of the polymer compound in correspondence to the structural unit with a graft chain of the polymer compound, AA-6 (trade name, TOAGOSEI Co., Ltd.), AA-10 (trade name, manufactured by TOAGOSEI CO., Ltd.), AB-6 (trade name, manufactured by TOAGOSEI Co., Ltd.), AS-6 (trade name, manufactured by TOAGOSEI Co., Ltd.), AN-6 (trade name, manufactured by TOAGOSEI Co., Ltd.), AW-6 (trade name, manufactured by TOAGOSEI Co., Ltd.), AA-714 (trade name, manufactured by TOAGOSEI Co., Ltd.), AY-707 (trade name, manufactured by TOAGOSEI Co., Ltd.), AY-714 (trade name, manufactured by TOAGOSEI Co., Ltd.), AK-5 (trade name, manufactured by TOAGOSEI Co., Ltd.), AK-30 (trade name, manufactured by TOAGOSEI Co., Ltd.), AK-32 (trade name, manufactured by TOAGOSEI Co., Ltd.), BLEMMER PP-100 (trade name, manufactured by NOF Co., Ltd.), BLEMMER PP-500 (trade name, NOF Corporation), BLEMMER PP-800 (trade name, manufactured by NOF Co., Ltd.), BLEMMER PP-1000 (trade name, manufactured by NOF Co., Ltd.), BLEMMER 55-PET-800 (trade name, manufactured by NOF Co., Ltd.), BLEMMER PME-4000 (trade name, manufactured by NOF Co., Ltd.), BLEMMER PSE-400 (trade name, manufactured by NOF Co., Ltd.), BLEMMER PSE-1300 (trade name, manufactured by NOF Co., Ltd.), BLEMMER 43PAPE-600B (trade name, manufactured by NOF Co., Ltd.), or the like is used. Among those, AA-6 (trade name, manufactured by TOAGOSEI Co., Ltd.), the AA-10 (trade name, TOAGOSEI Co., Ltd.), the AB-6 (trade name, manufactured by TOAGOSEI Co., Ltd.), the AS-6 (trade name, TOAGOSEI Co., Ltd.), the AN-6 (trade name, manufactured by TOAGOSEI Co. Ltd.), BLEMMER PME-4000 (trade name, manufactured by NOF Co., Ltd.), or the like is preferable.

The polymer compound preferably contains a structural unit represented by any one of Formulae (1) to (4) as the structural unit with a graft chain, and more preferably contains a structural unit represented by any one of Formulae (1A), (2A), (3A), (3B), and (4) as the structural unit with a graft chain.

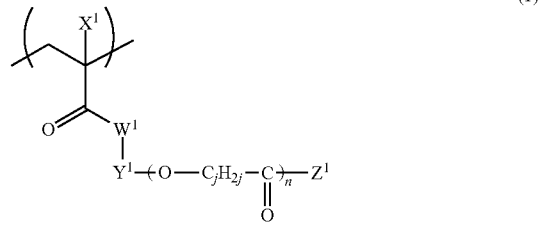

(1)

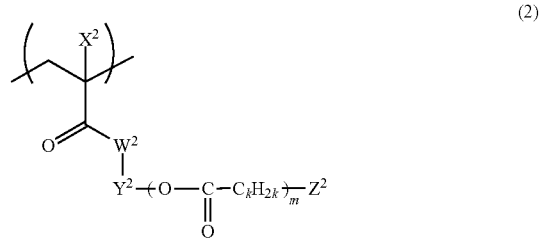

(2)

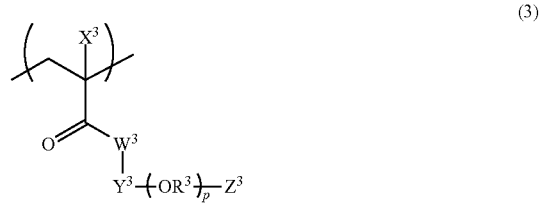

(3)

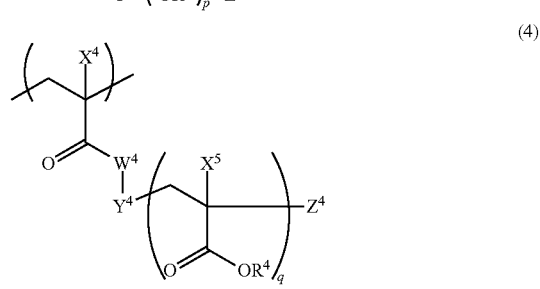

(4)

In Formulae (1) to (4), $W^1$, $W^2$, $W^3$, and $W^4$ each independently represent an oxygen atom or NH. $W^1$, $W^2$, $W^3$, and $W^4$ are preferably each an oxygen atom.

In Formulae (1) to (4), $X^1$, $X^2$, $X^3$, $X^4$, and $X^5$ each independently represent a hydrogen atom or a monovalent organic group. In terms of constraints of synthesis, it is preferable that $X^1$, $X^2$, $X^3$, $X^4$, and $X^5$ each independently represent a hydrogen atom or an alkyl group having 1 to 12 carbon atoms. It is more preferable that $X^1$, $X^2$, $X^3$, $X^4$, and $X^5$ each independently represent a hydrogen atom or a methyl group, with the methyl group being particularly preferable.

In Formulae (1) to (4), $Y^1$, $Y^2$, $Y^3$, and $Y^4$ each independently represent a divalent linking group, and the linking group is not particularly limited in terms of its structure. Specific examples of the divalent linking groups represented by $Y^1$, $Y^2$, $Y^3$, and $Y^4$ include linking groups represented by the following (Y-1) to (Y-21). In the structures shown below, A and B means binding sites to a left terminal group and a right terminal group, respectively, in Formulae (1) to (4). Among the structures shown below, (Y-2) or (Y-13) is more preferable in terms of easiness of synthesis.

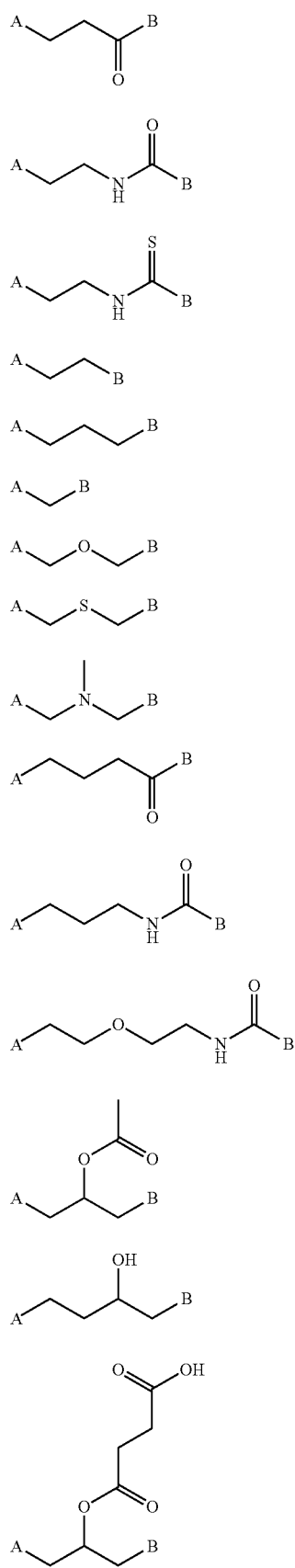

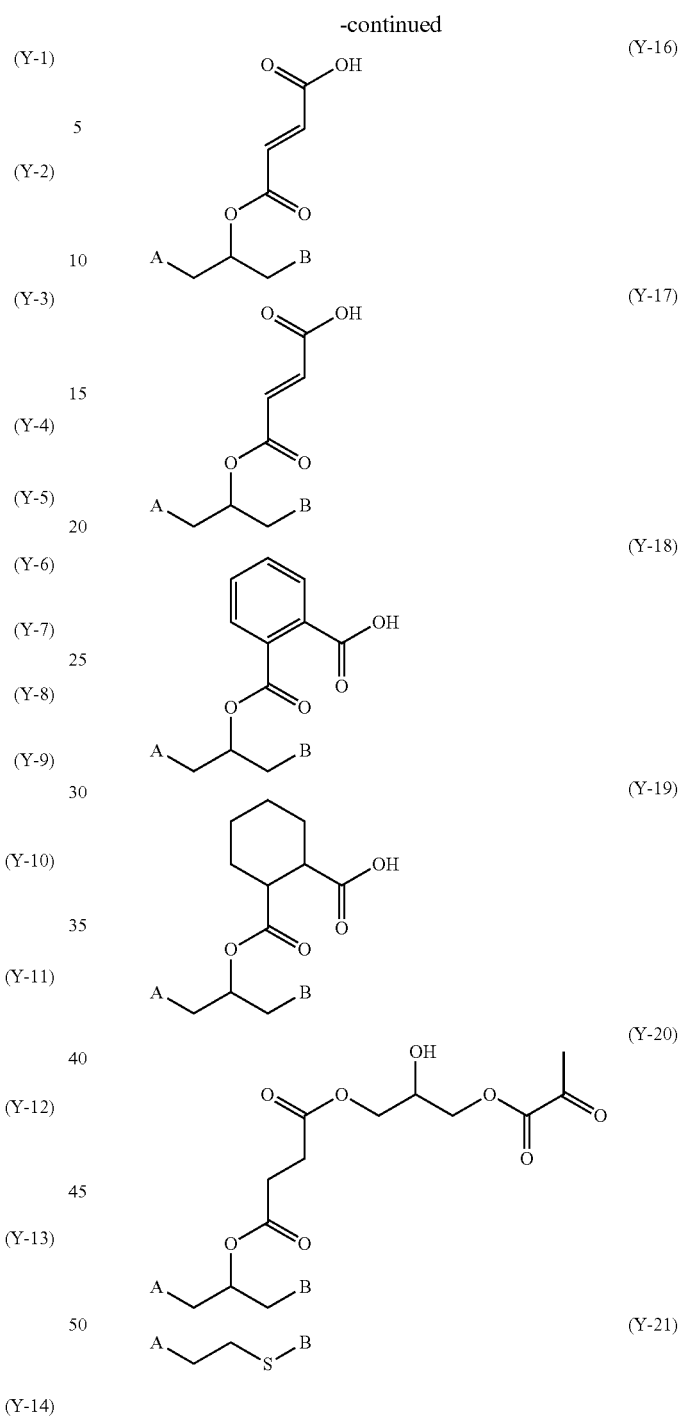

In Formulae (1) to (4), $Z^1$, $Z^2$, $Z^3$, and $Z^4$ each independently represent a monovalent organic group. The structure of the organic group is not particularly limited. Specific examples of the organic groups include an alkyl group, a hydroxyl group, an alkoxy group, an aryloxy group, heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is preferable that $Z^1$, $Z^2$, $Z^3$, and $Z^4$ each independently represent an alkyl group alkoxy group having 5 to 24 carbon atoms. Among those, it is particularly preferable that $Z^1$, $Z^2$, $Z^3$, and $Z^4$ each independently represent a branched alkyl group having 5 to 24 carbon atoms, a cyclic alkyl group having 5 to 24 carbon atoms, or an alkoxy group having 5 to 24 carbon atoms. In addition, the alkyl group contained in the alkoxy group may be linear, branched, or cyclic.

In Formulae (1) to (4), n, m, p, and q are each independently an integer of 1 to 500.

Furthermore, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents a branched or linear alkylene group, and is preferably an alkylene group having 1 to 10 carbon atoms, and more preferably an alkylene group having 2 or 3 carbon atoms. When p is 2 to 500, $R^3$ which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is still more preferable. In Formula (4), when q is 2 to 500, $X^3$ and $R^4$ which are present in plural numbers in a graft copolymer may be the same as or different from each other.

Moreover, the polymer compound may have two or more structural units with a graft chain, which differ from each other in structure. That is, the structural units represented by Formulae (1) to (4), which differ from each other in structure, may be included in the molecule of the polymer compound. Further, in Formulae (1) to (4), in a case where n, m, p, and q each represent an integer of 2 or more, j and k may include different structures in the side chains in Formulae (1) and (2). In Formulae (3) and (4), $R^3$, $R^4$, and $X^5$ which are present in plural numbers in the molecules may be the same as or different from each other.

As for the structural unit represented by Formula (1), a structural unit represented by Formula (1A) is more preferable from the viewpoints of dispersion stability or developability.

Furthermore, as the structural unit represented by Formula (2), a structural unit represented by the following formula (2A) is more preferable from the viewpoint of dispersion stability or developability.

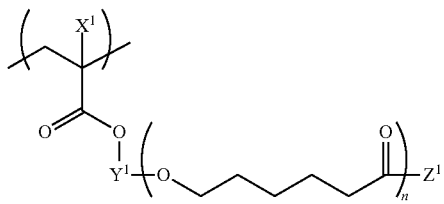
(1A)

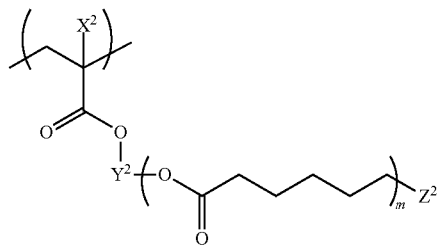
(2A)

In Formula (1A), $X^1$, $Y^1$, $Z^1$, and n have the same definitions as $X^1$, $Y^1$, $Z^1$, and n in formula (1), and the preferred ranges thereof are the same. In Formula (2A), $X^2$, $Y^2$, $Z^2$, and m have the same definitions as $X^2$, $Y^2$, $Z^2$, and m in Formula (2), and the preferred ranges thereof are the same.

Furthermore, as the structural unit represented by Formula (3), a structural unit represented by Formula (3A) or (3B) is more preferable from the viewpoint of dispersion stability or developability.

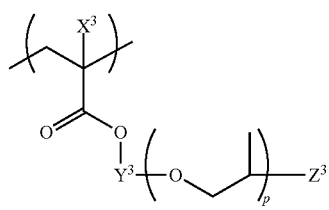
(3A)

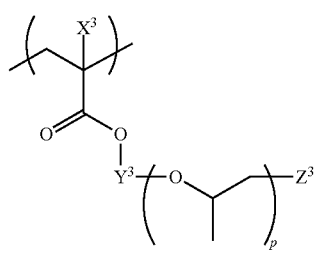
(3B)

In Formula (3A) or (3B), $X^3$, $Y^3$, $Z^3$, and p have the same definitions as $X^3$, $Y^3$, $Z^3$, and p in Formula (3), and the preferred ranges thereof are the same.

It is more preferable that the polymer compound has the structural unit represented by Formula (1A) as the structural unit having a graft chain.

In the polymer compound, the structural unit with a graft chain (for example, the structural units represented by Formulae (1) to (4)) is included preferably in a range of 2% to 90%, and more preferably in a range of 5% to 30%, in terms of mass, with respect to the total mass of the polymer compound. If the structural unit with a graft chain is included within this range, the dispersibility of the coloring pigment such as a black pigment (in particular, titanium black particles) is high and the developability at the time of forming a colored layer is excellent.

Moreover, the polymer compound preferably has a hydrophobic structural unit which differs from the structural unit with a graft chain (that is, which does not correspond to the structural unit with a graft chain). Meanwhile, in the present invention, the hydrophobic structural unit is a structural unit having no acid group (for example, a carboxylic acid group, a sulfonic acid group, a phosphoric acid group, and a phenolic hydroxyl group).

The hydrophobic structural unit is preferably a structural unit which is derived from (corresponds to) a compound (monomer) having the C log P value of 1.2 or more, and more preferably a structural unit derived from a compound having the C log P value of 1.2 to 8. Thus, the effects of the present invention are expressed with more reliability.

A C log P value is a value calculated by the program "C LOG P", which is available from Daylight Chemical Information System, Inc. This program provides values of "calculated log P" calculated using Hansch and Leo's fragment approach (refer to the documents below). The fragment approach is based on the chemical structure of a compound, and divides the chemical structure into partial structures (fragments) and sums the log P contribution allocated to each fragment. Thus the log P value of the compound is estimated. The details thereof are described in the following documents. In the present invention, the C log P values calculated by the program C LOG P v4.82 are used.

A. J. Leo, Comprehensive Medicinal Chemistry, Vol. 4, C. Hansch, P. G. Sammnens, J. B. Taylor and C. A. Ramsden, Eds., p. 295, Pergamon Press, 1990 C. Hansch & A. J. Leo. Substituent Constants For Correlation Analysis in Chemistry and Biology. John Wiley & Sons. A. J. Leo. Calculating log Poct from structure. Chem. Rev., 93, 1281-1306, 1993.

The log P refers to the common logarithm of a partition coefficient P. The log P is a value of a physical property, being a quantitative numeric value, representing how an organic compound is distributed in an equilibrium of the two-phase system of oil (typically 1-octanol) and water. The log P is expressed in the following expression.

$$\log P = \log(C\text{oil}/C\text{water})$$

In the expression, Coil represents the molar concentration of the compound in the oil phase, and Cwater represents the molar concentration of the compound in the water phase.

Oil solubility increases as the value of log P crosses zero and increases in the positive direction and water solubility increases as an absolute value increases in the negative direction. The log P has a negative correlation with the water solubility of the organic compound and is widely used as a parameter for estimating the hydrophilic or hydrophobic properties of an organic compound.

It is preferable that the polymer compound has at least one structural unit selected from structural units derived from monomers represented by General Formulae (i) to (iii) as the hydrophobic structural unit.

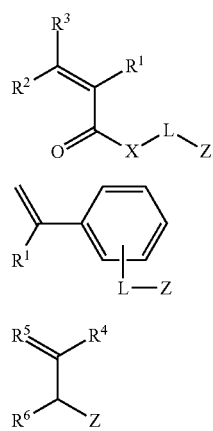

In Formulae (i) to (iii), $R^1$, $R^2$, and $R^3$ each independently represent a hydrogen atom, a halogen atom (for example, fluorine, chlorine, and bromine), or an alkyl group having 1 to 6 carbon atoms (for example, a methyl group, an ethyl group, and a propyl group).

$R^1$, $R^2$, and $R^3$ are each more preferably a hydrogen atom or an alkyl group having 1 to 3 carbon atoms, and most preferably a hydrogen atom or a methyl group. $R^2$ and $R^3$ are each particularly preferably a hydrogen atom.

X represents an oxygen atom (—O—) or an imino group (—NH—), and is preferably an oxygen atom.

L is a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino group (—$NR^{31}$—, in which $R^{31}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. The aliphatic group may be a saturated aliphatic group or an unsaturated aliphatic group, but is preferably a saturated aliphatic group. Further, the aliphatic group may have a substituent. Examples of the substituents include a halogen atom, an aromatic group, and a heterocyclic group.

The number of carbon atoms in the divalent aromatic group is preferably 6 to 20, more preferably 6 to 15, and still more preferably 6 to 10. The aromatic group may have a substituent. Examples of the substituents include a halogen atom, an aliphatic group, an aromatic group, and a heterocyclic group.

The divalent heterocyclic group preferably has a 5- or 6-membered ring as the heterocyclic ring. Another heterocyclic ring, an aliphatic ring, or an aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—$R^{32}$ in which $R^{32}$ represents an aliphatic group, an aromatic group, or a heterocyclic group), an aliphatic group, an aromatic group, and a heterocyclic group.

L is preferably a single bond or a divalent linking group including an alkylene group or an oxyalkylene structure. The oxyalkylene structure is more preferably an oxyethylene structure or an oxypropylene structure. Further, L may include a polyoxyalkylene structure including two or more repeating oxyalkylene structures. The polyoxyalkylene structure is preferably a polyoxyethylene structure or a polyoxypropylene structure. The polyoxyethylene structure is represented by —($OCH_2CH_2$)n—, and n is preferably an integer of 2 or more, and more preferably an integer of 2 to 10.

Examples of Z include an aliphatic group (for example, an alkyl group, a substituted alkyl group, an unsaturated alkyl group, and a substituted unsaturated alkyl group), an aromatic group (for example, an arylene group and a substituted arylene group), a heterocyclic group, and a combination thereof. These groups may include an oxygen atom (—O—), a sulfur atom (—S—), an imino group (—NH—), a substituted imino group (—NR$^{31}$— in which R$^{31}$ represents an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and still more preferably 1 to 10. Further, the aliphatic group includes a ring assembly hydrocarbon group or a crosslinked cyclic hydrocarbon ring. Examples of the ring assembly hydrocarbon groups include a bicyclohexyl group, a perhydronaphthalenyl group, a biphenyl group, and a 4-cyclohexyl phenyl group. Examples of the crosslinked cyclic hydrocarbon rings include a bicyclic hydrocarbon ring such as pinane, bornane, norpinane, norbornane, a bicyclooctane ring (a bicyclo[2.2.2]octane ring, a bicyclo[3.2.1]octane ring, and the like), a tricyclic hydrocarbon ring such as homobredane, adamantane, tricyclo[5.2.1.0$^{2,6}$]decane, a tricyclo[4.3.1.1$^{2,5}$]undecane ring, and a tetracyclic hydrocarbon ring such as tetracyclic[4.4.0.1$^{2,5}$.1$^{7,10}$]dodecane and perhydro-1,4-methano-5,8-methanonaphthalene rings. In addition, the crosslinked cyclic hydrocarbon rings include fused cyclic hydrocarbon rings which are a plurality of fused rings of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings.

As the aliphatic group, a saturated aliphatic group is more preferable than an unsaturated aliphatic group. Further, the aliphatic group may have a substituent. Examples of the substituents include a halogen atom, an aromatic group, and a heterocyclic group. However, the aliphatic group has no acid group as the substituent.

The number of carbon atoms in the above-mentioned aromatic group is preferably 6 to 20, more preferably 6 to 15, and still more preferably 6 to 10. Further, the aromatic group may have a substituent. Examples of the substituents include a halogen atom, an aliphatic group, an aromatic group, and a heterocyclic group. However, the aromatic group has no acid group as the substituent.

The heterocyclic group preferably has a 5- or 6-membered ring as the heterocyclic ring. Another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—R$^{32}$ in which R$^{32}$ is an aliphatic group, an aromatic group, or a heterocyclic group), an aliphatic group, an aromatic group, and a heterocyclic group. However, the heterocyclic group has no acid group as the substituent.

In Formula (iii), R$^4$, R$^5$, and R$^6$ each independently represent a hydrogen atom, a halogen atom (for example, fluorine, chlorine, and bromine), an alkyl group having 1 to 6 carbon atoms (for example, a methyl group, an ethyl group, and a propyl group), Z, or -L-Z. Here, L and Z have the same definitions as those defined above. As each of R$^4$, R$^5$, and R$^6$, a hydrogen atom or an alkyl group having 1 to 3 carbon atoms is preferable, and an a hydrogen atom is more preferable.

In the present invention, as the monomer represented by General Formula (i), a compound in which R$^1$, R$^2$, and R$^3$ are each a hydrogen atom or a methyl group, L is a single bond, an alkylene group, or a divalent linking group including an oxyalkylene structure, X is an oxygen atom or an imino group, and Z is an aliphatic group, a heterocyclic group, or an aromatic group is preferable.

Furthermore, as the monomer represented by General Formula (ii), a compound in which R$^1$ is a hydrogen atom or a methyl group, L is an alkylene group, Z is an aliphatic group, a heterocyclic group, or an aromatic group, and Y is a methine group is preferable. Further, as the monomer represented by General Formula (iii), a compound in which R$^4$, R$^5$, and R$^6$ are each a hydrogen atom or a methyl group, and Z is an aliphatic group, a heterocyclic group, or an aromatic group is preferable.

Examples of the typical compounds represented by Formulae (i) to (iii) include radically polymerizable compounds selected from acrylic acid esters, methacrylic acid esters, and styrenes.

In addition, with regard to the examples of the typical compounds represented by Formulae (i) to (iii), reference can be made to the compounds described in paragraphs 0089 to 0093 of JP2013-249417A, the contents of which are incorporated herein by reference.

In the polymer compound, the hydrophobic structural unit is preferably included in the amount in a range of 10% to 90%, and more preferably included in the amount in a range of 20% to 80%, in terms of mass, with respect to the total mass of the polymer compound. When the content is within the above range, sufficient pattern formation is achieved.

A functional group capable of interacting with a coloring pigment (in particular, titanium black) such as a black pigment can be introduced into the polymer compound. Here, it is more preferable that the polymer compound has a structural unit having a functional group capable of interacting with the coloring pigment such as a black pigment.

Examples of the functional group capable of interacting with the coloring pigment such as a black pigment include an acid group, a basic group, a coordinating group, and a reactive functional group.

In a case where the polymer compound has the acid group, the basic group, the coordinating group, or the reactive functional group, it preferably has a structural unit having the acid group, a structural unit having the basic group, a structural unit having the coordinating group, or a structural unit having the reactivity, respectively.

In particular, by further having an alkali-soluble group such as a carboxylic acid group, as an acid group, the polymer compound is provided with developability for pattern formation through alkali development.

That is, by introducing the alkali-soluble group to the polymer compound, the polymer compound as a dispersant that is indispensable for the dispersion of the coloring pigment such as a black pigment, in the composition of the present invention, has alkali solubility. Such a composition containing the polymer compound is excellent in light-shielding properties in the exposure section, and improves alkali-developability of an unexposed area.

In addition, by incorporating a structural unit having an acid group into the polymer compound, the polymer compound has an affinity for the solvent so that the coatability also tends to be improved.

It is assumed that the acid group in the structural unit having the acid group is likely to interact with the coloring pigment such as a black pigment, and the polymer compound disperses the coloring pigment such as a black pigment stably. It is also assumed that the viscosity of the polymer compound that disperses the coloring pigment such as a black pigment is reduced, so that the polymer compound itself is likely to be dispersed stably.

Meanwhile, the structural unit having the alkali-soluble group as the acid group may be the same as or different from the above-described structural unit having the graft chain. However, the structural unit having the alkali-soluble group as the acid group differs from the above-described hydrophobic structural unit (that is, the structural unit having the alkali-soluble group as the acid group does not correspond to the above-described hydrophobic structural unit).

Examples of the acid group which is a functional group capable of interacting with the coloring pigment such as a black pigment include a carboxylic acid group, a sulfonic acid group, a phosphoric acid group, and a phenolic hydroxyl group, and the acid group is preferably at least one of an carboxylic acid group, a sulfonic acid group, or a phosphoric acid group, and particularly preferably a carboxylic acid group which has an excellent adsorption force on a coloring pigment such as a black pigment and high dispersibility in the coloring pigment such as a black pigment.

That is, it is preferable that the polymer compound further has a structural unit having at least one of a carboxylic acid group, a sulfonic acid group, or a phosphoric acid group.

The polymer compound may have one kind or two or more kinds of structural units having an acid group.

The polymer compound may or may not contain a structural unit having an acid group. In a case where the polymer compound contains a structural unit having an acid group, the content of the structural unit having an acid group is preferably 5% to 80%, with respect to the total mass of the polymer compound, in terms of mass, and more preferably 10% to 60% from the viewpoint of suppressing a damage to image intensity caused by alkali development.

Examples of the basic group which is a functional group capable of interacting with the coloring pigment such as a black pigment include a primary amino group, a secondary amino group, a tertiary amino group, a heterocyclic ring containing an N atom, and an amido group, and the basic group is particularly preferably a tertiary amino group which has an excellent adsorption force on a coloring pigment such as a black pigment and high dispersibility in the coloring pigment such as a black pigment. The polymer compound may have one kind or two or more kinds of the basic groups.

The polymer compound may or may not contain a structural unit having a basic group. In a case where the polymer compound contains the structural unit having a basic group, the content of the structural unit having a basic group, in terms of mass, with respect to the total mass of the polymer compound, is preferably from 0.01% to 50%, and more preferably from 0.01% to 30% from the viewpoint of suppressing the development inhibition.

Examples of the coordinating group which is a functional group capable of interacting with the coloring pigment such as a black pigment, and the reactive functional group include an acetylacetoxy group, a trialkoxysilyl group, an isocyanate group, an acid anhydride, and an acid chloride. The coordinating group is particularly preferably an acetylacetoxy group which has a good adsorption force on a coloring pigment such as a black pigment and high dispersibility in the coloring pigment such as a black pigment. The polymer compound may have one kind or two or more kinds of the groups.

The polymer compound may or may not contain a structural unit having a coordinating group or a structural unit having a reactive functional group. In a case where the polymer compound contains the structural unit having a coordinating group or the structural unit having a reactive functional group, the content of the structural unit, in terms of mass, with respect to the total mass of the polymer compound, is preferably from 10% to 80%, and more preferably from 20% to 60% from the viewpoint of suppressing the development inhibition.

In a case where the polymer compound in the present invention has a functional group capable of interacting with the coloring pigment such as a black pigment other than the graft chain, the polymer compound may have the functional group capable of interacting with various coloring pigments such as a black pigment, as described above. Further, how those functional groups are introduced is not particularly limited, but it is preferable that the polymer compound has at least one structural unit selected from the structural units derived from monomers represented by General Formulae (iv) to (vi).

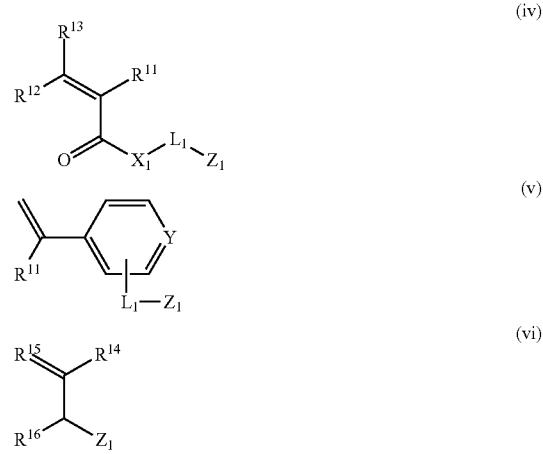

In General Formulae (iv) to (vi), $R^{11}$, $R^{12}$, and $R^{13}$ each independently represent a hydrogen atom, a halogen atom (for example, a fluorine atom, a chlorine atom, and a bromine atom), or an alkyl group (for example, a methyl group, an ethyl group, and a propyl group) having 1 to 6 carbon atoms.

In General Formulae (iv) to (vi), it is more preferable that $R^{11}$, $R^{12}$, and $R^{13}$ are each independently a hydrogen atom or an alkyl group having 1 to 3 carbon atoms, and it is the most preferable that $R^{11}$, $R^{12}$, and $R^{13}$ are each independently a hydrogen atom or a methyl group. In General Formula (iv), it is particularly preferable that $R^{12}$ and $R^{13}$ are each a hydrogen atom.

In General Formula (iv), $X_1$ represents an oxygen atom (—O—) or an imino group (—NH—), and is preferably an oxygen atom.

Furthermore, in General Formula (v), Y represents a methine group or a nitrogen atom.

Moreover, in General Formulae (iv) to (v), $L_1$ represents a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino bond (—NR$^{31'}$— in which R$^{31'}$ is an aliphatic group, an aromatic group, or a heterocyclic group), a carbonyl bond (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. As the aliphatic group, a saturated aliphatic group is more preferable than an unsaturated aliphatic group. The aliphatic group may have a substituent. Examples of the substituents include a halogen atom, a hydroxyl group, an aromatic group, and a heterocyclic group.

The number of carbon atoms in the above-mentioned divalent aromatic group is preferably 6 to 20, more preferably 6 to 15, and most preferably 6 to 10. The aromatic group may have a substituent. Examples of the substituents include a halogen atom, a hydroxyl group, an aliphatic group, an aromatic group, and a heterocyclic group.

The divalent heterocyclic group preferably has a 5- or 6-membered ring as the heterocyclic ring. One or more of another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—$R^{32}$ in which $R^{32}$ represents an aliphatic group, an aromatic group, or a heterocyclic group), an aliphatic group, an aromatic group, and a heterocyclic group.

It is preferable that $L_1$ is a single bond, an alkylene group, or a divalent linking group containing an oxyalkylene structure. It is more preferable that the oxyalkylene structure is an oxyethylene structure or an oxypropylene structure. Further, $L_1$ may include a polyoxyalkylene structure including two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n- in which n is preferably an integer of 2 or more, and more preferably an integer of 2 to 10.

In General Formulae (iv) to (vi), $Z_1$ represents a functional group capable of interacting with the coloring pigment such as a black pigment, other than the graft chain, and is preferably a carboxylic acid group or a tertiary amino group, and more preferably a carboxylic acid group.

In General Formula (vi), $R^{14}$, $R^{15}$, and $R^{16}$ each independently represents a hydrogen atom, a halogen atom (for example, fluorine, chlorine, and bromine), an alkyl group having 1 to 6 carbon atoms (for example, a methyl group, an ethyl group, and a propyl group), —$Z_1$, or -$L_1$-$Z_1$. Here, $L_1$ and $Z_1$ have the same definitions as $L_1$ and $Z_1$ above, respectively, and the preferred examples thereof are also the same. It is preferable that $R^{14}$, $R^{15}$, and $R^{16}$ each independently represent a hydrogen atom or an alkyl group having 1 to 3 carbon atoms, and more preferably a hydrogen atom.

In the present invention, as the monomer represented by General Formula (iv), a compound in which $R^{11}$, $R^{12}$, and $R^{13}$ are each independently a hydrogen atom or a methyl group, $L_1$ is an alkylene group or a divalent linking group including an oxyalkylene structure, $X_1$ is an oxygen atom or an imino group, and $Z_1$ is a carboxylic acid group is preferable.

Furthermore, as the monomer represented by General Formula (v), a compound in which $R^{11}$ is a hydrogen atom or a methyl group, $L_1$ is an alkylene group, $Z_1$ is a carboxylic acid group, and Y is a methine group is preferable.

In addition, as the monomer represented by General Formula (vi), a compound in which $R^{14}$, $R^{15}$, and $R^{16}$ are each independently a hydrogen atom or a methyl group, $L_1$ is a single bond or an alkylene group, and $Z_1$ is a carboxylic acid group is preferable.

Typical examples of the monomers (compounds) represented by General Formulae (iv) to (vi) are shown below.

Examples of the monomers include methacrylic acid, crotonic acid, isocrotonic acid, a reaction product of succinic anhydride and a compound (for example, 2-hydroxyethyl methacrylate) having an addition-polymerizable double bond and a hydroxyl group in the molecule, a reaction product of phthalic anhydride and a compound having an addition-polymerizable double bond and a hydroxyl group in the molecule, a reaction product of tetrahydroxy phthalic anhydride and a compound having an addition-polymerizable double bond and a hydroxyl group in the molecule, a reaction product of trimellitic anhydride and a compound having an addition-polymerizable double bond and a hydroxyl group in the molecule, a reaction product of pyromellitic anhydride and a compound having an addition-polymerizable double bond and a hydroxyl group in the molecule, an acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoints of the interaction with the coloring pigment such as a black pigment, the dispersion stability, and the permeability of a developer, the content of the structural unit having a functional group capable of interacting with the coloring pigment such as a black pigment is preferably 0.05% to 90% by mass, more preferably 1.0% to 80% by mass, and still more preferably 10% to 70% by mass, with respect to the total mass of the polymer compound.

Furthermore, for the purpose of improving various types of performance, such as image intensity, the polymer compound may further have other structural units (for example, a structural unit having a functional group with an affinity for a dispersion medium used for a dispersion) having various functions which differ from the structural unit with a graft chain, the hydrophobic structural unit, and the structural unit having a functional group capable of interacting with the coloring pigment such as a black pigment as long as it does not impair the effects of the present invention.

Examples of other structural units include a structural unit derived from a radically polymerizable compound selected from acrylonitriles, methacrylonitriles, and the like.

The polymer compound may use one kind or two or more kinds of such other structural units. The content thereof is preferably from 0% to 80%, and particularly preferably from 10% to 60%, in terms of mass, with respect to the total mass of the polymer compound. When the content is within the range, sufficient pattern forming properties are maintained.

The acid value of the polymer compound is preferably in the range from 0 mgKOH/g to 160 mgKOH/g, more preferably in the range from 10 mgKOH/g to 140 mgKOH/g, and still more preferably in the range from 20 mgKOH/g to 120 mgKOH/g.

In a case where the acid value of the polymer compound is 160 mgKOH/g or less, the peeling of the pattern during the development at the time of forming a colored layer is more effectively inhibited. Further, when the acid value of the polymer compound is 10 mgKOH/g or more, the alkali developability is improved. In addition, when the acid value of the polymer compound is 20 mgKOH/g or more, precipitation of the coloring pigment (in particular, titanium black) such as a black pigment or the dispersoid including the titanium black and Si atoms can further be suppressed, the number of coarse particles can further be reduced, and the temporal stability of the composition can further be improved.

In the present invention, the acid value of the polymer compound is calculated from the average content of the acid groups in the polymer compound, for example. Further, a resin having a desired acid value is obtained by changing the content of a structural unit containing an acid group, which is a constituent of the polymer compound.

At the time of forming the cured layer, the weight-average molecular weight of the polymer compound in the present invention is preferably from 4,000 to 300,000, more preferably from 5,000 to 200,000, still more preferably from 6,000 to 100,000, and particularly preferably from 10,000 to 50,000, as a value in terms of polystyrene measured by a gel permeation chromatography (GPC) method, from the viewpoint of suppressing the peeling of the pattern during the development and the developability.

The GPC method uses HLC-8020GPC (manufactured by Tosoh Corporation), and is based on a method using TSKgel SuperHZM-H, TSKgel SuperHZ4000, or TSKgel SuperHZ2000 (manufactured by Tosoh Corporation, 4.6 mmID×15 cm) as a column and tetrahydrofuran (THF) as an eluent.

The polymer compound is synthesized based on a known method. Examples of solvents used for synthesizing the polymer compound include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N, N-dimethylacetamide, dimethyl sulfoxide, toluene, ethyl acetate, methyl lactate, and ethyl lactate. These solvents may be used singly or as a mixture of two or more kinds thereof.

Specific examples of the polymer compounds which can be used in the present invention include "DA-7301" manufactured by Kusumoto Chemicals, Ltd.; "DISPERBYK-101 (polyamidamine phosphate), 107 (carboxylic acid ester), 110 (copolymer including an acid group), 111 (phosphoric acid-based dispersant), 130 (polyamide), 161, 162, 163, 164, 165, 166, 170, and 190 (polymeric copolymers)", and "BYK-P104 and P105 (high molecular unsaturated polycarboxylic acid)" manufactured by BYK-Chemie; "EFKA 4047, 4050 to 4010 to 4165 (polyurethane-based), EFKA 4330 to 4340 (block copolymer), 4400 to 4402 (modified polyacrylate), 5010 (polyesteramide), 5765 (high molecular polycarboxylate), 6220 (aliphatic polyester), 6745 (phthalocyanine derivative), and 6750 (azo pigment derivative)" manufactured by EFKA; "AJISPER PB821, PB822, PB880, and PB881" manufactured by Ajinomoto Fine-Techno Co., Inc.; "FLOWLEN TG-710 (urethane oligomer)" and "POLYFLOW No. 50E, No. 300 (acrylic copolymer)" manufactured by KYOEISHA CHEMICAL Co., LTD.; "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd.; "DEMOL RN and N (naphthalene sulfonate formaldehyde condensate), MS, C, and SN-B (aromatic sulfonate formaldehyde condensate)", "HOMOGENOL L-18 (polymeric polycarboxylic acid)", "EMULGEN 920, 930, 935, and 985 (polyoxyethylene nonyl phenyl ether)", and "ACETAMINE 86 (stearylamine acetate)" manufactured by Kao Corporation; "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft polymers)" manufactured by The Lubrizol Corporation; "NIKKOL T106 (polyoxyethylene sorbitan monooleate) and MYS-IEX (polyoxyethylene monostearate)" manufactured by NIKKO CHEMICALS Co., Ltd.; "HINOACT T-8000E" and the like manufactured by Kawaken Fine Chemicals Co., Ltd.; "Organosiloxane Polymer KP341" manufactured by Shin-Etsu Chemical Co., Ltd.; "W001: Cationic Surfactant" manufactured by Yusho Co., Ltd.; non-ionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester; and anionic surfactants such as "W004, W005, and W017"; "EFKA-46, EFKA-47, EFKA-47EA, EFKA polymer 100, EFKA POLYMER 400, EFKA POLYMER 401, and EFKA POLYMER 450" manufactured by MORISHITA SANGYO Corporation; polymer dispersants such as "DISPERSE AID 6, DISPERSE AID 8, DISPERSE AID 15, and DISPERSE AID 9100" manufactured by SAN NOPCO Ltd.; "ADEKA PLURONIC L31, F38, L42, L44, L61, L64, F68, L72, P95, F77, P84, F87, P94, L101, P103, F108, L121, and P-123" manufactured by ADEKA CORPORATION; and "IONET (trade name) S-20" manufactured by Sanyo Chemical Industries, Ltd. In addition, "Acryl-Based FFS-6752" and "Acryl-Based FFS-187" manufactured by manufactured by Fujikura Kasei Co., Ltd.; "ACRYCURE RD-F8" manufactured by Nippon Shokubai Co., Ltd.; or "CYCLOMER P" manufactured by DAICEL-ALLNEX LTD. can also be used.

In addition, examples of a commercially available product of the amphoteric resin include AJISPUR PB821, AJISPUR PB822, and AJISPUR PB881 manufactured by Ajinomoto Fine Techno Co., Inc. as well as DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 manufactured by BYK-Chemie.

These polymer compounds may be used singly or in combination of two or more kinds thereof.

Furthermore, with regard to specific examples of the polymer compound, reference can be made to the polymer compounds described in paragraphs 0127 to 0129 of JP2013-249417A, the contents of which are incorporated herein by reference.

Moreover, as the dispersant, in addition to the above-mentioned polymer compounds, the graft copolymers in paragraphs 0037 to 0115 of JP2010-106268A (the sections of paragraphs 0075 to 0133 of the corresponding US2011/0124824A), the contents of which can be cited and incorporated herein by reference, can be used.

Furthermore, in addition to the above, the polymer compounds in paragraphs 0028 to 0084 of JP2011-153283A (the sections of paragraphs 0075 to 0133 of the corresponding US2011/0279759A), including constituents having a side chain structure formed by the bonding of acidic groups via a linking group, can be used, the contents of which can be cited and incorporated herein by reference.

The content of the dispersant in the composition (the curable composition X and the curable composition Y) of the present invention is preferably 0.1% to 50% by mass, and more preferably 0.5% to 30% by mass, with respect to the total solid content of the composition.

<Curable Composition Y>

Next, the respective components included in the curable composition Y will be described in detail.

(d) Fluorine-Containing Polymer Y

The fluorine-containing polymer Y includes a repeating unit represented by Formula (A), a repeating unit represented by Formula (B), and a repeating unit having a polymerizable group on a side chain.

Examples of the polymerizable group include a (meth) acryloyloxy group, an epoxy group, and an oxetanyl group. The repeating unit having a polymerizable group on the side chain is preferably, for example, a repeating unit derived from ethylenically unsaturated monomers having the polymerizable group. By incorporation of the repeating unit having a polymerizable group on the side chain, it is possible to improve the chemical resistance of a cured film.

In the present invention, from the viewpoint of further improving the chemical resistance, it is preferable that the repeating unit having a polymerizable group on the side chain is a repeating unit represented by Formula (C).

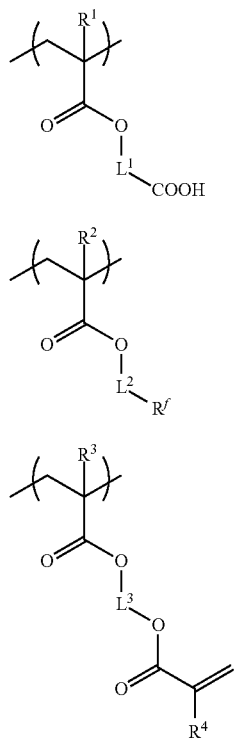

In Formula (A), $R^1$ represents a hydrogen atom or an alkyl group, and $L^1$ represents a divalent chained linking group having 3 or more carbon atoms in total, which may include an ester bond.

In Formula (B), $R^2$ represents a hydrogen atom or an alkyl group, $L^2$ represents a single bond or divalent linking group, and $R^f$ represents a monovalent organic group including an fluorine atom.

In Formula (C), $R^3$ represents a hydrogen atom or an alkyl group, $L^3$ represents a single bond or divalent linking group, and $R^4$ represents an alkyl group.

In the fluorine-containing polymer Y, a definition and a suitable range of the repeating unit represented by Formula (A) and repeating unit represented by Formula (B) are the same as those of the repeating unit represented by Formula (A) and the repeating unit represented by Formula (B) of the above-mentioned fluorine-containing polymer X. By incorporation of the repeating unit (preferably the repeating unit represented by Formula (C)) having a polymerizable group on the side chain into the fluorine-containing polymer Y, it is possible to further improve the chemical resistance.

Since the fluorine-containing polymer Y includes the repeating unit (preferably the repeating unit represented by Formula (C)) having a polymerizable group on the side chain in the polymer, and has a polymerizable group in the structure, it is not necessary to use a polymerizable compound in combination therewith as in the above-mentioned fluorine-containing polymer X. However, from the viewpoint of superior developability, it is preferable to use the polymerizable compound in combination with the others.

In a case of using the polymerizable compound in combination with the others, the polymerizable compound to be used in combination with the above-mentioned fluorine-containing polymer X can be used.

Hereinafter, the repeating unit represented by Formula (C) will be described.

In the repeating unit represented by Formula (C), $R^3$ represents a hydrogen atom or an alkyl group. $R^3$ is preferably a hydrogen atom or an alkyl group having 1 to 5 carbon atoms, more preferably a hydrogen atom or an alkyl group having 1 to 3 carbon atoms, and particularly preferably a hydrogen atom or a methyl group.

Incidentally, $L^3$ represents a single bond or a divalent linking group. In a case where $L^3$ represents a divalent linking group, examples of the divalent linking group include an alkylene group, an arylene group, —$NR^{12}$—, —$CONR^{12}$—, —CO—, —$CO_2$—, $SO_2NR^{12}$—, —O—, —S—, —$SO_2$—, or a combination thereof. Among those, a combination of at least one selected from the group consisting of an alkylene group having 2 to 10 carbon atoms and an arylene group having 6 to 12 carbon atoms, or a group by combination of these groups with at least one group selected from the group consisting of —$NR^{12}$—, —$CONR^{12}$—, —CO—, —$CO_2$—, $SO_2NR^{12}$—, —O—, —S—, and $SO_2$— is preferable, and an alkylene group having 2 to 10 carbon atoms, —$CO_2$—, —O—, —CO—, —$CONR^{12}$—, or a group by combination of these groups is more preferable. Here, $R^{12}$ represents a hydrogen atom or a methyl group.

$R^4$ represents a hydrogen atom or an alkyl group. $R^4$ is preferably a hydrogen atom or an alkyl group having 1 to 5 carbon atoms, more preferably a hydrogen atom or an alkyl group having 1 to 3 carbon atoms, and particularly preferably a hydrogen atom or a methyl group.

Examples of a commercially available product of a monomer which can serve as the repeating unit represented by Formula (C) include 701A manufactured by Shin-Nakamura Chemical Industry Co., Ltd., and LIGHT ACRYLATE 3EG-A manufactured by Kyoeisha Chemical Co., Ltd., but structures having a hydrophilic group give adverse effects on uneven distribution on the surface, and therefore, it is preferable that the structures do have the hydrophilic group.

Specific examples of the repeating unit represented by Formula (C) include the following ones, but the present invention is not limited thereto.

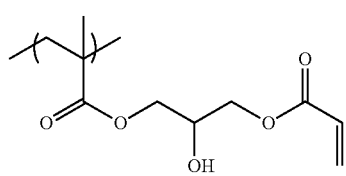

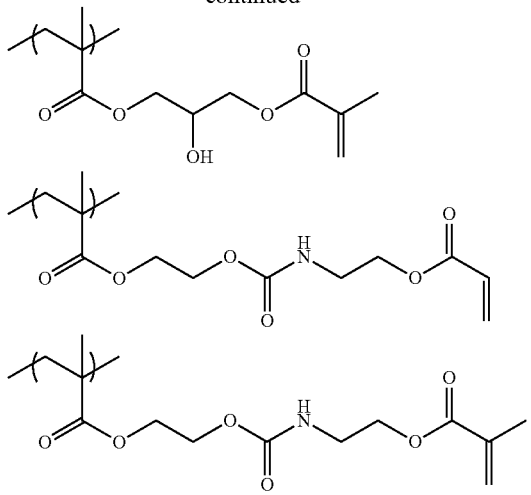

The proportion of the repeating unit (preferably the repeating unit represented by Formula (C)) having a polymerizable group on the side chain in the fluorine-containing polymer Y is preferably 1% to 30% by mole, more preferably 1% to 20% by mole, and most preferably 5% to 10% by mole, with respect to all the repeating units of the fluorine-containing polymer Y. By setting the proportion of the repeating unit represented by the repeating unit having a polymerizable group on the side chain within the range, the chemical resistance is further improved, which is thus effective.

Moreover, suitable ranges of the acid value, the weight-average molecular weight, and the dispersity (weight-average molecular weight/number-average molecular weight) of the fluorine-containing polymer Y are the same as those of the acid value, the weight-average molecular weight, and the dispersity (weight-average molecular weight/number-average molecular weight) of the above-mentioned fluorine-containing polymer Y.

A coloring agent is included in the curable composition Y. The definition of the coloring agent is the same as that of the coloring agent included in the above-mentioned curable composition X. Further, a range of the coloring agent in the curable composition Y is the same as that of the coloring agent in the above-mentioned curable composition X.

In addition, as described above, the polymerizable compound may further be included in the curable composition Y. The definition of the polymerizable compound is the same as that of the polymerizable compound included in the above-mentioned curable composition X. In addition, the content range of the polymerizable compound in the curable composition Y is the same as the polymerizable compound included in the above-mentioned curable composition X.

<Other Optional Components>

Other components other than the above-mentioned respective main components may also be included in the curable compositions X and Y (hereinafter collectively referred to as "the composition of the present invention").

Hereinafter, various optional components will be described in detail.

[Polymerization Initiator]

The composition of the present invention may contain a polymerization initiator.

The polymerization initiator is not particularly limited and can be appropriately selected from known polymerization initiators, and for example, a polymerization initiator having photosensitivity (a so-called photopolymerization initiator) is preferable.

The photopolymerization initiator is not particularly limited as long as it has a function of initiating polymerization of the polymerizable compound, and can be appropriately selected from known photopolymerization initiators. For example, a photopolymerization initiator having photosensitivity with respect to light rays in a range ranging from an ultraviolet region to visible light are preferable. Further, the photopolymerization initiator may be either an activator which interacts with a photo-excited sensitizer in a certain action and produces active radicals or an initiator which initiates cationic polymerization according to the type of monomer.

In addition, it is preferable that the photopolymerization initiator contains at least one kind of compound having at least a molar light absorption coefficient of about 50 in a range from about 300 nm to about 800 nm (more preferably 330 nm to 500 nm).

Examples of the photopolymerization initiator include halogenated hydrocarbon derivatives (for example, a derivative having a triazine skeleton and a derivative having an oxadiazole skeleton), acylphosphine compounds such as acylphosphine oxide, oxime compounds such as hexaaryl biimidazole and an oxime derivative, organic peroxide, thio compounds, ketone compounds, aromatic onium salts, ketoxime ethers, aminoacetophenone compounds, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A.

Furthermore, from the viewpoint of exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, and a 3-aryl-substituted coumarin compound are preferable.

More preferably, at least one kind of compound which is a trihalomethyl triazine compound, an α-aminoketone compound, an acylphosphine compound, a phosphine oxide compound, an oxime compound, a triallyl imidazole dimer, an onium compound, a benzophenone compound, or an acetophenone compound, and is selected from the group consisting of a trihalomethyl triazine compound, an α-aminoketone compound, an oxime compound, a triallyl imidazole dimer, and a benzophenone compound is particularly preferable.

In particular, in a case where the curable composition of the present invention is used for the manufacture of a light-shielding film of a solid-state imaging element, a micropattern needs to be formed in a sharp shape. Accordingly, it is important for the composition to have curability and to be developed without residues in an unexposed area. From such a viewpoint, it is preferable to use an oxime compound as a photopolymerization initiator. Particularly, in a case where a micropattern is formed in the solid-state imaging element, stepper exposure is used for exposure for curing. However, the exposure machine may be damaged by halogen in some cases, and the amount of the photopolymerization initiator to be added is required to be reduced. Taking this point into consideration, for forming a micropattern like a solid-state imaging element, it is preferable to use an oxime compound as the photopolymerization initiator in order to form a micropattern such as the solid-state imaging element. Further, by using the oxime compound, color migration properties can be improved.

With regard to specific examples of the photopolymerization initiator, reference can be made to the description in for example, paragraphs 0265 to 0268 of JP2013-29760A, the contents of which are incorporated herein by reference.

As the photopolymerization initiator, a hydroxyacetophenone compound, an aminoacetophenone compound, and an acylphosphine compound can also suitably be used. More specifically, for example, the aminoacetophenone-based initiators described in JP1998-291969A (JP-H10-291969A) and the acylphosphine-based initiators described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used.

As the aminoacetophenone-based initiator, IRGACURE-907, IRGACURE-369, and IRGACURE-379EG (trade names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used.

IRGACURE-819 or DAROCUR-TPO (trade name, all manufactured by BASF) which are commercially available products can be used as the acylphosphine-based initiator.

More preferred examples of the photopolymerization initiator include oxime compounds. In particular, oxime-based initiators are preferable since they have polymerization efficiency with high sensitivity, and can perform curing irrespective of the concentration of a color material, which makes it easier to design the concentration of the color material to be higher. Particularly, in a case of using the composition (the curable composition X or the curable composition Y) of the present invention, the fluorine-containing polymer X or the fluorine-containing polymer Y is unevenly distributed on the surface, and therefore, the concentration of a color material in an under layer thus formed is high in some cases, but in such cases, curing can be performed, irrespective of the concentration of the color material, which preferably makes it easier to design the concentration of the color material to be higher.

As the specific examples of the oxime compounds, the compound described in JP2001-233842A, the compound described in JP2000-80068A, and the compound described in JP2006-342166A can be used.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, examples of the oxime compound also include the compounds described in J. C. S. Perkin II (1979), pp. 1653-1660), J. C. S. Perkin II (1979), pp. 156-162, Journal of Photopolymer Science and Technology (1995), pp. 202-232, and each publication of JP2000-66385A, JP2000-80068A, JP2004-534797A, and JP2006-342166A, and the like.

As the commercially available products thereof, IRGACURE-OXE01 (manufactured by BASF) and IRGACURE-OXE02 (manufactured by BASF) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used.

Furthermore, as oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used.

With regard to preferred examples thereof, reference can be made to paragraphs 0274 to 0275 of JP2013-29760A, the contents of which are incorporated herein by reference.

Specifically, the oxime compound is preferably a compound represented by Formula (OX-1). Incidentally, the compound may be an oxime compound in which an N—O bond of oxime forms an (E) isomer, an oxime compound in which the N—O bond forms a (Z) isomer, or an oxime compound in which the N—O bond forms a mixture of an (E) isomer and a (Z) isomer.

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, a cycloalkylene group, or an alkynylene group is preferable. These groups may have one or more substituents. Examples of the substituent include the above-mentioned substituents.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, a compound represented by General Formula (1) or (2) can also be used as the photopolymerization initiator.

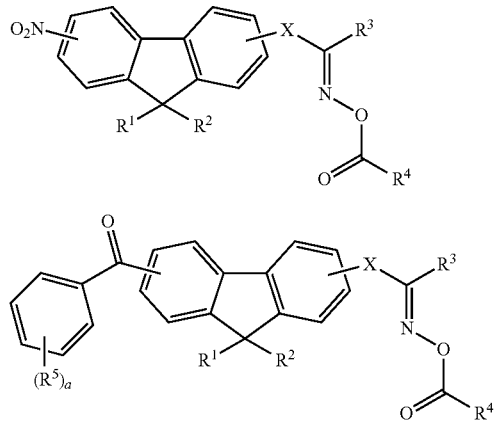

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, and in the case where $R^1$ and $R^2$ are phenyl groups, the phenyl groups may be bonded to each other to form a fluorene group; and $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ have the same definitions as $R^1$, $R^2$, $R^3$, and $R^4$ in Formula (1); $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group; $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; X represents a direct bond or a carbonyl group; and a represents an integer of 0 to 4.

In Formulae (1) and (2), $R^1$ and $R^2$ are each independently preferably a methyl group, an ethyl group, an n-propyl group, i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formulae (1) and (2) include the compounds described in paragraphs 0076 to 0079 of JP2014-137466A. The contents of the publications are incorporated herein by reference.

Specific examples of the oxime compound which is preferably used in the present invention are shown below, but the present invention is not limited thereto.

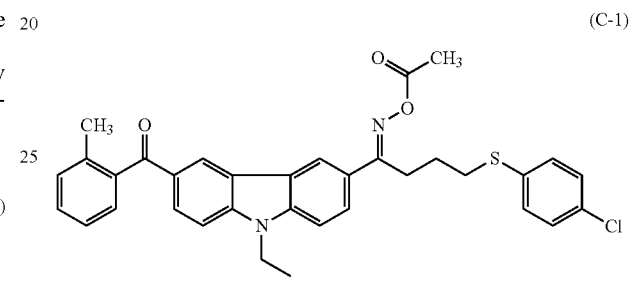

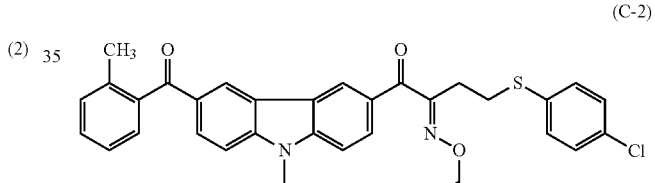

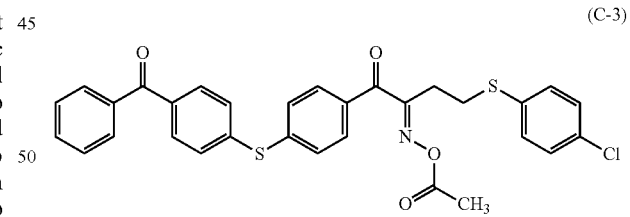

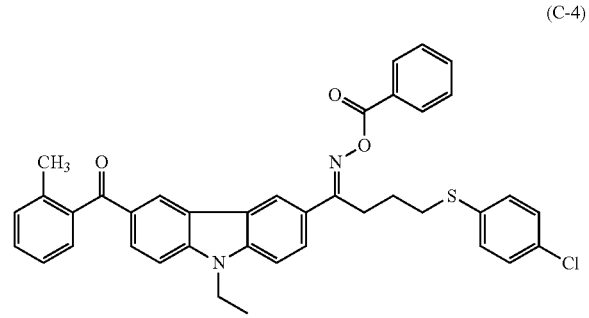

(C-5) 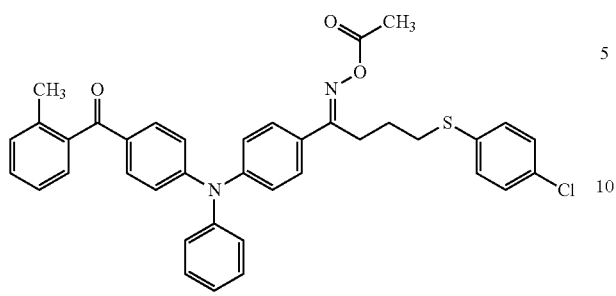

(C-6) 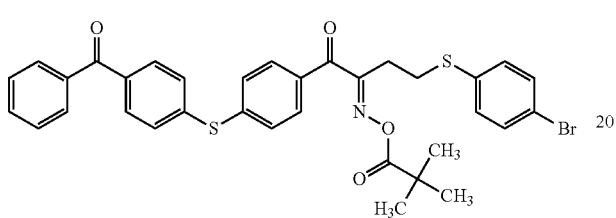

(C-7) 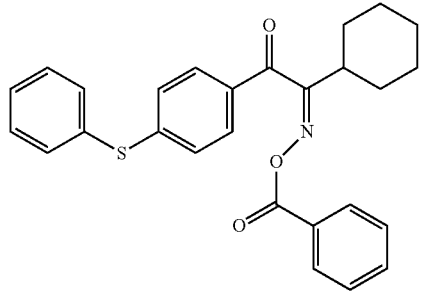

(C-8) 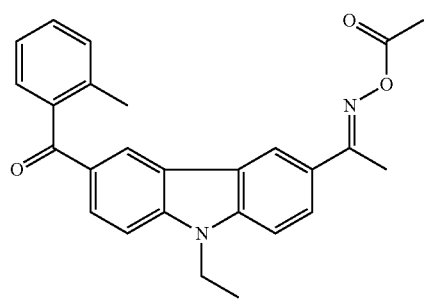

(C-9) 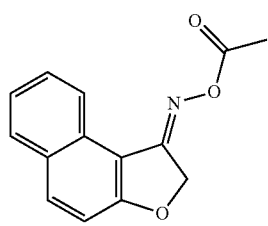

(C-10) 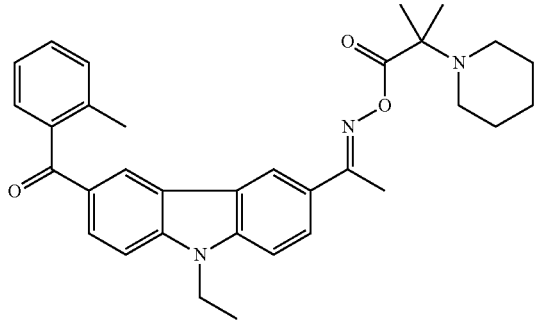

(C-11), (C-12) 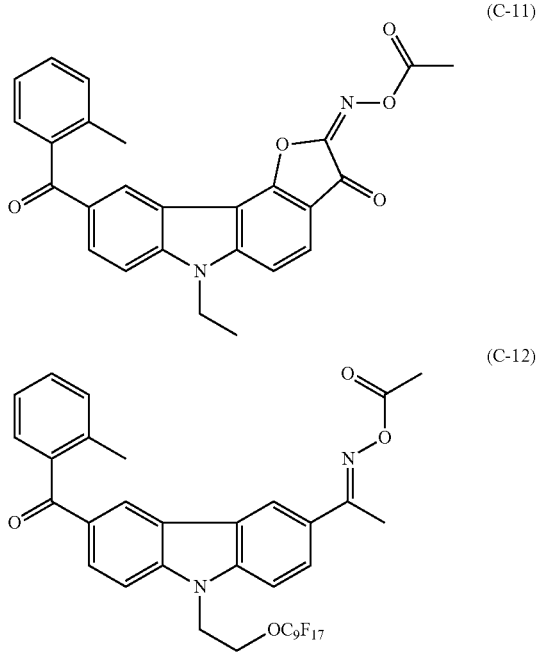

The oxime compound has a maximum absorption wavelength in a wavelength range of preferably 350 nm to 500 nm, and more preferably in a wavelength range of 360 nm to 480 nm, and an oxime compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000.

The molar light absorption coefficient of the compound can be measured using a known method. Specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

The photopolymerization initiator used in the present invention may be used in combination of two or more kinds thereof, as desired.

The content of the polymerization initiator is preferably 0.1% to 50% by mass, more preferably 0.5% to 30% by mass, and still more preferably 1% to 20% by mass, with respect to the total solid content of the curable composition. Within this range, better sensitivity and pattern forming properties are obtained. The curable composition of the present invention may include one kind or two or more kinds of the polymerization initiator. In a case where two or more kinds of the polymerization initiator are included, the total amount thereof is preferably within the range.

The content of the polymerization initiator in the composition (the curable composition X and the curable composition Y) of the present invention is preferably 0.1% to 30% by mass, more preferably 1% to 25% by mass, and still more preferably 1% to 10% by mass, with respect to the total solid content in the composition.

[Silane Coupling Agent]

The silane coupling agent is a compound having a hydrolyzable group and other functional groups in the molecule. Further, the hydrolyzable group such as an alkoxy group is bonded to a silicon atom.

The hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group has a carbon atom, the number of carbon atoms thereof is preferably 6 or less, and more preferably 4 or less. An alkoxy group having 4 or less carbon atoms or an alkenyloxy group having 4 or less carbon atoms is particularly preferable.

Moreover, in order to improve the adhesiveness between a substrate and a cured film, it is preferable that the silane coupling agent does not include any of a fluorine atom and a silicon atom (provided that a silicon atom to which the hydrolyzable group is bonded is excluded), and it is also preferable that the silane coupling agent does not include any of a fluorine atom, a silicon atom (provided that a silicon atom to which the hydrolyzable group is bonded is excluded), an alkylene group substituted with a silicon atom, a linear alkyl group having 8 or more carbon atoms, and a branched alkyl group having 3 or more carbon atoms.

The silane coupling agent preferably has a group represented by Formula (Z). * represents a binding position.

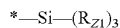

$$*-Si-(R_{Z1})_3 \quad \text{Formula (Z)}$$

In Formula (Z), $R_{Z1}$ represents a hydrolyzable group, and the definition thereof is as described above.

The silane coupling agent preferably has at least one curable functional group selected from the group consisting of a (meth)acryloyloxy group, an epoxy group, and an oxetanyl group. The curable functional group may be directly bonded to a silicon atom or may be bonded to a silicon atom via a linking group.

In addition, suitable aspects of the curable functional group contained in the silane coupling agent may also include a radically polymerizable group.

The molecular weight of the silane coupling agent is not particularly limited, and from the viewpoint of handleability, it is 100 to 1,000 in many cases, and from the viewpoint that the effects of the present invention are superior, is preferably 270 or more, and more preferably 270 to 1,000.

One suitable aspect of the silane coupling agent may include a silane coupling agent X represented by Formula (W).

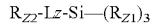

$$R_{Z2}\text{-}Lz\text{-}Si-(R_{Z1})_3 \quad \text{Formula (W)}$$

$R_{Z1}$ represents a hydrolyzable group, and the definition thereof is as described above.

$R_{Z2}$ represents a curable functional group, and a definition and suitable range thereof are each as described above.

Lz represents a single bond or a divalent linking group. In a case where Lz represents a divalent linking group, examples of the divalent linking group an alkylene group which may be substituted with a halogen atom, an arylene group which may be substituted with a halogen atom, $-NR^{12}-$, $-CONR^{12}-$, $-CO-$, $-CO_2-$, $SO_2NR^{12}-$, $-O-$, $-S-$, $-SO_2-$, and a group formed by a combination thereof. Among those, at least one selected from the group consisting of an alkylene group having 2 to 10 carbon atoms, which may be substituted with a halogen atom, and an arylene group having 6 to 12 carbon atoms, which may be substituted with a halogen atom, or a combination of these groups with at least one group selected from the group consisting of $-NR^{12}-$, $-CONR^{12}-$, $-CO-$, $-CO_2-$, $SO_2NR^{12}-$, $-O-$, $-S-$, and $SO_2-$ is preferable, and an alkylene group having 2 to 10 carbon atoms, which may be substituted with a halogen atom, $-CO_2-$, $-O-$, $-CO-$, $-CONR^{12}-$, or a group formed by a combination of these groups is more preferable. Here, $R^{12}$ represents a hydrogen atom or a methyl group.

Examples of the silane coupling agent X include N-β-aminoethyl-γ-aminopropyl-methyldimethoxysilane (trade name: KBM-602, manufactured by Shin-Etsu Chemical Co., Ltd.), N-β-aminoethyl-γ-aminopropyl-trimethoxysilane (trade name: KBM-603, manufactured by Shin-Etsu Chemical Co., Ltd.), N-β-aminoethyl-γ-aminopropyl-triethoxysilane (trade name: KBE-602, manufactured by Shin-Etsu Chemical Co., Ltd.), γ-aminopropyl-trimethoxysilane (trade name: KBM-903, manufactured by Shin-Etsu Chemical Co., Ltd.), γ-aminopropyl-triethoxysilane (trade name: KBE-903, manufactured by Shin-Etsu Chemical Co., Ltd.), 3-methacryloxypropyltrimethoxysilane (trade name: KBM-503, manufactured by Shin-Etsu Chemical Co., Ltd.), and glycidoxyoctyltrimethoxysilane (trade name: KBM-4803, manufactured by Shin-Etsu Chemical Co., Ltd.).

Other suitable aspects of the silane coupling agent include a silane coupling agent Y having at least a silicon atom, a nitrogen atom, and a curable functional group, as well as a hydrolyzable group bonded to the silicon atom in the molecule.

This silane coupling agent Y may have at least one silicon atom in the molecule, and the silicon atom may be bonded to the following atoms and substituents. They may be the same or different atoms or substituents. Examples of the atoms and substituents to which the silane coupling agent Y may be bonded include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituent may also further be substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamido group, an alkoxycarbonyl group, an amido group, a urea group, an ammonium group, an alkylammonium group, a carboxyl group or a salt thereof, a sulfo group or a salt thereof, or the like.

In addition, at least one hydrolyzable group is bonded to the silicon atom. The definition of the hydrolyzable group is as described above.

The silane coupling agent Y may include a group represented by Formula (Z).

The silane coupling agent Y has at least one nitrogen atom in the molecule, and the nitrogen atom is preferably present in the form of a secondary amino group or a tertiary amino group. That is, the nitrogen atom preferably has at least one organic group as a substituent. Further, the structure of the amino group may be present in the form of a partial structure of a nitrogen-containing heterocycle in a molecule, or may also be present as a substituted amino group such as aniline.

Here, examples of the organic group include an alkyl group, an alkenyl group, an alkynyl group, an aryl group, or a combination thereof. These may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamido group, an alkoxycarbonyl group, a carbonyloxy group, an amido group, a urea group, an alkyleneoxy group, an ammonium group, an alkylammonium group, a carboxyl group or a salt thereof, and a sulfo group.

In addition, the nitrogen atom is preferably bonded to the curable functional group via an arbitrary organic linking group. Preferred examples of the organic linking group include the above-mentioned substituents which can be introduced to the nitrogen atom and an organic group bonded thereto.

The definition of the curable functional group contained in the silane coupling agent Y is as described above and a suitable range of the group is as described above.

The silane coupling agent Y may have at least one curable functional group in one molecule thereof. Further, an aspect in which the silane coupling agent Y has two or more curable functional groups can be employed, and from the viewpoints of sensitivity and stability, an aspect in which the silane coupling agent Y has 2 to 20 curable functional groups is preferable, an aspect in which the silane coupling agent Y has 4 to 15 curable functional groups is more preferable, and an aspect in which the silane coupling agent Y has 6 to 10 curable functional groups in a molecule is the most preferable.

The molecular weights of the silane coupling agent X and the silane coupling agent Y are not particularly limited, and may include the above-mentioned ranges (a range of 270 or more being preferable).

The content of the silane coupling agent in the composition (the curable composition X and the curable composition Y) of the present invention is preferably 0.1% to 10% by mass, more preferably 0.5% to 8% by mass, and still more preferably 1.0% to 6% by mass, with respect to the total solid content of the composition.

Furthermore, the weight ratio of the silane coupling agent to the above-mentioned fluorine-containing polymer X or fluorine-containing polymer Y in the composition is preferably 0.1 to 20, and from the viewpoint of satisfying both of low reflectivity and linearity, the weight ratio is more preferably 0.2 to 15, and particularly preferably 0.3 to 10.

The composition of the present invention may include one kind or two or more kinds of silane coupling agent. In a case where the composition includes two or more kinds of the silane coupling agent, a total of the silane coupling agents only needs to be in the range.

[Resin]

The composition of the present invention preferably contains a resin. Further, the resin does not include the above-mentioned fluorine-containing polymers X and Y, and the silane coupling agent. That is, the resin is a resin which is different from the fluorine-containing polymers X and Y, and the silane coupling agent.

Examples of the resin include a binder polymer (hereinafter denoted as an alkali-soluble resin in some cases). Further, the alkali-soluble resin which will be described later may be included as a pigment dispersant.

Hereinafter, these will be described in detail.

(Binder Polymer)

The composition of the present invention may further contain a binder polymer.

A linear organic polymer is preferably used as the binder polymer. Any known linear organic polymer may be used arbitrarily as the linear organic polymer. Preferably, a linear organic polymer which is soluble or swellable in water or weakly alkaline water is chosen so as to allow water development or weakly alkaline water development. Among those, an alkali-soluble resin (resin having a group enhancing alkali solubility) is particularly preferable as the binder polymer.

The binder polymer may be a linear organic high-molecular-weight polymer, and can be appropriately selected from alkali-soluble resins having at least one group enhancing alkali solubility in a molecule (preferably a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali solubility (hereinafter also referred to as an acid group) include a carboxyl group, a phosphoric acid group, a sulfonic acid group, and a phenolic hydroxyl group, and is preferably a group which is soluble in an organic solvent and can be developed by an aqueous weak alkaline solution, and particularly preferably a (meth)acrylic acid group. These acid groups may be used singly or in combination of two or more kinds thereof.

Examples of the binder polymer include radical polymers having a carboxylic acid group in the side chain, for example, those described in JP1984-44615A (JP-S59-44615A), JP1979-34327B (JP-S54-34327B), JP1983-12577A (JP-S58-12577A), and JP1979-25957B (JP-S54-25957B), JP1979-92723A (JP-S54-92723A), JP1984-53836A (JP-S59-53836A), and JP1984-71048A (JP-S59-71048A). Specifically, a resin obtained by homopolymerizing or copolymerizing a monomer having a carboxyl group; a resin obtained by homopolymerizing or copolymerizing a monomer having an acid anhydride, and subjecting the acid anhydride unit to hydrolysis, semi-esterification or semi-amidation; and an epoxy acrylate obtained by modifying an epoxy resin with an unsaturated monocarboxylic acid and an acid anhydride. Examples of the monomers having a carboxyl group include acrylic acid, methacrylic acid, itaconic acid, crotonic acid, maleic acid, fumaric acid, and 4-carboxylstyrene, and examples of the monomers having an acid anhydride include maleic anhydride. Further, similarly, other examples thereof include an acidic cellulose derivative having a carboxylic acid group in a side chain. In addition, an addition reaction product of a polymer having a hydroxyl group with a cyclic acid anhydride, and the like are useful.

Moreover, the acetal-modified polyvinyl alcohol-based binder polymers having an acid group as described in each publication of EP993966B, EP1204000B, JP2001-318463A, and the like are excellent in a balance between the film hardness and the developability, which is thus suitable.

In addition, polyvinyl pyrrolidone, polyethylene oxide and the like are also useful as the water-soluble linear organic polymer. In order to increase the hardness of the cured coating film, alcohol-soluble nylon, polyether which is a reaction product from 2,2-bis-(4-hydroxyphenyl)-propane and epichlorohydrin, and the like are also useful.

In particular, among those, a copolymer of [benzyl (meth) acrylate/(meth)acrylic acid/other optional addition-polymerizable vinyl monomers] and a copolymer of [allyl (meth) acrylate/(meth)acrylic acid/and other option addition-polymerizable vinyl monomers] are suitable in that they are excellent in a balance among the film strength, the sensitivity, and the developability.

Examples of the commercially available products thereof include ACRYLBASE FF-187 and FF-426 (manufactured by Fujikura Kasei Co., Ltd.), ACRYCURE RD-F8 (manufactured by Nippon Shokubai Co., Ltd.), and CYCLOMER P(ACA)230AA (manufactured by DAICEL-ALLNEX LTD).

For the production of the binder polymer, for example, a method implemented by a known radical polymerization method can be applied. Polymerization conditions such as a temperature, a pressure, the type and amount of a radical initiator, and the type of a solvent, and the like at the time of producing the alkali-soluble resin by a radical polymerization method can be easily set by those skilled in the art, and the conditions can also be determined experimentally.

Furthermore, it is also preferable that as the binder polymer, a polymer having a structural unit with a graft chain and a structural unit with an acid group (alkali-soluble group) is used.

The definition of the structural unit with a graft chain is the same as that of the structural unit with a graft chain, contained in the above-mentioned dispersant, and a suitable range therefor is also the same.

Examples of the acid group include a carboxylic acid group, a sulfonic acid group, a phosphoric acid group, and a phenolic hydroxyl group, and the acid is preferably at least one of a carboxylic acid group, a sulfonic acid group, or a phosphoric acid group, and particularly preferably a carboxylic acid group.

It is preferable that the polymer compound has at least one structural unit selected from structural units derived from monomers represented by General Formulae (vii) to (ix) as the structural unit with an acid group.

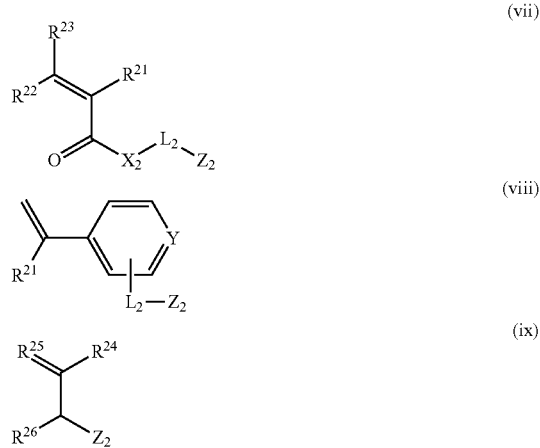

In General Formulae (vii) to (ix), $R^{21}$, $R^{22}$, and $R^{23}$ each independently represent a hydrogen atom, a halogen atom (for example, a fluorine atom, a chlorine atom, and a bromine atom), or an alkyl group (for example, a methyl group, an ethyl group, and a propyl group) having 1 to 6 carbon atoms.

In General Formulae (vii) to (ix), it is more preferable that $R^{21}$, $R^{22}$, and $R^{23}$ are each independently a hydrogen atom or an alkyl group having 1 to 3 carbon atoms, and it is still more preferable that $R^{21}$, $R^{22}$, and $R^{23}$ are each independently a hydrogen atom or a methyl group. In General Formula (vii), it is particularly preferable that $R^{21}$ and $R^{23}$ are each a hydrogen atom.

$X_2$ in General Formula (vii) represents an oxygen atom (—O—) or an imino group (—NH—), and is preferably an oxygen atom.

Furthermore, Y in General Formula (viii) represents a methine group or a nitrogen atom.

Moreover, $L_2$ in General Formulae (vii) to (ix) represents a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino bond (—NR$^{41'}$— in which R$^{41'}$ is an aliphatic group, an aromatic group, or a heterocyclic group), a carbonyl bond (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. As the aliphatic group, a saturated aliphatic group is more preferable than an unsaturated aliphatic group. The aliphatic group may have a substituent. Examples of the substituents include a halogen atom, a hydroxyl group, an aromatic group, and a heterocyclic group.

The number of carbon atoms in the above-mentioned divalent aromatic group is preferably 6 to 20, more preferably 6 to 15, and most preferably 6 to 10. The aromatic group may have a substituent. Examples of the substituents include a halogen atom, a hydroxyl group, an aliphatic group, an aromatic group, and a heterocyclic group.

The divalent heterocyclic group preferably has a 5- or 6-membered ring as the heterocyclic ring. One or more of another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—R$^{42}$ in which R$^{42}$ represents an aliphatic group, an aromatic group, or a heterocyclic group), an aliphatic group, an aromatic group, and a heterocyclic group.

It is preferable that $L_2$ is a single bond, an alkylene group, or a divalent linking group containing an oxyalkylene structure. It is more preferable that the oxyalkylene structure is an oxyethylene structure or an oxypropylene structure. Further, $L_2$ may include a polyoxyalkylene structure including two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n- in which n is preferably an integer of 2 or more, and more preferably an integer of 2 to 10.

In General Formulae (vii) to (ix), $Z_2$ is an acid group, and is preferably a carboxylic acid group.

In General Formula (ix), $R^{24}$, $R^{25}$, and $R^{26}$ each independently represents a hydrogen atom, a halogen atom (for example, fluorine, chlorine, and bromine), an alkyl group having 1 to 6 carbon atoms (for example, a methyl group, an ethyl group, and a propyl group), —$Z_2$, or -$L_2$-$Z_2$. Here, $L_2$ and $Z_2$ have the same definitions as $L_2$ and $Z_2$ above, respectively, and the preferred examples thereof are also the same. It is preferable that $R^{24}$, $R^{25}$, and $R^{26}$ each independently represent a hydrogen atom or an alkyl group having 1 to 3 carbon atoms, and more preferably a hydrogen atom.

In the present invention, as the monomer represented by General Formula (vii), a compound in which $R^{21}$, $R^{22}$, and $R^2$ are each independently a hydrogen atom or a methyl group, $L_2$ is an alkylene group or a divalent linking group containing an oxyalkylene structure, $X_2$ is an oxygen atom or an imino group, and $Z_2$ is a carboxylic acid group is preferable.

Furthermore, as the monomer represented by General Formula (vii), a compound in which $R^{21}$ is a hydrogen atom or a methyl group, $L_2$ is an alkylene group, $Z_2$ is a carboxylic acid group, and Y is a methine group is preferable.

In addition, as the monomer represented by General Formula (ix), a compound in which $R^{24}$, $R^{25}$, and $R^{26}$ are each independently a hydrogen atom or a methyl group, and $Z_2$ is a carboxylic acid group is preferable.

The binder polymer can be synthesized by the same method as for the pigment dispersant having the above-mentioned structural unit with a graft chain, and also has the same preferred acid value and weight-average molecular weight as the pigment dispersant.

The binder polymer may have one kind or two or more kinds of the structural unit with an acid group.

The content of the structural unit with an acid group in terms of mass is preferably 5% to 95%, with respect to the total mass of the binder polymer, in terms of mass, and more preferably 10% to 90% from the viewpoint of suppressing a damage to image intensity caused by alkali development.

The content of the binder polymer in the composition (the curable composition X and the curable composition Y) of the present invention is preferably 0.1% to 30% by mass, and more preferably 0.3% to 25% by mass, with respect to the total solid content of the composition.

[Solvent]

The composition of the present invention may also contain a solvent.

Examples of the solvent include water and an organic solvent.

Examples of the organic solvents include, but are not limited to, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, ethyl acetate, butyl acetate, methyl lactate, and ethyl lactate.

The solvents may be used singly or in combination of two or more kinds thereof.

In a case of using the solvents in combination of two or more kinds thereof, it is particularly preferable that the solvents are composed of two or more selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, ethyl carbitol acetate, butyl carbitol acetate, propylene glycol methyl ether, and propylene glycol methyl ether acetate.

The amount of the solvent to be included in the composition (the curable composition X and the curable composition Y) of the present invention is preferably 10% to 90% by mass, and more preferably 20% to 85% by mass, with respect to the total mass of the composition.

[Other Components]

The composition of the present invention may also include an ultraviolet absorbent. Thus, the shape of the pattern can become superior (finer).

As the ultraviolet absorbent, ultraviolet absorbents such as salicylate-based, benzophenone-based, benzotriazole-based, substituted acrylonitrile-based, and triazine-based ultraviolet absorbents can be used. As for specific examples thereof, the compounds in paragraphs 0137 to 0142 of JP2012-068418A (paragraphs 0251 to 0254 of the corresponding US2012/0068292A) can be used, the contents of which can be cited and incorporated herein by reference.

In addition to those, a diethylamino-phenylsulfonyl-based ultraviolet absorbent (trade name: UV-503, manufactured by Daito Chemical Co., Ltd.), or the like is suitably used.

Examples of the ultraviolet absorbent include the compounds exemplified in paragraphs 0134 to 0148 of JP2012-32556A.

The composition of the present invention may or may not include the ultraviolet absorbent, but in a case where the composition includes the ultraviolet absorbent, the content of the ultraviolet absorbent is preferably 0.001% to 15% by mass, more preferably 0.01% to 10% by mass, and still more preferably 0.1% to 5% by mass, with respect to the total solid content of the composition.

From the viewpoint of further improving the coatability, various surfactants may be added to the composition of the present invention. As the surfactant, various surfactants such as a fluorine-based surfactant, a non-ionic surfactant, a cationic surfactant, an anionic surfactant, and a silicone-based surfactant can be used. Here, the fluorine-containing polymer X and the fluorine-containing polymer Y of the present invention are not included in the above-mentioned surfactants. In particular, the composition of the present invention can further improve the uniformity of the coating thickness or liquid saving properties in that the liquid characteristics (in particular, fluidity) are improved due to incorporation of a fluorine-based surfactant into the composition.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781F (all manufactured by DIC Corporation); FLUORAD FC430, FC431, and FC171 (all manufactured by Sumitomo 3M); and SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (all manufactured by Asahi Glass Co., Ltd.).

Specific examples of other surfactants include the surfactants described in paragraphs 0174 to 0177 of JP2013-249417A, the contents of which are incorporated herein by reference.

The surfactants may be used singly or in combination of two or more kinds thereof.

The amount of the surfactant to be added is preferably 0.001% to 2.0% by mass, and more preferably 0.005% to 1.0%/o by mass, with respect to the total mass of the composition.

In addition to the components, the following components may further be added to the composition of present invention. For example, a sensitizer, a co-sensitizer, a crosslinking agent, a curing accelerator, a filler, a thermal curing accelerator, a polymerization inhibitor, a plasticizer, a diluent, and an oleophilizing agent, and known additives such as an adhesion accelerator onto a substrate surface and other preparations (for example, electrically conductive particles, a filler, an antifoaming agent, a flame retardant, a leveling agent, a peeling accelerator, an antioxidant, a perfume, a surface tension adjuster, and a chain transfer agent) may also be added, as desired.

With regard to these components, reference can be made to, for example, the descriptions in paragraph Nos. 0183 to 0228 of JP2012-003225A ([0237] to [0309] of the corresponding US2013/0034812A), paragraph Nos. 0101 to 0102, paragraph Nos. 0103 to 0104, and paragraph Nos. 0107 to 0109 of JP2008-250074A, paragraph Nos. 0159 to 0184 of JP2013-195480A, and the like, the contents of which are incorporated herein by reference.

The concentration of the solid content of the composition of the present invention is preferably 5% to 50% by mass, and from the viewpoint of a balance between the light-shielding properties and the thickness of the colored layer thus formed, the concentration is more preferably 15% to 40% by mass.

[Method for Preparing Composition]

The composition of the present invention can be prepared by mixing the above-mentioned various components using a known mixing method (for example, a stirrer, a homogenizer, a high-pressure emulsifier, a wet-grinder, and a wet dispersing machine).

The composition of the present invention is preferably filtered by a filter for the purposes such as removal of a foreign substance and reduction in detects. The filter is used with no particular limitation as long as it is the one which has been used for filtration or the like in the related art. Examples of the filter include those made of a fluorocarbon resin such as polytetrafluoroethylene (PTFE); a polyamide resin such as nylon; and a polyolefin resin (including high-density and ultra-high-molecular-weight polyolefin resins) such as polyethylene and polypropylene (PP). Among these materials, polypropylene (including high-density polypropylene) or nylon is preferable.

The pore diameter of the filter is suitably approximately 0.1 to 7.0 µm, preferably approximately 0.2 to 2.5 µm, more preferably approximately 0.2 to 1.5 µm, and still more preferably 0.3 to 0.7 µm. Within the above range, fine foreign substances such as impurities, aggregates, and the like included in the pigment can be reliably removed while suppressing the filtration clogging of the pigment.

In a case where a filter is used, other filters may be combined. At that time, filtering at a first filter may be performed once or two or more times. When other filters are combined to perform filtering two or more times, it is preferable that a pore diameter at a filtering after a second filtering is larger than a pore diameter at a first filtering. In addition, first filters having different pore diameters within the above-mentioned range may be combined. As the pore diameter herein, reference may be made to nominal values of a filter maker. A commercially available filter may be selected from various filters provided by, for example, Pall Corporation, Advantec Toyo Kaisha, Ltd., Nihon Entegris K. K. (formerly Nippon Microlith Co., Ltd.), Kitz Micro Filter Corporation, or the like.

As a second filter, a filter formed of a material which is the same as the material for the above-mentioned first filter and the like can be used. The pore diameter of the second filter is suitably approximately 0.2 to 10.0 µm, preferably approximately 0.2 to 7.0 µm, and more preferably approximately 0.3 to 6.0 µm.

<Cured Film and Method for Producing the Same>

It is possible to form a cured film by using the above-mentioned composition.

The cured film thus formed has a bilayer structure with a colored layer (under layer) including the coloring agent (particularly a black pigment) and a coating layer (upper layer) formed of the fluorine-containing polymer X or Y, as described above in FIG. 1. In addition, the coating layer is usually a layer disposed on the side (air side) opposite to the substrate in the cured film disposed on the substrate.

The colored layer usually includes the above-mentioned coloring agent such as a black pigment.

The coating layer is a layer formed of the fluorine-containing polymer X or Y which is unevenly distributed in the vicinity of the surface of the coating film obtained by applying the composition, as main components. In addition, in the coating layer, the fluorine-containing polymer X or Y may also be reacted with other components (for example, a polymerizable compound). In addition, the coating layer does not include the coloring agent.

The refractive index of the cured film is preferably lower than that of the colored layer.

The thickness of the cured film is not particularly limited, and from the viewpoint that the effects of the present invention is superior, the thickness is preferably 0.2 to 25 µm, and more preferably 1.0 to 10 µm.

The thickness is an average thickness, which is a value obtained by measuring the thickness at arbitrary 5 or more points of the cured film, and arithmetically averaging the values.

The method for producing the cured film is not particularly limited, and examples thereof include a method in which the above-mentioned curable composition is applied onto a substrate to form a coating film, and the coating film is subjected to a curing treatment to produce a cured film.

The method for the curing treatment is not particularly limited, but examples thereof include a photocuring treatment and a thermal curing treatment, and from the viewpoint of easiness of pattern formation, the photocuring treatment (in particular, a curing treatment by irradiation with actinic rays or radiation) is preferable.

Furthermore, the type of a substrate to be used is not particularly limited. Among those, in a case where a cure film is disposed within a solid-state imaging element, and preferred examples of the substrate include various members (for example, an infrared cut filter, an outer peripheral portion of a solid-state imaging element, an outer peripheral portion of a wafer level lens, and a back surface of a solid-state imaging element) in a solid-state imaging device.

Examples of a suitable aspect in a case of producing a cured film in the pattern shape include an aspect including a step of applying the composition of the present invention onto a substrate to form a composition layer (hereinafter simply referred to as a "composition layer forming step"), a step of exposing the composition layer through a mask (hereinafter simply referred to as an "exposing step"), and a step of developing the composition layer after the exposure to form a cured film (cured film in the pattern shape) (hereinafter simply referred to as a "developing step").

Specifically, a cured film in the pattern shape can be produced by applying the composition of the present invention onto a substrate directly or through another layer by spin coating to form a composition layer (composition layer forming step), exposing the composition layer through a predetermined mask pattern by irradiation with actinic rays or radiation to cure only the coated film portion irradiated with light (exposing step), and performing development using an alkali developer (developing step).

Hereinafter, the respective steps in the aspect will be described.

[Composition Layer Forming Step]

In the composition layer forming step, the composition of the present invention is applied onto a substrate to form a composition layer.

The type of a substrate is not particularly limited, but in a case where a cured film is disposed in a solid-state imaging device, examples of the substrate include various members (for example, an infrared cut filter, an outer peripheral portion of a solid-state imaging element, an outer peripheral portion of a wafer level lens, and a back surface of a solid-state imaging element) in a solid-state imaging device.

As a method for applying the composition of the present invention on the substrate, various application methods such as spin coating, slit coating, an ink jet method, spray coating, rotation coating, cast coating, roll coating, and a screen printing method can be applied, with the spin coating being particularly preferable.

The composition applied to the substrate is usually dried under the conditions of a temperature of from 70° C. to 110° C. for a period from approximately 2 minutes to 4 minutes to form a composition layer.

[Exposing Step]

In the exposing step, the composition layer formed in the composition layer forming step is exposed through a mask by irradiation with actinic rays or radiation to cure only the coating film portion irradiated with light.

The exposure is preferably performed by the irradiation with radiation, and as the radiation that can be used at the time of performing the exposure, in particular, ultraviolet rays such as g-rays, h-rays, and i-rays are preferably used. The high-pressure mercury lamp is more preferred as the light source. The irradiation intensity is preferably from 5 mJ/cm$^2$ to 1,500 mJ/cm$^2$, and more preferably from 10 ml/cm$^2$ to 1,000 mJ/cm$^2$.

[Developing Step]

Following the exposing step, a developing treatment (developing step) is performed to elute a portion not irradiated with light in the exposing step into a developer, and as a result, only a photocured portion remains.

An organic alkaline developer is preferably used as the developer. The development temperature is usually from 20° C. to 30° C., and the development time is from 20 seconds to 90 seconds.

Examples of the aqueous alkaline solution include an inorganic developer in which any one selected from the group consisting of sodium hydroxide, potassium hydroxide, sodium carbonate, sodium hydrogen carbonate, sodium silicate, and sodium metasilicate is dissolved to a concentration of 0.001% to 10% by mass, and preferably 0.005% to 0.5% by mass, and an organic developer in which any one alkaline compound selected from the group consisting of aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo-[5,4,0]-7-undecene is dissolved to the above-mentioned concentration. For example, a suitable amount of a water-soluble organic solvent such as methanol and ethanol and/or a surfactant, or the like can also be added to the aqueous alkaline solution. Further, in a case where a developer formed of such an aqueous alkaline solution is used, the pattern is generally washed (rinsed) with pure water after development.

In addition, after performing the composition layer forming step, the exposing step, and the developing step, a curing step of curing the formed light-shielding film in the pattern shape by heating and/or exposure may also be carried out, if desired.

<Infrared Cut Filter Provided with Light-Shielding Film and Solid-State Imaging Device>

In a case of using a black pigment as the coloring agent, the above-mentioned cured film can be suitably applied as a so-called light-shielding film. Further, such the light-shielding film can be suitably applied to a solid-state imaging device.

Hereinafter, first, a first embodiment of the solid-state imaging device having the light-shielding film of the present invention will be described in detail.

Figure 2:
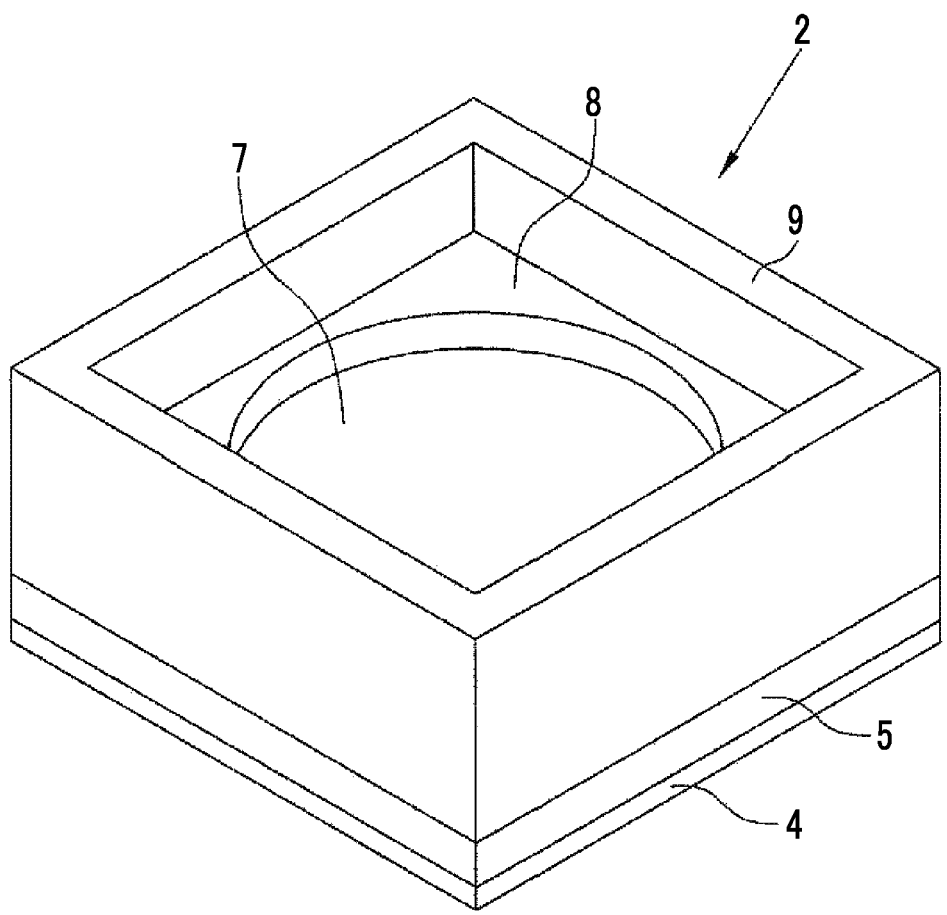
FIG. 2 is a perspective view illustrating a solid-state imaging device of a first embodiment.
Figure 3:
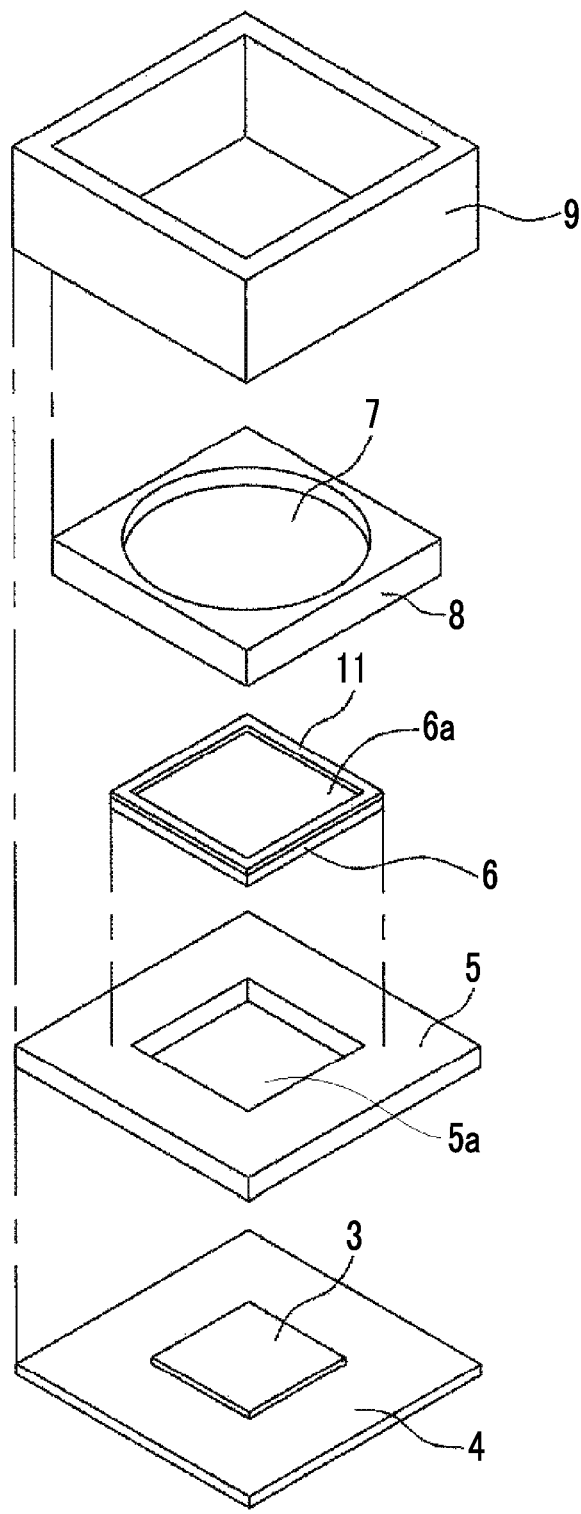
FIG. 3 is an exploded perspective view illustrating the solid-state imaging device of the first embodiment.

As shown in FIGS. 2 and 3, a solid-state imaging device 2 includes a CMOS sensor 3 as a solid-state imaging element, a circuit board 4 on which the CMOS sensor 3 is mounted and a ceramic substrate 5 made of ceramic, which supports the circuit board 4. Further, the solid-state imaging device 2 includes an IR cut filter 6 which is supported by the ceramic substrate 5 and cuts infrared light (IR) traveling toward the CMOS sensor 3, a taking lens 7, a lens holder 8 which holds the taking lens 7, and a holding barrel 9 which holds the lens holder 8 in a movable manner. In addition, a CCD sensor or an organic CMOS sensor may also be provided instead of the CMOS sensor 3.

The ceramic substrate 5 has the shape of a frame formed with an opening 5a to which the CMOS sensor 3 is inserted, and surrounds the sides of the CMOS sensor 3. In this state, the circuit board 4 on which the CMOS sensor 3 is mounted is fixed to the ceramic substrate 5 with an adhesive (for example, an epoxy-based adhesive, the same hereinafter). Various circuit patterns are formed in the circuit board 4.

The IR cut filter 6 has a reflective film which reflects infrared light on a plate-shaped glass or a blue glass, and the surface on which the reflective film is formed becomes an incident surface 6a. The IR cut filter 6 is formed with a size slightly greater than that of the opening 5a and fixed to the ceramic substrate 5 with the adhesive so as to cover the opening 5a.

The CMOS sensor 3 is disposed behind (in a lower portion in FIGS. 3 and 4) of the taking lens 7, and the IR cut filter 6 is disposed between the taking lens 7 and the CMOS sensor 3. The subject light is incident on a light receiving surface of the CMOS sensor 3 through the taking lens 7 and the IR cut filter 6. At this time, the infrared light is cut by the IR cut filter 6.

The circuit board 4 is connected to a control unit provided in an electronic machine (for example, a digital camera) in which the solid-state imaging device 2 is loaded, and power is supplied from the electronic machine to solid-state imaging device 2. A plurality of color pixels are arranged in two dimensions in the light receiving surface of the CMOS sensor 3, and each color pixel photoelectrically converts the incidence ray and accumulates a signal charge generated.

Figure 4:
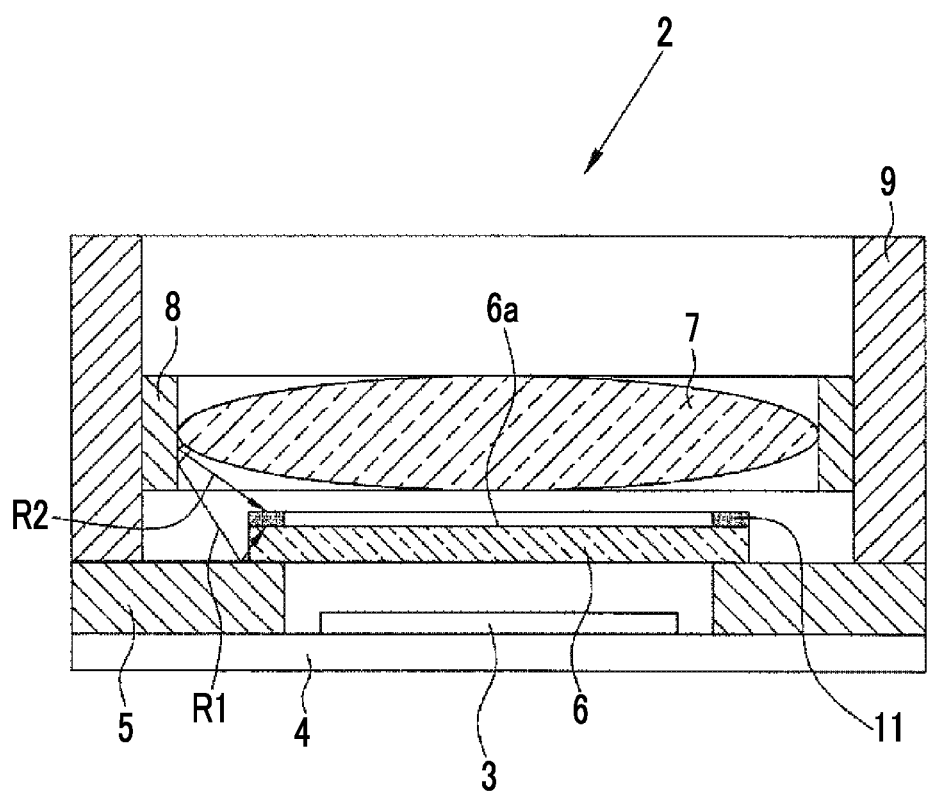
FIG. 4 is a cross-sectional view illustrating the solid-state imaging device of the first embodiment.

As shown in FIGS. 3 and 4, in the edge of the incident surface 6a of the IR cut filter 6, the light-shielding film (light-shielding layer) 11 is disposed around the entire periphery and an infrared cut filter provided with a light-shielding film is formed. In a case where reflected light R1 which is emitted from the taking lens 7 and reflected on the entire surface (the upper surface in FIGS. 3 and 4) of the ceramic substrate 5 is incident on the CMOS sensor 3 after being repeatedly reflected and refracted in the device, or a case where reflected light R2 which is emitted from the taking lens 7 and reflected on the inner wall of the lens holder 8 is incident on the CMOS sensor 3, the occurrence of flare is caused in the taken image. The light-shielding film 11 shields harmful light such as reflected light R1 and R2 toward the CMOS sensor 3. The light-shielding film 11 is applied by a spin coating method for a spray coating method, for example. In addition, the thickness of the light-shielding film 11 is drawn with exaggeration in FIGS. 3 and 4.

Figure 5:
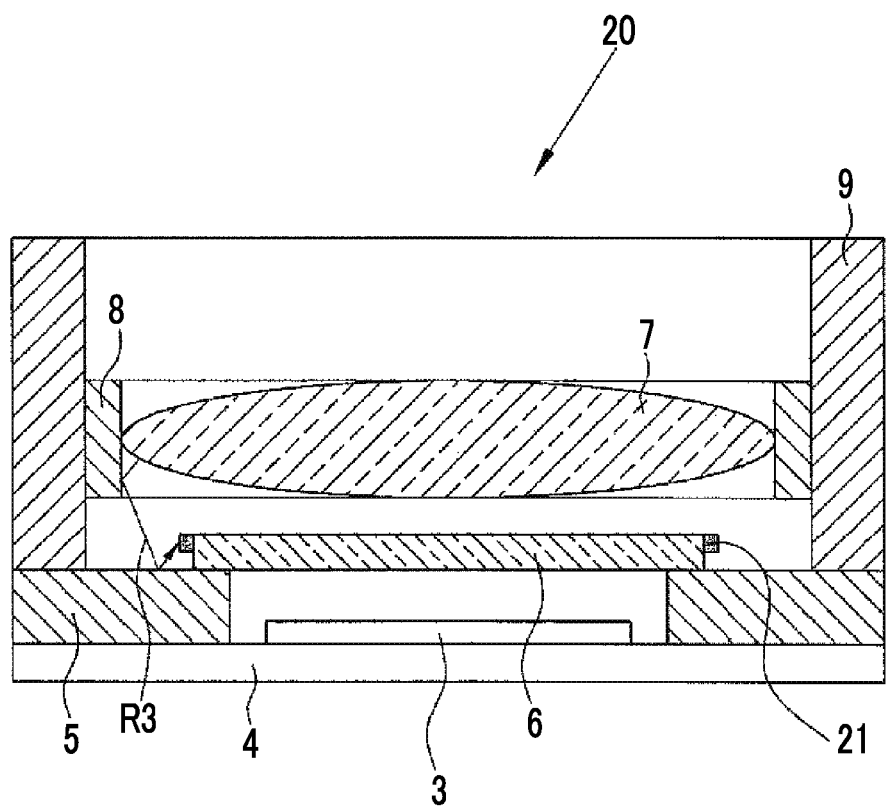
FIG. 5 is a cross-sectional view illustrating a solid-state imaging device of the second embodiment.

The solid-state imaging device 20 in a second embodiment is shown in FIG. 5. Further, the same constituent members as those in the first embodiment will be attached with the same symbols, with the detailed descriptions thereof being omitted.

The solid-state imaging device 20 includes the CMOS sensor 3, the circuit board 4, the ceramic substrate 5, the IR cut filter 6, the taking lens 7, the lens holder 8, and the holding barrel 9. The above-mentioned light-shielding film (light-shielding layer) 21 is disposed around the entire periphery on the side end surface of the IR cut filter 6. In a case where reflected light R3 which is emitted from the taking lens 7 and reflected on the entire surface of the ceramic substrate 5 is incident on the CMOS sensor 3 after being repeatedly reflected and refracted in the device, the occurrence of flare is caused in the taken image. The light-shielding film 21 shields harmful light such as reflected light R3 toward the CMOS sensor 3.

Figure 6:
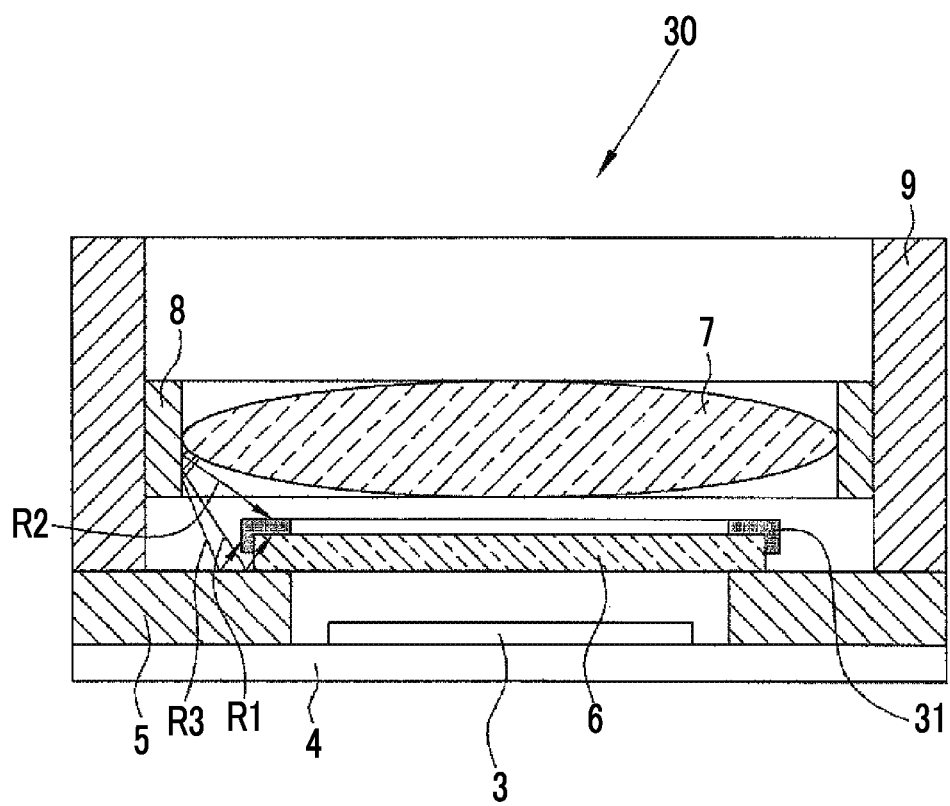
FIG. 6 is a cross-sectional view illustrating a solid-state imaging device of a third embodiment.

The solid-state imaging device 30 in a third embodiment is shown in FIG. 6. Further, the same constituent members as those in the first embodiment will be attached with the same symbols, with the detailed descriptions thereof being omitted.

The solid-state imaging device 30 includes the CMOS sensor 3, the circuit board 4, the ceramic substrate 5, the IR cut filter 6, the taking lens 7, the lens holder 8, and the holding barrel 9. The above-mentioned light-shielding film (light-shielding layer) 31 is disposed around the entire periphery on the edge and the side end surface of the incident surface 6a of the IR cut filter 6. That is, first, the second embodiment may also be combined therewith. In this embodiment, first, the light-shielding performance is enhanced, as compared with that in the second embodiment, and therefore, the occurrence of flare is reliably suppressed.

Figure 7:
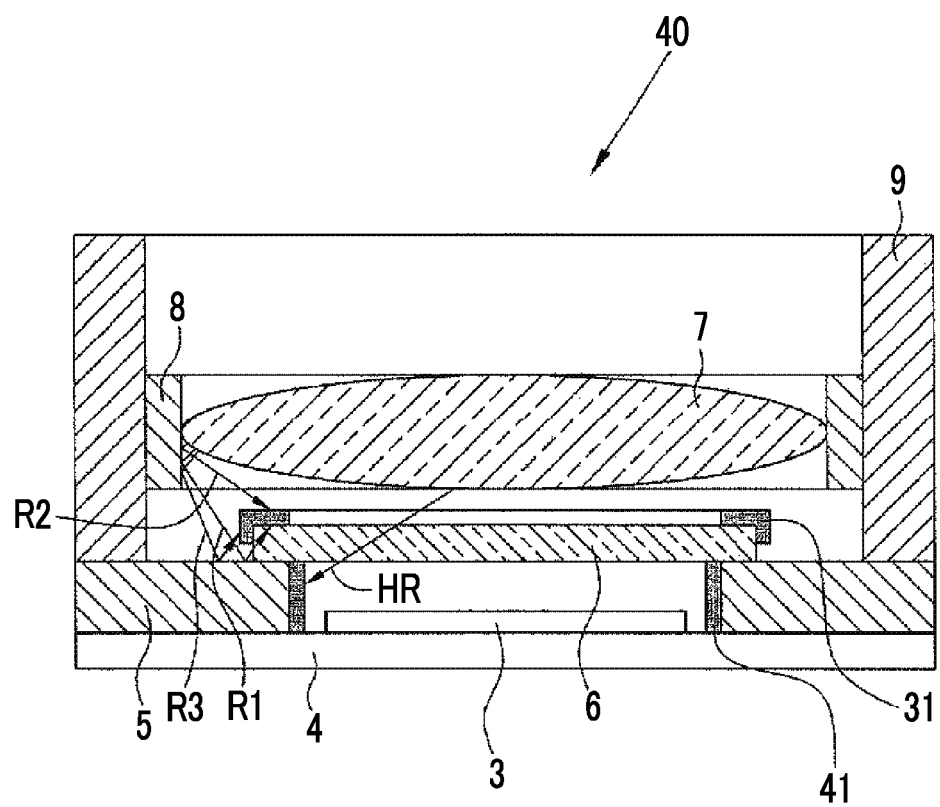
FIG. 7 is a cross-sectional view illustrating a solid-state imaging device of a fourth embodiment.

The solid-state imaging device 40 in a fourth embodiment is shown in FIG. 7. Further, the same constituent members as those in the first embodiment will be attached with the same symbols, with the detailed descriptions thereof being omitted.

The solid-state imaging device 40 includes the CMOS sensor 3, the circuit board 4, the ceramic substrate 5, the IR cut filter 6, the taking lens 7, the lens holder 8, and the holding barrel 9. The above-mentioned light-shielding film (light-shielding layer) 31 is disposed around the entire periphery on the edge and the side end surface of the incident surface 6a of the IR cut filter 6.

Furthermore, the light-shielding film (light-shielding layer) 41 is formed on the inner wall of the ceramic substrate 5. In a case where reflected light which is emitted from the taking lens 7, passes through the IR cut filter 6, and is reflected on the inner wall of the ceramic substrate 5 is incident on the CMOS sensor 3, the occurrence of flare is caused in the taken image. In this light-shielding film 41, the light-shielding performance is enhanced, as compared with the inner wall of the ceramic substrate 5, and therefore, the occurrence of flare is reliably suppressed.

<Color Filter>

Moreover, the cured film of the present invention can also be used in a color filter.

The color filter can be suitably used for a solid-state imaging element such as a charge coupled device (CCD) and a complementary metal-oxide semiconductor (CMOS), and is particularly suitable for a CCD, a CMOS, and the like with a high resolution, having more than 1,000,000 pixels. The color filter can be used as, for example, a color filter disposed between a light-receiving portion of each pixel constituting a CCD or a CMOS and a microlens for collecting light.

Furthermore, the color filter can be preferably used for an organic electroluminescence (organic EL) element. As the organic EL element, a white organic EL element is preferable. The organic EL element preferably has a tandem structure. The tandem structure of the organic EL element is described in JP2003-45676A, "Forefront of Organic EL Technology Development—Know-How Collection of High Brightness/High Precision/Long Life-", reviewed by Mikami Akiyoshi, Technical Information Institute, pp. 326 to 328, 2008, and the like. Examples of the tandem structure of the organic EL element include a structure in which an organic EL layer is provided between a lower electrode with light reflectivity and an upper electrode with light-transmitting properties on one side of a substrate. The lower electrode is preferably configured with a material having a sufficient reflectivity in a visible light wavelength range. The organic EL layer preferably has a lamination structure (tandem structure) including a plurality of light emitting layers, with the plurality of the light emitting layers laminated. The plurality of light emitting layers of the organic EL layer can include, for example, a red light emitting layer, a green light emitting layer, and a blue light emitting layer. Further, the organic EL layer preferably has a plurality of light emitting auxiliary layers for light emission of the light emitting layers, in addition to the plurality of light emitting layers. The organic EL layer can have, for example, a lamination structure in which a light emitting layer and a light emitting auxiliary layer are alternately laminated. An organic EL element having an organic EL layer such a structure can emit white light. In this case, it is preferable that a spectrum of white light which the organic EL element emits has strong maximum light emitting peaks at a blue region (430 nm to 485 nm), a green region (530 nm to 580 nm), and a yellow region (580 nm to 620 nm). It is more preferable that the spectrum additionally has a strong maximum light emitting peak at a red region (650 nm to 700 nm), in addition to the light emitting peaks. By combining an organic EL element (white organic EL element) that emits white light with the color filter of the present invention, an excellent spectrum in terms of color reproducibility is obtained, and thus, a clearer image or image can be displayed.

The film thickness of the colored pattern (colored pixel) in the color filter is preferably 2.0 µm or less, more preferably 1.0 µm or less, and still more preferably 0.7 µm or less. The lower limit can be set to, for example, 0.1 µm or more, or also to 0.2 µm or more.

Incidentally, the size (pattern width) of the colored pattern (colored pixel) is preferably 2.5 µm or less, more preferably 2.0 µm or less, and particularly preferably 1.7 µm or less. The lower limit can be set to, for example, 0.1 µm or more, or also to 0.2 µm or more.

<Image Display Device>

The cured film (the color filter, the light-shielding film, or the like) of the present invention can be used for an image display device such as a liquid crystal display device and an organic electroluminescence display device.

The definition of display devices or the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color Thin Film Transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as In Plane Switching (IPS), a pixel division system such as Multi-domain Vertical Alignment (MVA), or the like, or to Super-Twist Nematic (STN), Twisted Nematic (TN), Vertical Alignment (VA), on-chip spacer (OCS), fringe field switching (FFS), Reflective Optically Compensated Bend (R-OCB), and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. Since the color filter of the present invention has excellent light resistance or the like, a liquid crystal display device in a COA system which has high resolution and excellent long-term durability can be provided. In addition, in order to satisfy the characteristics required for a low dielectric constant, a resin-coated film may be provided on the color filter layer.

These image display systems are described in, for example, p. 43 of "EL, PDP, and LCD Display—Technologies and Recent Trend in Market—(TORAY RESEARCH CENTER, Research Department, published in 2001)", and the like.

The liquid crystal display device is constituted with various members such as an electrode substrate, a polarizing film, a retardation film, a backlight, a spacer, and a view angle compensation film, in addition to the color filter in the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", Issued in December 2005, pp. 18 to 24 (Yasuhiro Shima) and pp. 25 to 30 (Takaaki Yagi) of the document, and the like.

EXAMPLES

Hereinafter, the present invention will be described in more details with reference to Examples, but the present invention is not limited to the following Examples unless it does not exceed the gist thereof. Further, unless otherwise specified, "parts" and "%" are in terms of mass.

First, the fluorine-containing resins 1 to 9 used in Examples and Comparative Examples were synthesized by the following method.

Synthesis Example 1: Synthesis of Fluorine-Containing Resin 1

The fluorine-containing resin 1 was synthesized through the two steps shown below.

(Step 1: Synthesis of Fluorine-Containing Resin 1a)

—Composition 1—

| | |
|---|---|
| i6FMA <1,1,1,3,3,3-hexafluoroisopropyl methacrylate> | 5.98 g |
| 2-Hydroxyethyl methacrylate [monomer] | 5.98 g |
| M-5300 <ω-carboxy-polycaprolactone (n ≅ 2) monoacrylate> [manufactured by Toagosei Co., Ltd., monomer] | 2.56 g |
| 2,2'-Azobis(methyl 2-methylpropionate) [initiator] | 0.096 g |
| Propylene glycol monomethyl ether acetate [solvent] | 14.9 g |

The monomer solution for dropwise addition obtained by mixing the components shown in the composition 1 was added dropwise to 5.0 g of propylene glycol monomethyl ether acetate which had been heated to 80° C., for 3 hours in a nitrogen atmosphere.

Thereafter, 0.096 g of 2,2'-azobis(methyl 2-methylpropionate) was added to the reaction solution obtained above, and the mixture was warmed to 90° C. and then heated for 2 hours to adjust the concentration of the reaction solution to 30% by mass, thereby obtaining a fluorine-containing resin 1a shown below.

(Fluorine-Containing Resin 1a)

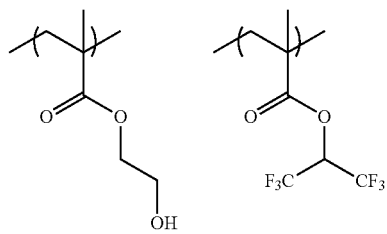

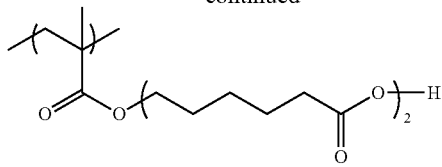

(Step 2: Synthesis of Fluorine-Containing Resin 1)

A solution of the fluorine-containing resin 1a obtained in the step 1, 0.014 g of dibutylhydroxytoluene, and 0.290 g of dioctoate dioctyltin (IV) were mixed and stirred at 50° C. Further, 0.522 g of methacryloyloxyethyl isocyanate ("KARENZ MOI", manufactured by Showa Denko K.K.) was added dropwise to the mixed solution obtained above for 1 hour. After completion of the dropwise addition, the mixed solution was stirred for 1 hour, and it was confirmed by nuclear magnetic resonance (NMR) that methacryloyloxyethyl isocyanate disappeared, thereby obtaining a fluorine-containing resin 1 shown below.

(Fluorine-Containing Resin 1)

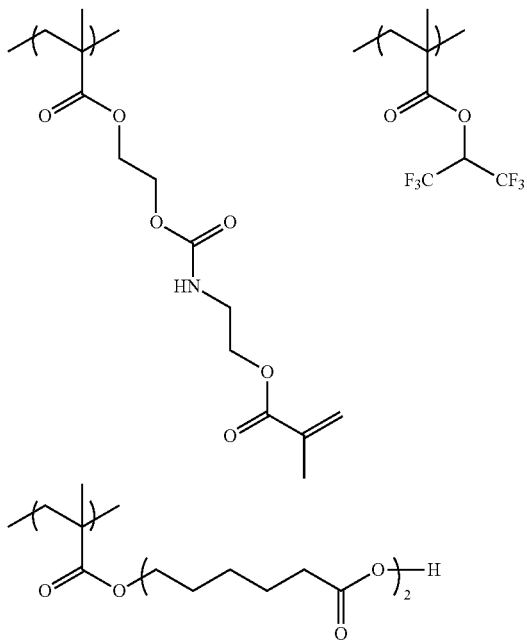

Synthesis Example 2: Synthesis of Fluorine-Containing Resin 2

—Composition 2—

| | |
|---|---|
| C6FMA <2-(perfluorohexyl)-ethyl methacrylate> [monomer] | 5.98 g |
| HO-MS <2-methacryloyloxyethylsuccinic acid> [manufactured by Kyoeisha Chemical Co., Ltd., monomer] | 2.56 g |
| 2,2'-Azobis(methyl 2-methylpropionate) [initiator] | 0.096 g |
| Propylene glycol monomethyl ether acetate [solvent] | 14.9 g |

The monomer solution for dropwise addition obtained by mixing the components shown in the composition 2 was added dropwise to 5.0 g of propylene glycol monomethyl ether acetate which had been heated to 80° C., for 3 hours in a nitrogen atmosphere.

Thereafter, 0.096 g of 2,2'-azobis(methyl 2-methylpropionate) was added to the reaction liquid obtained above, and the mixture was warmed to 90° C. and then heated for 2 hours to adjust the concentration of the reaction liquid to 30% by mass, thereby obtaining a fluorine-containing resin 2 shown below.

(Fluorine-Containing Resin 2)

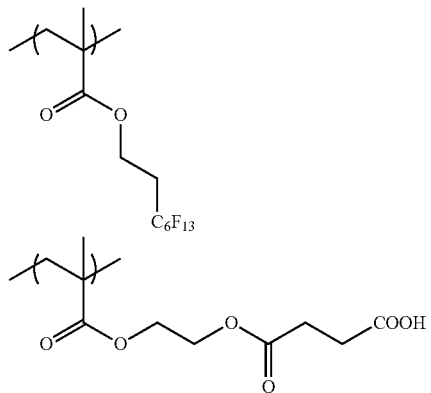

Synthesis Examples 3 to 9: Synthesis of Fluorine-Containing Resins 3 to 9

By the same procedure as in Synthesis Example 2 (the method for synthesizing the fluorine-containing resin 2) except that the monomers and the polymerization initiators used for the monomers for dropwise addition in the synthesis of the fluorine-containing resin 2 were each changed to the monomers and the polymerization initiators described in Table 1, fluorine-containing resins 3 to 9 were obtained.

The monomer compositions of the fluorine-containing resins 2 to 9, and the amounts of the polymerization initiators used in the synthesis of the fluorine-containing resins 2 to 9 are summarized in Table 1.

Furthermore, in Table 1, the units of the amounts of the monomers 1 and 2, and the initiator are all "g". Incidentally, the "amount" in the section of the initiator means the initial addition amount in "g" at a time when the initiator was mixed with the monomers.

In addition, in Table 1, MAA represents methacrylic acid.

TABLE 1

| Fluorine-containing polymer | Monomer 1 | | Monomer 2 | | Initiator |
|---|---|---|---|---|---|
| | Type | Amount (g) | Type | Amount (g) | Amount (g) |
| Fluorine-containing resin 2 | C6FMA | 5.98 | HO-MS | 2.56 | 0.096 |
| Fluorine-containing resin 3 | i6FMA | 5.12 | M-5300 | 3.41 | 0.096 |
| Fluorine-containing resin 4 | i6FMA | 5.98 | HO-MS | 2.56 | 0.096 |
| Fluorine-containing resin 5 | i6FMA | 15.4 | M-5300 | 2.1 | 0.096 |
| Fluorine-containing resin 6 | i6FMA | 16.1 | MAA | 2.8 | 0.096 |
| Fluorine-containing resin 7 | i6FMA | 1.71 | M-5300 | 6.83 | 0.096 |
| Fluorine-containing resin 8 | i6FMA | 3.86 | NK ESTER CB36 | 2.57 | 0.096 |
| Fluorine-containing resin 9 | i6FMA | 5.12 | M-5300 | 3.41 | 0.019 |

The structure, the weight-average molecular weight (Mw), the molecular weight distribution (Mw/Mn), and the acid value of each of the fluorine-containing resins 1 to 9 prepared above were summarized in Table 2.

TABLE 2

| Type | Structural formula | x/y/z (mol) | Weight-average molecular weight (Mw) | Molecular weight distribution (Mw/Mn) | Acid value (mgKOH/g) |
|---|---|---|---|---|---|
| Fluorine-containing resin 1 | | 6/57/37 | 11,000 | 2.0 | 77 |
| Fluorine-containing resin 2 | | 55/45 | 32,000 | 1.8 | 72 |
| Fluorine-containing resin 3 | | 66/34 | 8,970 | 1.7 | 75 |
| Fluorine-containing resin 4 | | 70/30 | 12,000 | 1.9 | 75 |

TABLE 2-continued

Fluorine-containing polymer

| Type | Structural formula | x/y/z (mol) | Weight-average molecular weight (Mw) | Molecular weight distribution (Mw/Mn) | Acid value (mgKOH/g) |
|---|---|---|---|---|---|
| Fluorine-containing resin 5 | (structure) | 90/10 | 7,300 | 2.0 | 24 |
| Fluorine-containing resin 6 | (structure) | 65/35 | 8,800 | 1.9 | 110 |
| Fluorine-containing resin 7 | (structure) | 20/80 | 10,000 | 1.8 | 155 |
| Fluorine-containing resin 8 | (structure) | 65/35 | 13,000 | 2.0 | 75 |
| Fluorine-containing resin 9 | (structure) | 66/34 | 51,000 | 2.3 | 75 |

Moreover, the weight-average molecular weight (Mw) and the molecular weight distribution (Mw/Mn) of each of the obtained fluorine-containing resins 1 to 9 were calculated by a gel permeation chromatography (GPC) method under the following measurement conditions.

Apparatus: HLC-8220GPC [manufactured by Tosoh Corporation]

Detector: Differential refractometer (RI detector)

Precolumn: TSK GUARD COLUMN MP (XL) 6 mm×40 mm [manufactured by Tosoh Corporation]

Columns for sample: The following four columns are directly connected [all manufactured by Tosoh Corporation] TSK-GEL Multipore-HXL-M 7.8 mm×300 mm Columns for reference: The same as those for the columns for the sample.

Constant-temperature tank temperature: 40° C.

Mobile phase: Tetrahydrofuran

Mobile phase flow rate for a sample: 1.0 mL/minute

Mobile phase flow rate for a reference: 0.3 mL/minute

Sample concentration: 0.1% by mass

Injection amount of sample: 100 μL

Data collection time: 16 minutes to 46 minutes after sample injection

Sampling pitch: 300 msec

Furthermore, in Table 2, the acid value was determined by neutralization titration using an aqueous sodium hydroxide solution. Specifically, a solution obtained by dissolving the obtained fluorine-containing resin in a solvent solution was titrated with the aqueous sodium hydroxide solution, using a potentiometric method, the number of millimoles of the acid included in 1 g of the solid of the fluorine-containing resin was calculated, and then the value was multiplied by 56.1, the molecular weight of KOH to determined the acid value <Preparation of Titanium Black Dispersion Liquid>
—Composition—

| | |
|---|---|
| (A) Titanium black (average primary particle diameter: 30 nm) | 45 parts |
| (B) Dispersant (resin 2 which will be described later) | 13.5 parts |

The components shown in the above composition were mixed and subjected to a dispersion treatment to obtain a dispersion.

Example 1: Preparation of Black Curable Composition M-1

Various components and cyclohexanone were mixed such that they have the composition in Table 3, using the titanium black dispersion liquid manufactured above, thereby obtaining a black curable composition M-1 having a solid content of 32%.

TABLE 3

| Composition | Name | wt % |
|---|---|---|
| Resin 1 | Specific resin A | 8.2 |
| Resin 2 (dispersant) | Specific resin B | 13.5 |
| Monomer | KAYARAD DPHA (manufactured by Nippon Kayaku Co., Ltd.) | 18.5 |
| Initiator | IRGACURE OXE02 (manufactured by BASF Japan) | 5.3 |
| Silane coupling agent | KBM-4803 (manufactured by Shin-Etsu Chemical Co., Ltd.) | 3 |
| Titanium black | — | 45 |
| Fluorine-containing resin 1 | — | 6.5 |
| Solvent | Cyclohexanone | — |

(Synthesis of Specific Resin A)

A specific resin A was obtained in accordance with the production method in paragraphs 0338 to 0340 of JP2010-106268A (refer to the specific resin 4 in the document). Further, the specific resin A has a skeleton of Formula (T), and in the formula, x was at 90% by mass, y was at 0% by mass, and z was at 10% by mass. Further, the specific resin A had a weight-average molecular weight of 40,000, an acid value of 100 mgKOH/g, and the number of atoms (excluding hydrogen atoms) in the graft chain of 117.

(Synthesis of Specific Resin B)

A specific resin B was synthesized with reference to the description in paragraphs 0219 to 0223 of JP2013-249417A (the specific resin 9 in the document). Further, the specific resin B has a skeleton of Formula (T), and in the formula, x was at 43% by mass, y was at 49% by mass, and z was at 8% by mass. Further, the specific resin B had a weight-average molecular weight of 30,000, an acid value of 60 mgKOH/g, and the number of atoms (excluding hydrogen atoms) in the graft chain of 117.

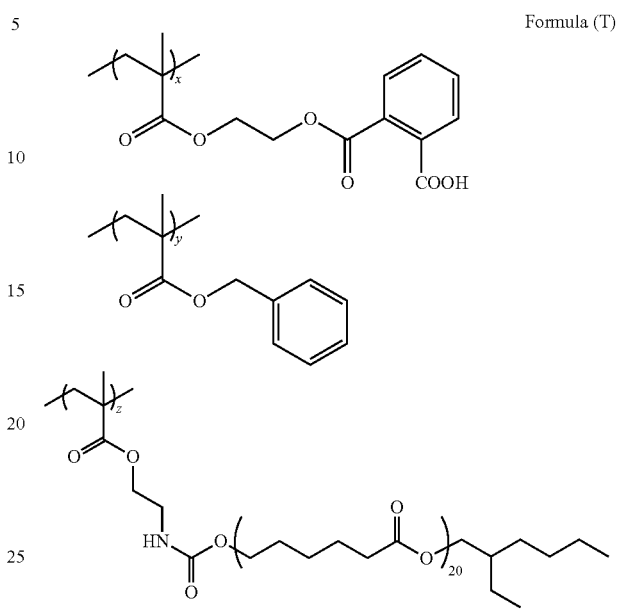

Formula (T)

Examples 1 to 9, and Comparative Examples 1 and 2

By the same method as in the preparation of the black curable composition M-1 except that the fluorine-containing resin 1 was changed, each of black curable compositions M-2 to M-9 was prepared. However, the black curable compositions M-3 of Examples 7 and 8 were prepared such that the compositions of the fluorine-containing resin 3 were 18 parts and 25 parts, respectively.

<Manufacture and Evaluation of Light-Shielding Color Filter for Solid-State Imaging Element>

[Black Curable Composition Layer Forming Step]

Any one of the black curable compositions M-1 to M-9 was uniformly applied onto a silicon wafer [support] while adjusting the rotation speed of the spin coat such that the film thickness of the application/heating treatment became 2.0 μm, and then a heating treatment was carried out for 120 seconds, using a hot plate at a surface temperature of 120° C., thereby obtaining a coating film [black curable composition layer] having a film thickness of 2.0 μm.

[Exposing Step]

Next, the coating film was irradiated (exposed) through a linear 300-μm mask (a width of 300 μm and a length of 4 mm) at an exposure dose of 200 mJ/cm$^2$, using an i-ray stepper, FPA-3000iS+ [manufactured by CANON Inc.].

[Developing Step]

After the irradiation (exposure), the coating film was subjected to puddle development with a 0.3% by mass aqueous tetramethylammonium hydroxide (TMAH) solution at 23° C. for a predetermined time.

[Post-Baking Step]

The coating film was further subjected to a heating treatment at 220° C. for 300 seconds, using a clean oven CLH-21CDH (manufactured by Koyo Thermo Systems Co., Ltd.).

[Evaluation]

The coating films and the patterns, each obtained as above, were evaluated.

<Developability>

With regard to the coating films obtained as above, the coating film which had not been exposed after the black curable composition layer forming step were evaluated on its developability in accordance with following evaluation standard. The development was carried out under the condition described in [Developing Step] above.

"A": The development was carried out for 30 seconds or less (all could be dissolved).

"B": The development could be carried out, but it took more than 30 seconds and 60 seconds or less for the development.

"C": The development could be carried out, but it took more than 60 seconds for the development.

"D": The development could not be carried out.

The evaluation results are shown in Table 4. In addition, the weight-average molecular weight (Mw) and the acid value (mgKOH/g) of the fluorine-containing polymer described in Table 4 are all the same as those described in Table 2.

<Reflectivity>

For the reflectivity evaluation, light at 400 to 800 nm was incident onto the manufactured cured film at an angle of incidence of 5°, and the reflectivity at a wavelength of 750 nm was measured using a spectrometer UV4100 manufactured by HITACHI High-Technologies Corporation. Further, the cured film used for the reflectivity evaluation was manufactured by the same procedure as in the manufacturing method above by carrying out the procedure until [Post-Baking Step], except that [Exposing Step] was carried out with the entire-surface exposure.

The results are shown in Tables 4 and 5.

"A": The reflectivity is 3% or less.

"B": The reflectivity is more than 3% and 5% or less.

"C": The reflectivity is more than 5%.

TABLE 4

| | Black curable composition | | Fluorine-containing polymer | | | |
|---|---|---|---|---|---|---|
| | Composition No. | Note | Type | Weight-average molecular weight (Mw) | Acid value (mgKOH/g) | Developability | Reflectivity @ 750 nm |
| Example 1 | M-1 | | Fluorine-containing resin 1 | 11,000 | 77 | B | A |
| Example 2 | M-2 | | Fluorine-containing resin 2 | 32,000 | 72 | B | A |
| Example 3 | M-3 | | Fluorine-containing resin 3 | 8,970 | 75 | A | A |
| Example 4 | M-4 | | Fluorine-containing resin 4 | 12,000 | 75 | B | A |
| Example 5 | M-5 | | Fluorine-containing resin 5 | 7,300 | 24 | C | A |
| Example 6 | M-7 | | Fluorine-containing resin 7 | 10,000 | 155 | A | B |
| Example 7 | M-3 | Amount of fluorine-containing resin: 18 parts by mass | Fluorine-containing resin 3 | 8,970 | 75 | A | A |
| Example 8 | M-3 | Amount of fluorine-containing resin: 25 parts by mass | Fluorine-containing resin 3 | 8,970 | 75 | A | B |
| Example 9 | M-9 | | Fluorine-containing resin 9 | 51,000 | 75 | B | A |
| Comparative Example 1 | M-6 | | Fluorine-containing resin 6 | 8,800 | 110 | D | C |
| Comparative Example 2 | M-8 | | Fluorine-containing resin 8 | 13,000 | 75 | D | C |

<Linearity>

The pattern obtained through [Post-Baking Step] above was observed with the naked eye using an electron microscope, and the linearity was evaluated in accordance with the following evaluation standard.

"A": The development could be carried out for 30 seconds or less, and the edge portion (the boundary portion of the exposed area and the unexposed area) could be developed with a clean straight line.

"B": The development could be carried out, but the edge portion of the pattern became a straight line in a rough shape.

"C": The edge portion of the pattern did not become a straight line due to poor development.

The results are shown in Table 5.

The evaluation results are shown in Table 5. Further, the weight-average molecular weight (Mw) and the acid value (mgKOH/g) of the fluorine-containing polymer described in Table 5 are all the same as those described in Table 2.

TABLE 5

| | Black curable composition | | Fluorine-containing polymer | | | | |
|---|---|---|---|---|---|---|---|
| | Composition No. | Note | Type | Weight-average molecular weight (Mw) | Acid value (mgKOH/g) | Linearity (LWR < 1 μm) | Reflectivity @ 750 nm |
| Example 1 | M-1 | | Fluorine-containing resin 1 | 11,000 | 77 | A | A |
| Example 2 | M-2 | | Fluorine-containing resin 2 | 32,000 | 72 | A | A |
| Example 3 | M-3 | | Fluorine-containing resin 3 | 8,970 | 75 | A | A |
| Example 4 | M-4 | | Fluorine-containing resin 4 | 12,000 | 75 | A | A |
| Example 5 | M-5 | | Fluorine-containing resin 5 | 7,300 | 24 | B | A |
| Example 6 | M-7 | | Fluorine-containing resin 7 | 10,000 | 155 | A | B |
| Example 7 | M-3 | Amount of fluorine-containing resin: 18 parts by mass | Fluorine-containing resin 3 | 8,970 | 75 | B | A |
| Example 8 | M-3 | Amount of fluorine-containing resin: 25 parts by mass | Fluorine-containing resin 3 | 8,970 | 75 | B | B |
| Example 9 | M-9 | | Fluorine-containing resin 9 | 51,000 | 75 | B | A |
| Comparative Example 1 | M-6 | | Fluorine-containing resin 6 | 8,800 | 110 | C | C |
| Comparative Example 2 | M-8 | | Fluorine-containing resin 8 | 13,000 | 75 | C | C |

As seen from Tables 4 and 5 above, it was confirmed that the cured films (Examples 1 to 9) formed from the black curable compositions M-1 to 5, 7, and 9 having the fluorine-containing resins 1 to 5, 7, and 9 containing long-chain acid groups having 3 or more carbon atoms had excellent developability and low reflectivity.

Furthermore, in Tables 4 and 5, from the comparison of Examples 3, 5, and 6 with different contents of the fluorine-containing resin in the black curable composition, it was confirmed that by incorporating 1% to 20% by mass of the fluorine-containing resin with respect to the total solid content of the composition, the developability, the linearity, and the low reflectivity were superior.

Moreover, in Tables 4 and 5, from the comparison of Examples 3, 7, and 8, it was confirmed that by setting the acid value of the fluorine-containing resin to 70 to 150 mgKOH/g, the developability, the linearity, and the low reflectivity were superior.

Incidentally, in Tables 4 and 5, from the comparison of Examples 3 and 9, it was confirmed that by setting the polymerization average molecular weight of the fluorine-containing resin to 5,000 to 50,000, superior developability and linearity were obtained.

Furthermore, in Table 4, from the comparison of Examples 2, 3, and 4, it was confirmed that by changing the long-chain acid group of the fluorine-containing resin to a longer-chain acid group (preferably having 5 or more carbon atoms in total, and more preferably having 10 or more carbon atoms in total), the developability was further improved.

In addition, it was confirmed that the fluorine-containing resin 1 in the black curable composition of Example 1 contains the repeating unit (preferably the repeating unit represented by Formula (C)) having a polymerizable group on the side chain, and as a result, the chemical resistance was excellent.

<Chemical Resistance>

For the coating film manufactured using the black curable composition of Example 1, the developer (aqueous 0.3% by mass trimethylammonium hydroxide (TMAH) solution) used in the developing step was continuously used for a long period of time, and thus, even when the coating film was immersed in a concentrated liquid of the concentrated developer for a long period of time, the exposed area did not become coarse, and maintained the clean state, as compared with the other samples. It could be seen that the chemical resistance was excellent.

<Coatability>

The black curable composition M-3 (Example 3) obtained above was applied using each of an ink jet method or a spray coating method, and evaluated in the same manner, and thus, the same results were obtained in each of the evaluations. Thereafter, in a case of repeatedly carrying out evaluations, there were cases where discharge bending occurred in the ink jet method and nozzle clogging occurred at the time of resumption in the spray coating method.

Example 3-A: Preparation of Black Curable Composition M-3-A and Pattern Formation By the same method as in Example 3 except that the amount of the fluorine-containing resin to be added was set to 3.0 parts, the weight ratio of the polymerizable compound to the fluorine-containing resin (the polymerizable compound/the fluorine-containing resin) was set to 0.7, and the solid was adjusted to the amount of cyclohexanone, a black curable composition M-3-A was prepared (the content of the fluorine-containing resin 3 with respect to the total solid content in the black curable composition M-3-A: 3.7% by mass).

By the same method as in Example 3 except that a coating film [black curable composition layer] was formed such that the film thickness became 3.0 μm after the coating/heating treatment, using the obtained black curable composition M-3-A, [Black Curable Composition Layer Forming Step] through [Post-Baking Step] were carried out, and pattern formation and evaluation were carried out.

Example 3-B: Preparation of Black Curable Composition M-3-B and Pattern Formation By the same method as in Example 3 except that the amount of the fluorine-containing resin to be added was set to 3.0 parts, the weight ratio of the polymerizable compound to the fluorine-containing resin (the polymerizable compound/the fluorine-containing resin) was set to 2.8, and the solid was adjusted to the amount of cyclohexanone, a black curable composition M-3-B was prepared (the content of the fluorine-containing resin 3 with respect to the total solid content in the black curable composition M-3-B: 3.5% by mass).

By the same method as in Example 3 except that a coating film [black curable composition layer] was formed such that the film thickness became 3.0 μm after the coating/heating treatment, using the obtained black curable composition M-3-B, [Black Curable Composition Layer Forming Step] through [Post-Baking Step] were carried out, and pattern formation and evaluation were carried out.

Example 3-C: Preparation of Black Curable Composition M-3-C and Pattern Formation By the same method as in Example 3 except that the amount of the fluorine-containing resin to be added was set to 3.0 parts, the weight ratio of the polymerizable compound to the fluorine-containing resin (the polymerizable compound/the fluorine-containing resin) was set to 11, and the solid was adjusted to the amount of cyclohexanone, a black curable composition M-3-C was prepared (the content of the fluorine-containing resin 3 with respect to the total solid content in the black curable composition M-3-C: 2.7% by mass).

By the same method as in Example 3 except that a coating film [black curable composition layer] was formed such that the film thickness became 3.0 μm after the coating/heating treatment, using the obtained black curable composition M-3-C, [Black Curable Composition Layer Forming Step] through [Post-Baking Step] were carried out, and pattern formation and evaluation were carried out.

Example 3-1: Pattern Formation of Black Curable Composition M-3

Furthermore, by the same method as in Example 3 except that a coating film [black curable composition layer] was formed such that the film thickness became 3.0 μm after the coating/heating treatment, using the obtained black curable composition of Example 3, [Black Curable Composition Layer Forming Step] through [Post-Baking Step] were carried out, and pattern formation and evaluation were carried out.

[Evaluation of Linearity and Reflectivity of Examples 3-A to 3-C, and Example 3-1]

For Examples 3-1 and 3-B, the same results (linearity and low reflectivity) as in Example 3 were obtained. However, for Examples 3-A and 3-C, in the evaluation of the linearity, the edge portion of the pattern became a straight line in a slightly rough shape.

For Examples 3-A and 3-C, the same evaluation was carried out with each of the film thickness set to 2.0 μm, and thus, the same results (linearity and low reflectivity) as in Example 3 were obtained.

Example 3-D

By the same method as in Example 3 except that the pigment was changed to titanium black, and carbon black (trade name "Color Black S170", manufactured by Degussa Co., Ltd., average primary particle diameter of 17 nm, BET specific surface area of 200 m²/g, carbon black produced by a gas black method) was used, a black curable composition M-3-D was prepared.

By the same method as in Example 3, using the obtained black curable composition M-3-D, [Black Curable Composition Layer Forming Step] through [Post-Baking Step] were carried out, and pattern formation and evaluation were carried out.

In Example 3-D, the same results as in Example 3 were obtained in terms of low reflectivity, but in the evaluation of the linearity, the edge portion of the pattern became a straight line in a slightly rough shape.

Example 3-E

By the same method as in the manufacture of the titanium black dispersion liquid in Example 3 except that the pigment was changed to titanium black, and Pigment Red 254 (manufactured by Ciba Specialty Chemicals Inc., trade name BK-CF) was used, a pigment dispersion liquid R1 was obtained, and then by the same method as in Example 3 except that titanium black was changed to a pigment dispersion liquid R1, a black curable composition M-3-E was prepared.

By the same method as in Example 3, using the obtained black curable composition M-3-E, [Black Curable Composition Layer Forming Step] through [Post-Baking Step] were carried out, and pattern formation and evaluation were carried out.

For Example 3-E, the same results as in Example 3 were obtained in terms of linearity, but in the evaluation of the low reflectivity, the results were slightly deteriorated.

Example 3-F

By the same method as in Example 3 except that 45 parts of titanium black was changed to 40 parts of titanium black and 5 parts of the pigment dispersion liquid R1, a pigment dispersion liquid $R^2$ was obtained, and then by the same method as in Example 3 except that titanium black was changed to a pigment dispersion liquid $R^2$, a black curable composition M-3-F was prepared. By the same method as in Example 3, using the obtained black curable composition M-3-F, [Black Curable Composition Layer Forming Step] through [Post-Baking Step] were carried out, and pattern formation and evaluation were carried out.

For Example 3-F, the same evaluations as in Example 3 were carried out, but the same results (linearity and low reflectivity) as in Example 3 were obtained.

In addition, as compared with Example 3, it could be seen that the light reflectivity and the light transmittance at the wavelength in an infrared region were low, and the light-shielding properties are excellent.

From the above results, it is presumed that in either of a case of changing the coloring agent or a case of using the coloring agent in combination with others, desired effects in the present patent application are obtained.

Example 3-F

By the same method as in Example 3 except that polymerization initiator was changed to IRGACURE-907 (manufactured by BASF Japan), a black curable composition M-3-F was prepared.

By the same method as in Example 3, using the obtained black curable composition M-3-F, [Black Curable Composition Layer Forming Step] through [Post-Baking Step] were carried out, and pattern formation and evaluation were carried out.

In Example 3-F, the same results as in Example 3 were obtained in terms of low reflectivity, but in the evaluation of the linearity, the edge portion of the pattern became a straight line in a slightly rough shape.

Example 3-G

By the same method as in Example 3 except that the solvent was changed from cyclohexanone to a mixture of cyclohexanone and propylene glycol monomethyl ether acetate at a mass ratio of 1:1, a black curable composition M-3-G was prepared.

By the same method as in Example 3, using the obtained black curable composition M-3-G, [Black Curable Composition Layer Forming Step] through [Post-Baking Step] were carried out, and pattern formation and evaluation were carried out.

In Example 3-G, the same results (linearity and low reflectivity) as in Example 3 were obtained.

Example 3-H

By the same method as in Example 3 except that the polymerizable compound was changed to 10.0 parts of KAYARAD DPHA (dipentaerythritolhexaacrylate, manufactured by Nippon Kayaku Co., Ltd.) and 8.5 parts of PET-30 (pentaerythritol triacrylate, manufactured by Nippon Kayaku Co., Ltd.), a black curable composition M-3-H was prepared.

By the same method as in Example 3, using the obtained black curable composition M-3-H, [Black Curable Composition Layer Forming Step] through [Post-Baking Step] were carried out, and pattern formation and evaluation were carried out.

In Example 3-H, the same results (linearity and low reflectivity) as in Example 3 were obtained.

REFERENCE SIGNS LIST 2, 20, 30, 40 solid-state imaging devices
3 CMOS sensor
4 circuit board
5 ceramic substrate
5a opening
5b inner wall
6 IR cut filter
7 taking lens
8 lens holder
9 holding barrel
10 cured film
11, 21, 31, 41 light-shielding films (light-shielding layers)
12 colored layer
14 coating layer
100 substrate

What is claimed is:

1. A curable composition comprising:
a fluorine-containing polymer including a repeating unit represented by Formula (A) and a repeating unit represented by Formula (B);
a polymerizable compound; and
a coloring agent,

(A)

(B)

in Formula (A), $R^1$ represents a hydrogen atom or an alkyl group, and $L^1$ represents a linear or branched alkylene group having 3 or more carbon atoms in total, which includes an ester bond, and in Formula (B), $R^2$ represents a hydrogen atom or an alkyl group, $L^2$ represents a single bond or a divalent linking group, and $R^f$ represents a monovalent organic group including an fluorine atom.

2. The curable composition according to claim 1, wherein the acid value of the fluorine-containing polymer is 70 to 150 mgKOH/g.

3. The curable composition according to claim 2, wherein the content of the fluorine-containing polymer is 1% to 20% by mass with respect to the total solid content of the curable composition.

4. The curable composition according to claim 1, wherein the content of the fluorine-containing polymer is 1% to 20% by mass with respect to the total solid content of the curable composition.

5. The curable composition according to claim 1, wherein in the fluorine-containing polymer, $R^f$ is a monovalent organic group having 1 to 3 carbon atoms in total, substituted with a fluorine atom.

6. The curable composition according to claim 1, wherein the weight-average molecular weight of the fluorine-containing polymer is 5,000 to 50,000.

7. The curable composition according to claim 1, wherein the coloring agent includes a black pigment.

8. A method for producing a cured film, comprising:
a step of forming a composition layer of the curable composition according to claim 1 on a substrate by spin coating;
a step of exposing the composition layer by irradiation with actinic rays or radiation; and
a step of subjecting the exposed composition layer to alkali development to form a cured film.

9. A color filter formed by curing the curable composition according to claim 1.

10. A light-shielding film formed by curing the curable composition according to claim 1.

11. A solid-state imaging element having a cured film formed by curing the curable composition according to claim 1.

12. An image display device having a cured film formed by curing the curable composition according to claim 1.

13. The curable composition according to claim 1, wherein in the fluorine-containing polymer, $L^2$ is a single bond.

14. The curable composition according to claim 1, wherein the fluorine-containing polymer includes a repeating unit having a polymerizable group on a side chain.

15. A curable composition comprising:
a fluorine-containing polymer including a repeating unit represented by Formula (A), a repeating unit represented by Formula (B), and a repeating unit having a polymerizable group on a side chain; and
a coloring agent,

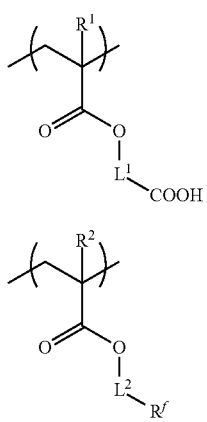

(A)

(B)

in Formula (A), $R^1$ represents a hydrogen atom or an alkyl group, and $L^1$ represents a linear or branched alkylene group having 3 or more carbon atoms in total, which includes an ester bond, and in Formula (B), $R^2$ represents a hydrogen atom or an alkyl group, $L^2$ represents a single bond or a divalent linking group, and $R^f$ represents a monovalent organic group including an fluorine atom.

16. The curable composition according to claim 15, comprising:
a fluorine-containing polymer including a repeating unit represented by Formula (A), a repeating unit represented by Formula (B), and a repeating unit represented by Formula (C); and
a coloring agent,

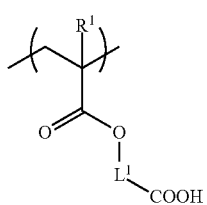

(A)

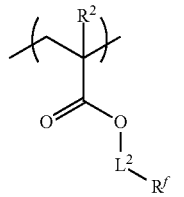

(B)

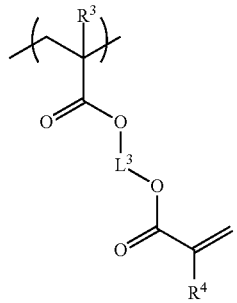

(C)

in Formula (A), $R^1$ represents a hydrogen atom or an alkyl group, and $L^1$ represents a linear or branched alkylene group having 3 or more carbon atoms in total, which includes an ester bond, in Formula (B), $R^2$ represents a hydrogen atom or an alkyl group, $L^2$ represents a single bond or divalent linking group, and $R^f$ represents a monovalent organic group including an fluorine atom, and in Formula (C), $R^3$ represents a hydrogen atom or an alkyl group, $L^3$ represents a single bond or divalent linking group, and $R^4$ represents a hydrogen atom or an alkyl group.

17. The curable composition according to claim 16, wherein the acid value of the fluorine-containing polymer is 70 to 150 mgKOH/g.

18. The curable composition according to claim 16, wherein the content of the fluorine-containing polymer is 1% to 20% by mass with respect to the total solid content of the curable composition.

19. The curable composition according to claim 16, wherein in the fluorine-containing polymer, $R^f$ is a monovalent organic group having 1 to 3 carbon atoms in total, substituted with a fluorine atom.

20. The curable composition according to claim 15, wherein the acid value of the fluorine-containing polymer is 70 to 150 mgKOH/g.

21. The curable composition according to claim 15, wherein the content of the fluorine-containing polymer is 1% to 20% by mass with respect to the total solid content of the curable composition.

22. The curable composition according to claim 15, wherein in the fluorine-containing polymer, $R^f$ is a monovalent organic group having 1 to 3 carbon atoms in total, substituted with a fluorine atom.

23. The curable composition according to claim 15, wherein in the fluorine-containing polymer, $L^2$ is a single bond.

* * * * *